US011776834B2

(12) United States Patent
Yin et al.

(10) Patent No.: US 11,776,834 B2
(45) Date of Patent: Oct. 3, 2023

(54) ON THE FLY AUTOMATIC WAFER CENTERING METHOD AND APPARATUS

(71) Applicant: BROOKS AUTOMATION, INC., Chelmsford, MA (US)

(72) Inventors: Bing Yin, Southborough, MA (US); Jairo Moura, Marlborough, MA (US); Vincent Tsang, Lincoln, MA (US); Aaron Gawlik, Burlington, MA (US); Nathan Spiker, Boston, MA (US)

(73) Assignee: Brooks Automation US, LLC, Chelmsford, MA (US)

( * ) Notice: Subject to any disclaimer, the term of this patent is extended or adjusted under 35 U.S.C. 154(b) by 122 days.

(21) Appl. No.: 17/229,495

(22) Filed: Apr. 13, 2021

(65) Prior Publication Data

US 2021/0305076 A1 Sep. 30, 2021

Related U.S. Application Data

(63) Continuation of application No. 16/197,087, filed on Nov. 20, 2018, now Pat. No. 10,978,330, which is a (Continued)

(51) Int. Cl.
*G06F 17/00* (2019.01)
*H01L 21/68* (2006.01)
*H01L 21/687* (2006.01)

(52) U.S. Cl.
CPC ........ *H01L 21/68* (2013.01); *H01L 21/68707* (2013.01)

(58) Field of Classification Search
CPC ............... H01L 21/68; H01L 21/68707; H01L 21/67742; H01L 21/682
(Continued)

(56) References Cited

U.S. PATENT DOCUMENTS 4,556,317 A * 12/1985 Sandland ............ G03F 7/70591
356/73
4,604,910 A * 8/1986 Chadwick ................ G02B 7/16
74/96
(Continued)

FOREIGN PATENT DOCUMENTS

CN 101640181 2/2010
JP 012564786 10/1989
(Continued)

OTHER PUBLICATIONS

Brosch_Enabling_Semiconductor_Tech_e (Year: 2013).*

*Primary Examiner* — Ronnie M Mancho
(74) *Attorney, Agent, or Firm* — Perman & Green, LLP

(57) ABSTRACT

Substrate processing apparatus including a wafer transport apparatus with a transport arm including an end effector, an arm pose deterministic feature integral to the substrate transport apparatus and disposed so that a static detection sensor of the substrate processing apparatus detects at least one edge of the at least one arm pose deterministic feature on the fly with radial motion of the transport arm, and a controller configured so that detection of the edge effects a determination of a proportion factor identifying at least a thermal expansion variance of the transport arm on the fly and includes a kinematic effects resolver configured to determine, from the detection of the edge on the fly, a discrete relation between the determined proportion factor and each different discrete variance respective to each different link of the transport arm determining at least the thermal expansion variance of the transport arm on the fly.

17 Claims, 38 Drawing Sheets

Related U.S. Application Data continuation of application No. 15/209,497, filed on Jul. 13, 2016, now Pat. No. 10,134,623.

(60) Provisional application No. 62/320,142, filed on Apr. 8, 2016, provisional application No. 62/191,863, filed on Jul. 13, 2015.

(58) Field of Classification Search
USPC ........................................................ 700/254
See application file for complete search history.

(56) References Cited

U.S. PATENT DOCUMENTS

| | | |
|---|---|---|
| 4,819,167 A | 4/1989 | Cheng |
| 5,180,276 A | 1/1993 | Hendrickson |
| 5,447,409 A | 9/1995 | Grunes et al. |
| 5,483,138 A | 1/1996 | Shmookler et al. |
| 5,537,311 A | 7/1996 | Stevens |
| 5,794,487 A | 8/1998 | Soloman et al. |
| 5,980,194 A | 11/1999 | Freerks et al. |
| 6,002,840 A | 12/1999 | Hofmeister |
| 6,231,297 B1 | 5/2001 | Hofmeister |
| 6,464,448 B1 | 10/2002 | Ha |
| 6,485,250 B2 | 11/2002 | Hofmeister |
| 6,556,887 B2 | 4/2003 | Freeman et al. |
| 6,760,976 B1 | 7/2004 | Martinson et al. |
| 6,856,863 B1 | 2/2005 | Sundar |
| 6,916,147 B2 * | 7/2005 | Suh ................. H01L 21/6732 414/936 |
| 6,990,430 B2 | 1/2006 | Hosek |
| 7,479,236 B2 | 1/2009 | Chen et al. |
| 7,578,649 B2 | 8/2009 | Caveney et al. |
| 7,648,327 B2 | 1/2010 | Bonora et al. |
| 7,891,935 B2 | 2/2011 | Kremerman |
| 7,904,182 B2 | 3/2011 | Hosek et al. |
| 7,925,378 B2 | 4/2011 | Gilchrist et al. |
| 7,946,800 B2 | 5/2011 | Hosek et al. |
| 7,959,395 B2 | 6/2011 | Hofmeister et al. |
| 7,988,398 B2 | 8/2011 | Hofmeister et al. |
| 8,008,884 B2 * | 8/2011 | Krupyshev ....... H01L 21/67742 318/560 |
| 8,055,376 B2 | 11/2011 | Doki et al. |
| 8,060,252 B2 * | 11/2011 | Gage ................ H01L 21/67201 901/6 |
| 8,237,391 B2 * | 8/2012 | Krupyshev ....... H01L 21/68707 318/560 |
| 8,293,066 B2 | 10/2012 | Bluck et al. |
| 8,398,355 B2 | 3/2013 | Holtkamp et al. |
| 8,403,619 B2 | 3/2013 | Moura et al. |
| 8,419,341 B2 | 4/2013 | Hoey et al. |
| 8,680,803 B2 * | 3/2014 | Krupyshev ....... H01L 21/67742 318/568.11 |
| 8,688,261 B2 | 4/2014 | Hirota |
| 8,731,718 B2 | 5/2014 | Rodnick |
| 8,744,624 B1 * | 6/2014 | Kaveh ................ H01L 21/681 356/237.1 |
| 8,751,047 B2 | 6/2014 | Rodnick |
| 8,752,449 B2 | 6/2014 | Hofmeister et al. |
| 8,860,955 B2 | 10/2014 | Rodnick et al. |
| 8,918,203 B2 | 12/2014 | Gilchrist et al. |
| 8,954,287 B2 | 2/2015 | Rodnick et al. |
| 9,478,446 B2 * | 10/2016 | Hofmeister ....... H01L 21/67126 |
| 9,502,276 B2 * | 11/2016 | Bluck ............... H01L 21/68785 |
| 9,514,974 B2 * | 12/2016 | Sharrock .......... H01L 21/67259 |
| 9,517,558 B2 * | 12/2016 | Krishnasamy .... H01L 21/67259 |
| 9,761,478 B2 * | 9/2017 | Caveney .......... H01L 21/67742 |
| 9,859,140 B2 * | 1/2018 | Talmer ............. H01L 21/67201 |
| 9,948,155 B2 * | 4/2018 | Moura ................ B25J 11/0095 |
| 10,002,781 B2 * | 6/2018 | Moura .............. H01L 21/68707 |
| 10,115,617 B2 * | 10/2018 | Bluck .............. H01L 21/67778 |
| 10,134,621 B2 * | 11/2018 | Caveney .......... H01L 21/67745 |
| 10,134,623 B2 * | 11/2018 | Yin .................. H01L 21/68707 |
| 10,137,576 B2 * | 11/2018 | Gilchrist ............ H01L 21/6875 |
| 10,335,945 B2 * | 7/2019 | Hofmeister ....... H01L 21/67742 |
| 10,348,172 B2 * | 7/2019 | Moura .................. H02K 19/02 |
| 10,395,959 B2 * | 8/2019 | Babbs .............. H01L 21/67201 |
| 11,476,139 B2 * | 10/2022 | Moura .............. H01L 21/67253 |
| 2001/0020199 A1 * | 9/2001 | Bacchi ................. B25J 9/042 700/247 |
| 2002/0103571 A1 | 8/2002 | Yoo et al. |
| 2003/0014155 A1 | 1/2003 | Pencis et al. |
| 2003/0035711 A1 * | 2/2003 | Gilchrist .......... H01L 21/68707 414/744.8 |
| 2004/0013498 A1 * | 1/2004 | Soucy .............. H01L 21/67772 414/217 |
| 2005/0111938 A1 * | 5/2005 | van der Meulen ...................... H01L 21/67207 414/217 |
| 2005/0111956 A1 | 5/2005 | van der Meulen |
| 2006/0035563 A1 | 2/2006 | Kalenian et al. |
| 2006/0130750 A1 | 6/2006 | Ishikawa et al. |
| 2006/0285945 A1 * | 12/2006 | Hofmeister ....... H01L 21/67742 414/217 |
| 2007/0009345 A1 * | 1/2007 | Hall ................. H01L 21/67265 156/345.31 |
| 2007/0067678 A1 | 3/2007 | Hosek et al. |
| 2007/0269297 A1 | 11/2007 | Meulen et al. |
| 2008/0051929 A1 * | 2/2008 | Hongkham ....... H01L 21/67276 700/214 |
| 2008/0267747 A1 * | 10/2008 | DiBella ............ H01L 21/68707 901/30 |
| 2009/0022571 A1 * | 1/2009 | Krupyshev ....... H01L 21/67742 414/217 |
| 2009/0087285 A1 | 4/2009 | Mitsuyoshi |
| 2009/0087288 A1 * | 4/2009 | Hofmeister ............. B25J 18/00 414/222.01 |
| 2009/0110532 A1 | 4/2009 | Salek |
| 2009/0142163 A1 * | 6/2009 | Genetti ............ H01L 21/67742 414/217 |
| 2009/0143911 A1 | 6/2009 | Gage et al. |
| 2009/0162179 A1 | 6/2009 | Hosek et al. |
| 2009/0243413 A1 | 10/2009 | Gilchrist et al. |
| 2010/0034621 A1 | 2/2010 | Martin et al. |
| 2010/0120333 A1 * | 5/2010 | Sin ...................... H01L 22/12 451/287 |
| 2010/0272347 A1 | 10/2010 | Rodnick et al. |
| 2011/0316370 A1 * | 12/2011 | Krupyshev ............. H02K 41/03 310/66 |
| 2012/0014773 A1 * | 1/2012 | Gage ...................... H01L 21/68 901/14 |
| 2012/0128450 A1 * | 5/2012 | Caveney .......... H01L 21/67742 414/217 |
| 2012/0141235 A1 * | 6/2012 | Krupyshev ............. B25J 9/042 414/744.5 |
| 2012/0301261 A1 * | 11/2012 | Krupyshev ............. H02K 41/03 414/749.1 |
| 2013/0180448 A1 * | 7/2013 | Sakaue ............ H01L 21/67739 118/696 |
| 2013/0230370 A1 | 9/2013 | Hoey et al. |
| 2013/0287526 A1 * | 10/2013 | Bluck .............. H01L 21/67778 414/217 |
| 2013/0294877 A1 | 11/2013 | Hosek |
| 2014/0017042 A1 | 1/2014 | Rodnick et al. |
| 2014/0150592 A1 | 6/2014 | Kremerman |
| 2014/0201571 A1 | 7/2014 | Hosek et al. |
| 2014/0249675 A1 * | 9/2014 | Krishnasamy .... H01L 21/67766 700/250 |
| 2014/0271083 A1 * | 9/2014 | Caveney .......... H01L 21/67715 414/749.5 |
| 2014/0294551 A1 * | 10/2014 | Hofmeister .............. B25J 9/126 414/744.5 |
| 2014/0301818 A1 * | 10/2014 | Gilchrist ................. B25J 15/00 414/744.2 |
| 2014/0365004 A1 | 12/2014 | Hosek et al. |
| 2015/0013910 A1 * | 1/2015 | Krupyshev ....... H01L 21/67184 118/500 |
| 2015/0139770 A1 * | 5/2015 | Moura ................ B25J 11/0095 310/68 B |
| 2015/0168496 A1 * | 6/2015 | Moura ................... H02P 23/12 702/182 |
| 2015/0174768 A1 | 6/2015 | Rodnick |

(56) References Cited

U.S. PATENT DOCUMENTS

| | | | |
|---|---|---|---|
| 2015/0206782 A1* | 7/2015 | Caveney | B25J 11/0095 414/217 |
| 2015/0249028 A1* | 9/2015 | Genetti | H01L 21/67754 414/222.05 |
| 2016/0129586 A1* | 5/2016 | Moura | H01L 21/67778 414/217 |
| 2016/0136812 A1 | 5/2016 | Hosek et al. | |
| 2017/0018446 A1* | 1/2017 | Yin | H01L 21/68707 |
| 2017/0040203 A1* | 2/2017 | Caveney | H01L 21/67742 |
| 2017/0062258 A1* | 3/2017 | Bluck | H01L 21/67346 |
| 2017/0169995 A1 | 6/2017 | Kim et al. | |
| 2018/0211858 A1* | 7/2018 | Caveney | H01L 21/67742 |
| 2019/0164800 A1* | 5/2019 | Yin | H01L 21/68707 |
| 2020/0161152 A1* | 5/2020 | Caveney | H01L 21/67201 |
| 2021/0305076 A1* | 9/2021 | Yin | H01L 21/68707 |

FOREIGN PATENT DOCUMENTS

| | | |
|---|---|---|
| JP | 05275492 | 10/1993 |
| JP | 2002160183 | 6/2002 |
| JP | 2004134747 | 4/2004 |
| JP | 2009500869 | 1/2009 |
| JP | 2014008578 | 1/2014 |
| TW | 200834774 | 8/2008 |
| WO | 2009086027 | 7/2009 |
| WO | 2009086042 | 7/2009 |
| WO | 2009086109 | 7/2009 |
| WO | 2009086164 | 7/2009 |
| WO | 2009086042 | 9/2009 |
| WO | 2009145082 | 12/2009 |
| WO | 2012052865 | 4/2012 |
| WO | 2016081459 | 5/2016 |
| WO | 2009086042 | 7/2016 |

* cited by examiner

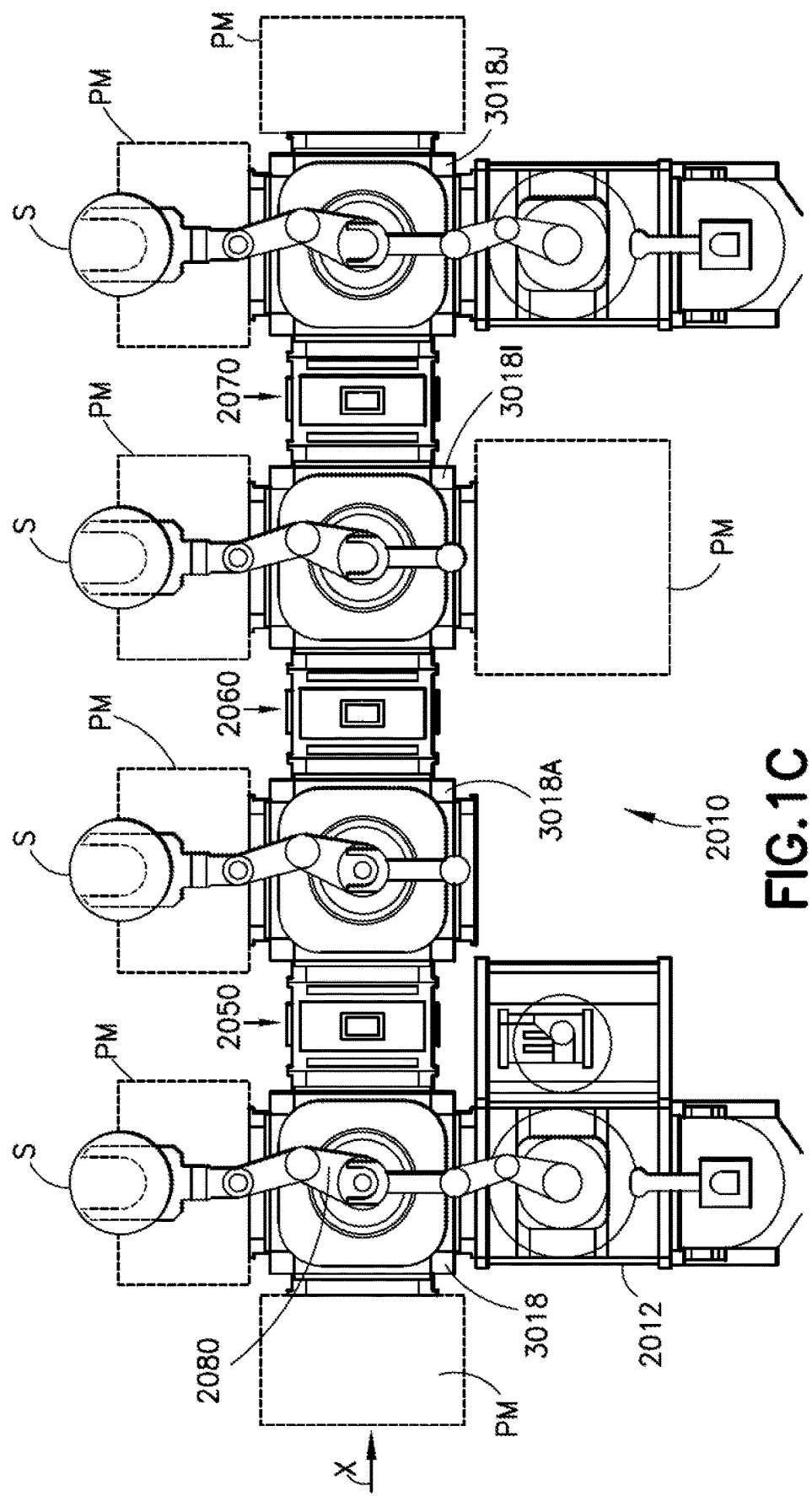

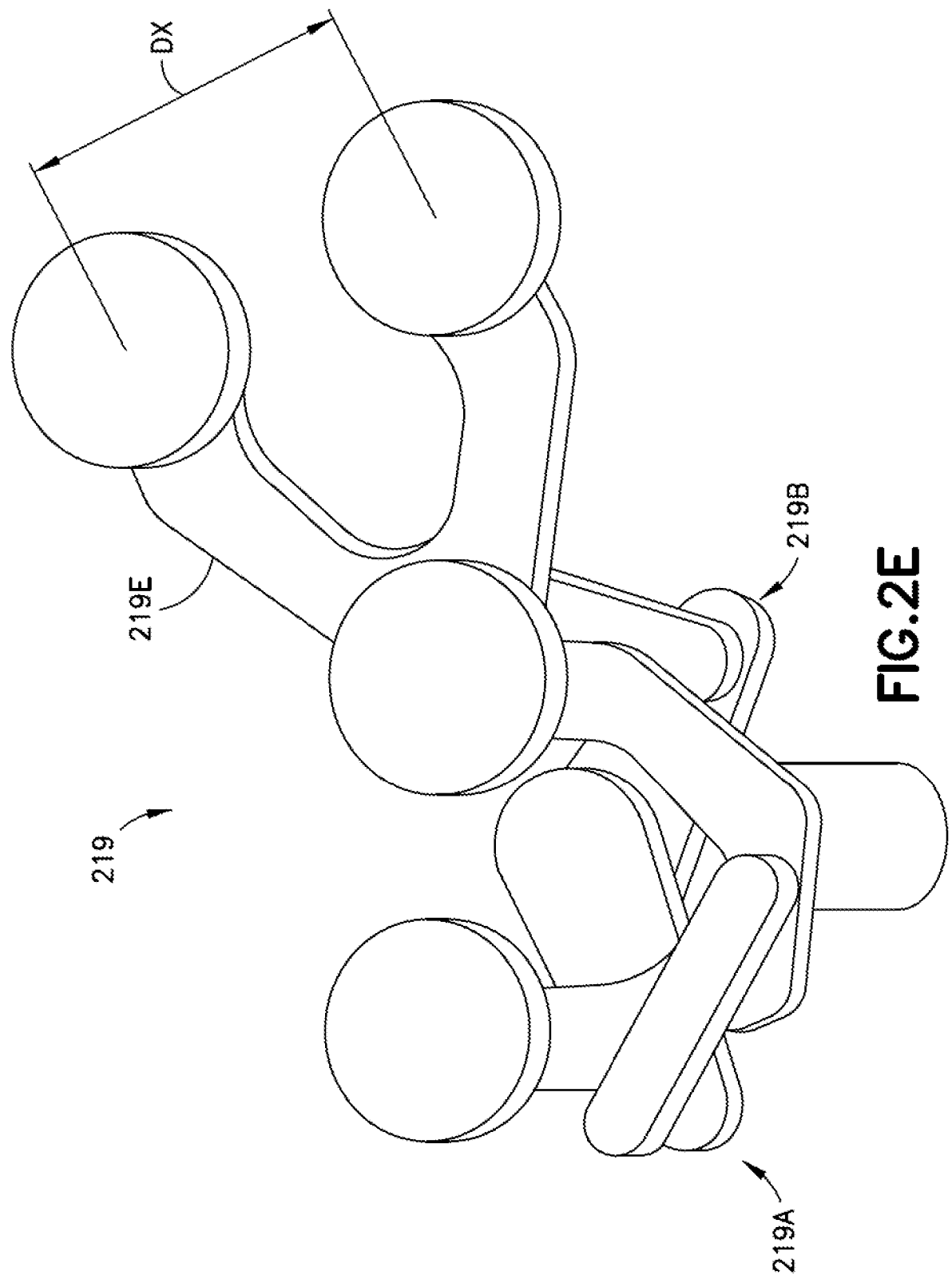

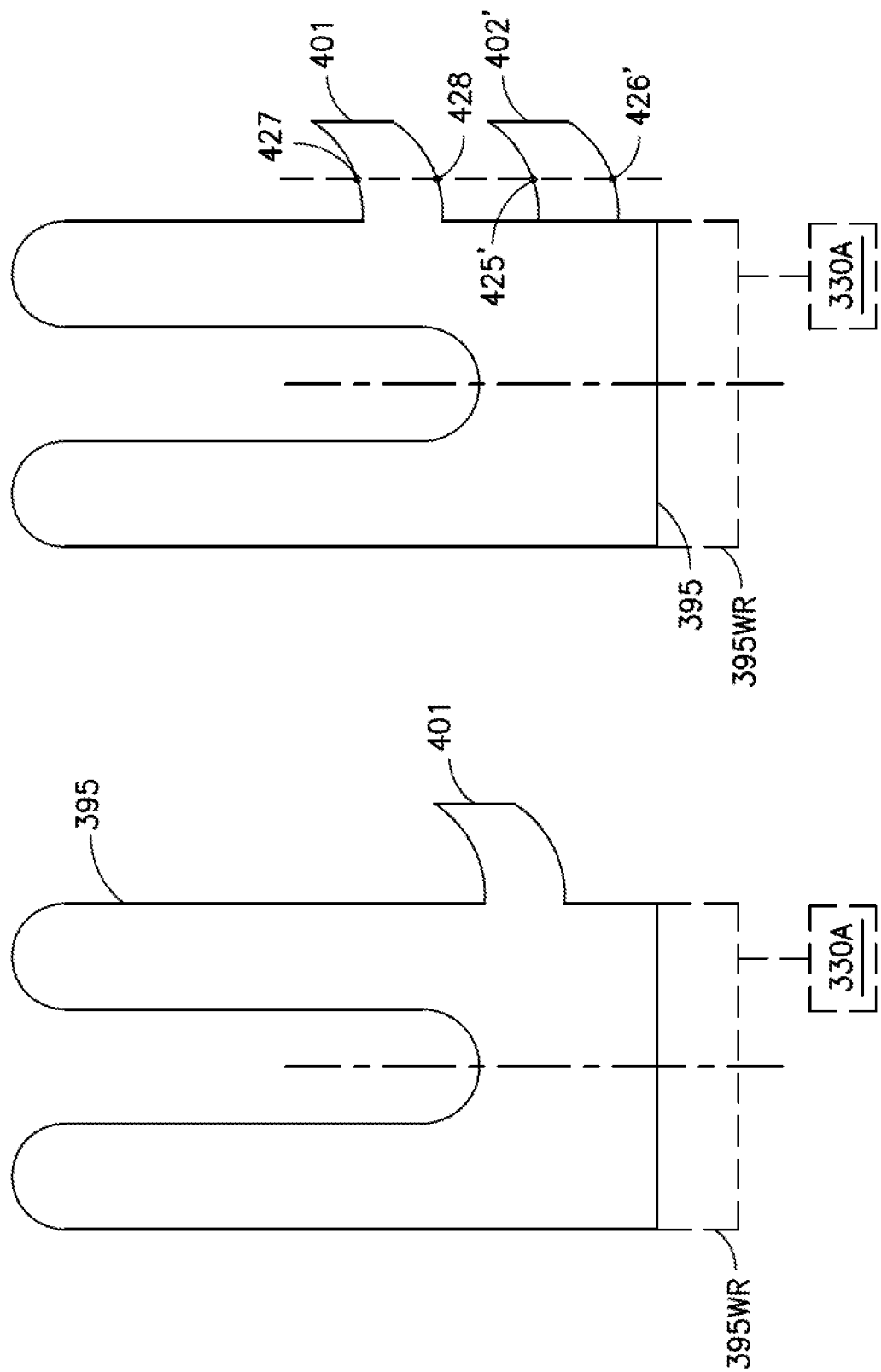

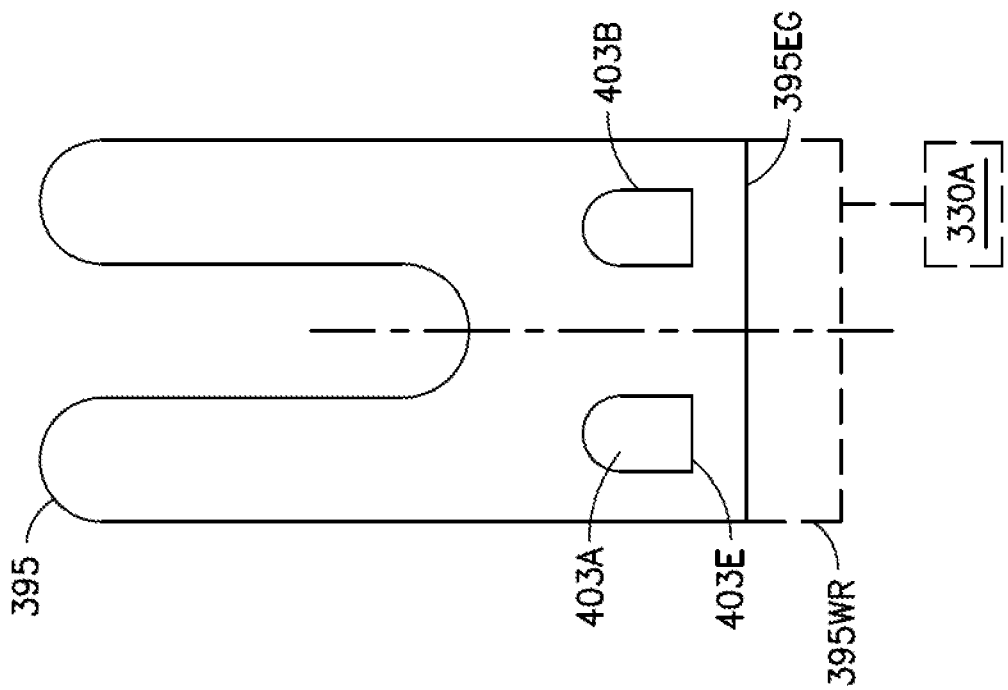
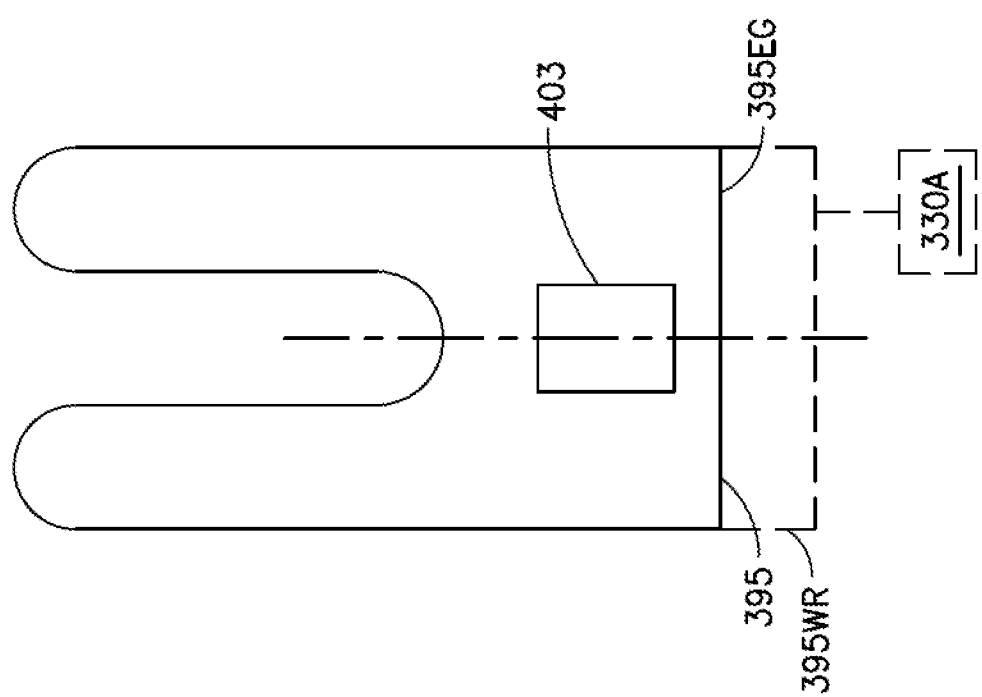

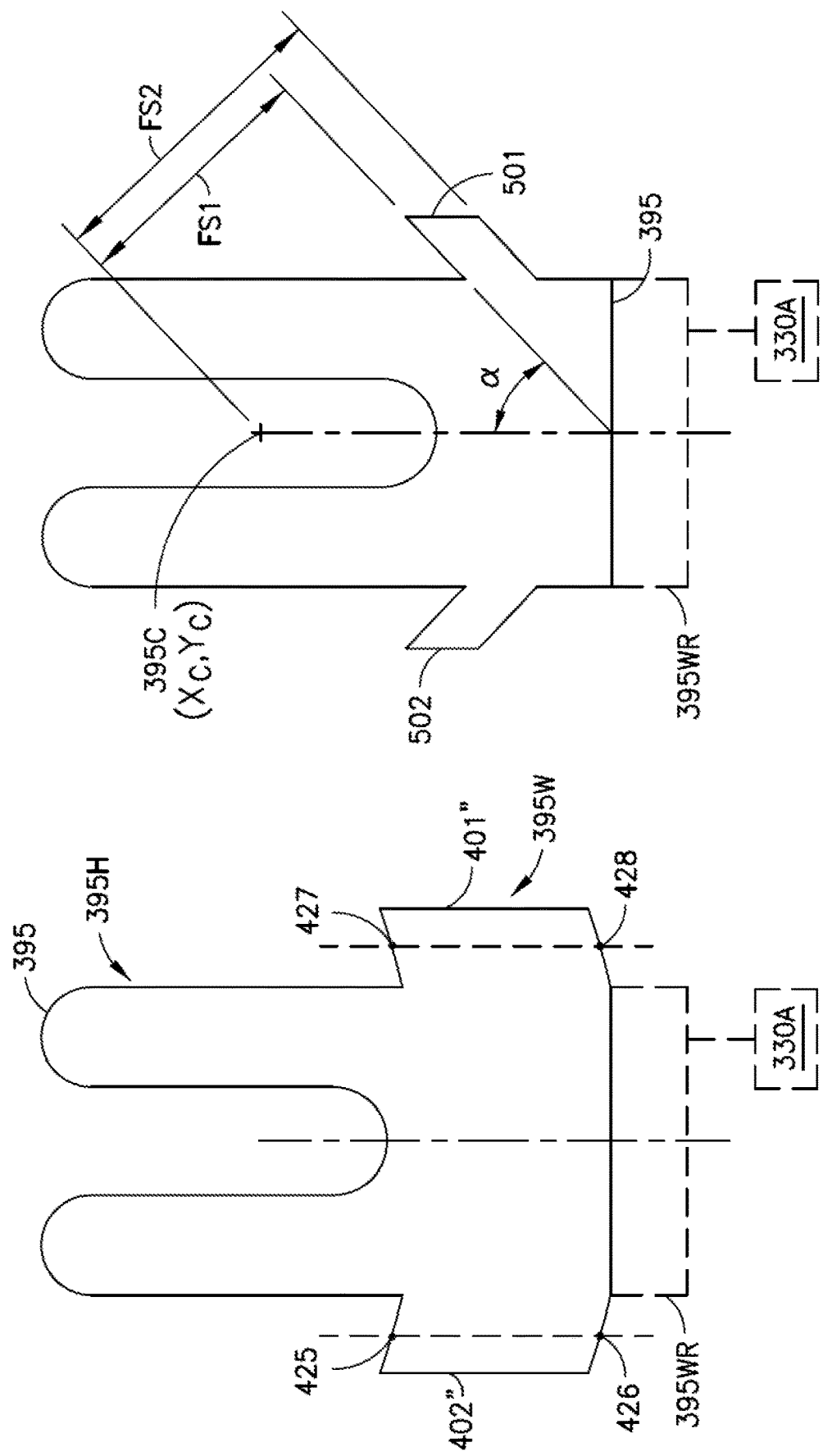

ON THE FLY AUTOMATIC WAFER CENTERING METHOD AND APPARATUS

CROSS-REFERENCE TO RELATED APPLICATIONS

This application is a continuation of U.S. patent application Ser. No. 16/197,087, filed Nov. 20, 2018, (now U.S. Pat. No. 10,978,330), which is a continuation of U.S. patent application Ser. No. 15/209,497, filed on Jul. 13, 2016, (now U.S. Pat. No. 10,134,623), which claims the benefit of U.S. provisional patent application No. 62/191,863, filed on Jul. 13, 2015 and U.S. provisional patent application No. 62/320,142, filed on Apr. 8, 2016, the disclosures of which are incorporated herein by reference in their entireties.

BACKGROUND

1. Field

The exemplary embodiments generally relate to substrate processing systems and, more particularly, to calibration and synchronization of components of the substrate processing systems.

2. Brief Description of Related Developments

Substrate processing equipment is typically capable of performing multiple operations on a substrate. The substrate processing equipment generally includes a transfer chamber and one or more process modules coupled to the transfer chamber. A substrate transport robot within the transfer chamber moves substrates among the process modules where different operations, such as sputtering, etching, coating, soaking, etc. are performed. Production processes used by, for example, semiconductor device manufacturers and materials producers often require precise positioning of substrates in the substrate processing equipment.

The precise position of the substrates is generally provided through teaching locations of the process modules to the substrate transport robot. To teach the locations of the process modules and to precisely place substrates at substrate holding locations, the center of the substrate must be known. Generally automatic substrate or wafer centering algorithms require the utilization of a substrate center fixture in order to define the reference substrate location at zero eccentricity relative to, for example, an end effector of a substrate transport that holds the substrate, where zero eccentricity is where the location of the substrate center coincides with the expected center of the end effector. Generally, the substrate centering fixtures are installed on the end effector manually and are used as a reference surface to position the substrate at a location defines as the zero eccentricity reference. The manual placement of the substrate centering fixture and the manual placement of the substrate relative to the substrate centering fixture may result in operator errors and the generation of particles (e.g. contamination) within the substrate processing equipment. The use of substrate centering fixtures also is performed at atmosphere which means that the environment within the substrate processing equipment is disturbed thereby reducing production time.

Generally the teaching of the substrate transport robot includes detecting a position of the robot and/or substrate carried by the robot with dedicated teaching sensors added to the substrate processing equipment, utilizing instrumented substrates (e.g. including onboard, sensors or cameras) carried by the substrate transport robot, utilizing removable fixtures that are placed within the process modules or other substrate holding station of the substrate processing equipment, utilizing wafer centering sensors that are located within or externally accessible at the process modules, utilizing sensors (e.g. cameras) disposed external to the process modules, or by contacting a target within the process module with the substrate transport robot or an object carried by the substrate transport robot. These approaches to teaching locations within substrate processing equipment may require sensors being placed in a vacuum, may require changes to customer processing equipment and/or tooling, may not be suitable for use in vacuum environments or at high temperatures, may require sensor targets, mirrors or fixtures being placed within the processing equipment, may disrupt a vacuum environment of the substrate processing equipment, and/or may require software changes to the code embedded into the substrate transport robot's and/or processing system's controller.

Other conventional arm temperature compensation algorithms, such as described in United States pre-grant publication number 2013/0180448 and U.S. Pat. No. 6,556,887, may use a reference flag in/on the robot end effector or arm to estimate the amount of thermal expansion by comparing the robot positions when a sensor trips between a reference temperature and a current temperature. This conventional approach inherently assumes that the upper arm and forearm of the robot manipulator are in a steady state condition in such a way that the robot can be modeled as a linear bar at a constant temperature with a certain coefficient of thermal expansion. Generally, the limitation of the conventional arm temperature compensation algorithms is that they do not accurately compensate for position errors for the case where the manipulator links are under temperature transients such as temperature rise or cool down. Such temperature transient scenarios represent more realistic customer use cases since a semiconductor cluster tool can have process modules and load locks at substantially different operating temperatures. These conventional thermal compensation algorithms also generally do not take into account the non-linear effect of the arm kinematics due to their non-linear sensitivity to link angular location with respect to the end effector position.

It is also noted that in conventional implementations, the estimated relative thermal expansion of the robotic manipulator, defined as $$K_S = \frac{R0}{R1}$$

(where R0 is an arm location at a reference temperature and R1 is a new location calculated by control software) is considered to behave linearly and is used to estimate the robotic transport position correction at the placement station position which is located further away from the robot center.

It would be advantageous to automatically center substrates without the use of centering fixtures to effect teaching a substrate transport robot the substrate processing locations within processing equipment without disturbing an environment within the processing equipment or requiring additional instrumentation and/or modification to the substrate processing equipment.

BRIEF DESCRIPTION OF THE DRAWINGS

The foregoing aspects and other features of the disclosed embodiment are explained in the following description, taken in connection with the accompanying drawings, wherein:

FIGS. 1A-1D are schematic illustrations of a substrate processing apparatus incorporating aspects of the disclosed embodiment;

FIGS. 2A-2E are schematic illustrations of transport arms in accordance with aspects of the disclosed embodiment;

FIGS. 4B-4F are schematic illustrations of a portion of a substrate processing apparatus in accordance with aspects of the disclosed embodiment;

FIG. 5 is a schematic illustration of a portion of a substrate processing apparatus in accordance with aspects of the disclosed embodiment;

DETAILED DESCRIPTION

Figure 1A:
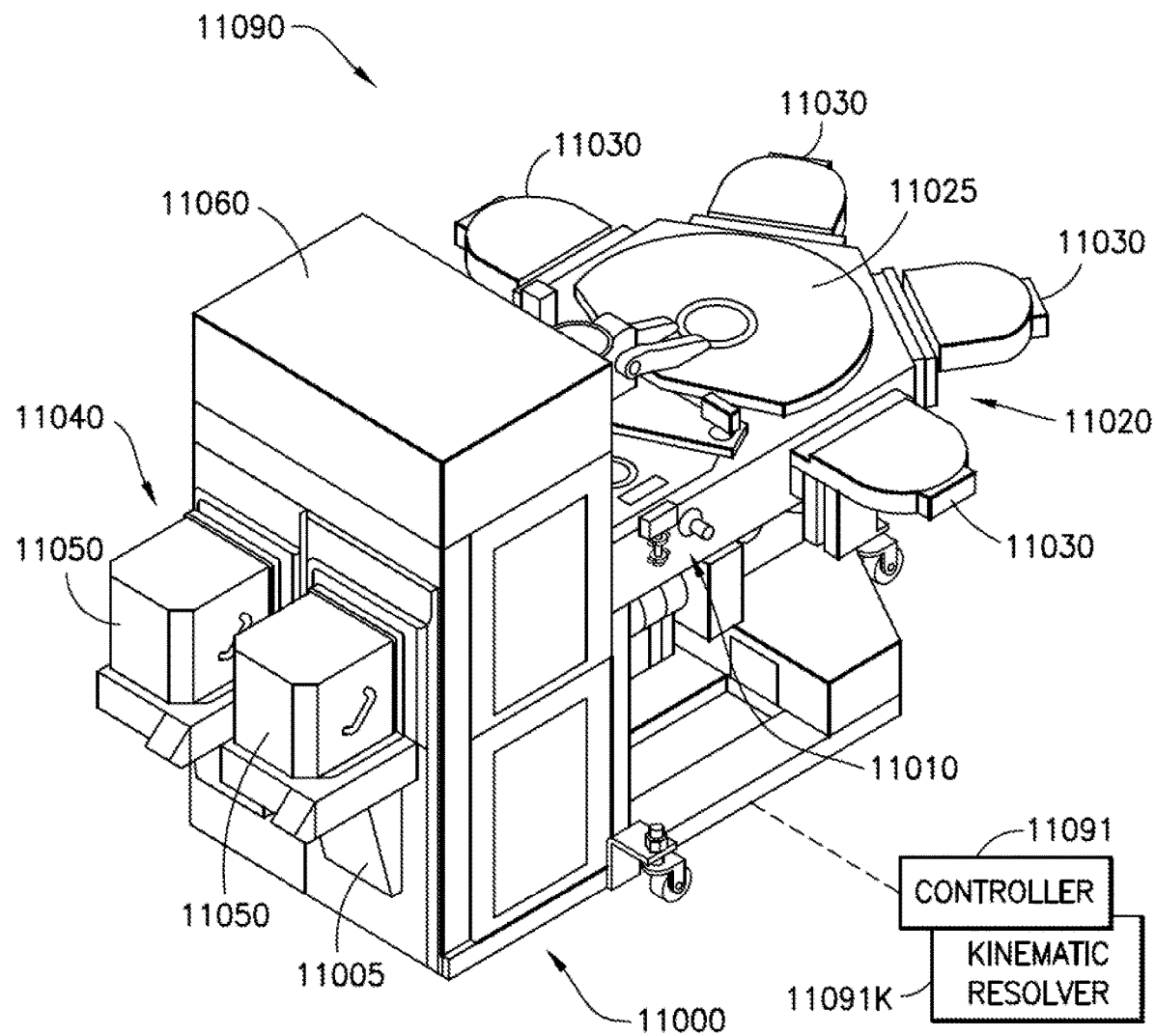

Referring to FIGS. 1A-1D, there are shown schematic views of substrate processing apparatus or tools incorporating the aspects of the disclosed embodiment as will be further described herein. Although the aspects of the disclosed embodiment will be described with reference to the drawings, it should be understood that the aspects of the disclosed embodiment can be embodied in many forms. In addition, any suitable size, shape or type of elements or materials could be used.

As will be described in greater detail below, the aspects of the disclosed embodiment provide for the automatic (e.g. without operator intervention) centering of substrates or wafers relative to, for example, a substrate transport end effector, the automatic location of substrate holding stations of a substrate processing apparatus, and teaching a substrate transport apparatus the locations of the substrate holding stations. It is noted that the terms substrate and wafer are used interchangeably herein. Also, as used herein the term substrate holding station is a substrate holding location within a process module or any other suitable substrate holding location within the substrate processing apparatus such as, for example, a load port (or substrate cassette held thereon), a load lock, a buffer station, etc. The aspects of the disclosed embodiment leverage existing equipment and devices employed in the substrate processing apparatus such as substrate processing sensors. Substrate processing sensors as used herein are active wafer centering sensors that effect automatic wafer centering (AWC), substrate aligners and/or other suitable substrate eccentricity (e.g. relative to a predetermined substrate holding location on an end effector) detection units used in the aligning and/or centering of substrates during substrate processing. In other words, there are substantially no additional instrumentation costs incurred by, for example, the customer after the initial purchase/configuration of the substrate processing apparatus when the automated centering and teaching in accordance with the aspects of the disclosed embodiment is utilized.

The aspects of the disclosed embodiment may also be implemented substantially without software changes to the programming code embedded into the substrate transport apparatus and/or the substrate processing apparatus system controller. For example, the aspects of the disclosed embodiment may utilize existing commands associated with the substrate transport apparatus such as "pick and place" commands and/or "substrate alignment" commands. The aspects of the disclosed embodiments are also operational environment such as vacuum environment (as well as atmospheric environment e.g. inert gas, filtered clean air) compatible as there are no electronic components (e.g. cables, printed circuit boards, etc.) located within the processing environment. As may be realized, in an atmospheric processing environment the AWC centers may be located within the atmospheric processing environment. Accordingly, the aspects of the disclosed embodiment provide for decreased machine down time during the automatic centering and/or teaching of the substrate transport apparatus substantially without disrupting the processing environment (e.g. vacuum or atmospheric) already established within the substrate processing apparatus (e.g. the substrate processing apparatus and the components thereof remain sealed or otherwise isolated from an external environment during the automatic teaching process).

As will be described below, the aspects of the disclosed embodiment provide for the elimination of errors generally introduced by conventional automatic wafer or substrate centering methods (e.g. using centering fixtures) that define the reference substrate position with zero eccentricity. The aspects of the disclosed embodiment generally eliminate the calibration steps and fixtures traditionally used for automatic substrate centering. The aspects of the disclosed embodiments also compensate for errors due to, for example, thermal effects between the substrate transport apparatus and a substrate holding station where temperatures within a respective processing module are in the range of about 200° C. to about 850° C. In one aspect, the temperatures of the respective processing modules are greater than about 850° C. while in other aspects the temperatures of the respective processing modules are less than about 200° C. Aspects of the disclosed embodiment also automatically compensate for hysteresis effects due to, for example, sensor errors or latencies.

Figure 1B:
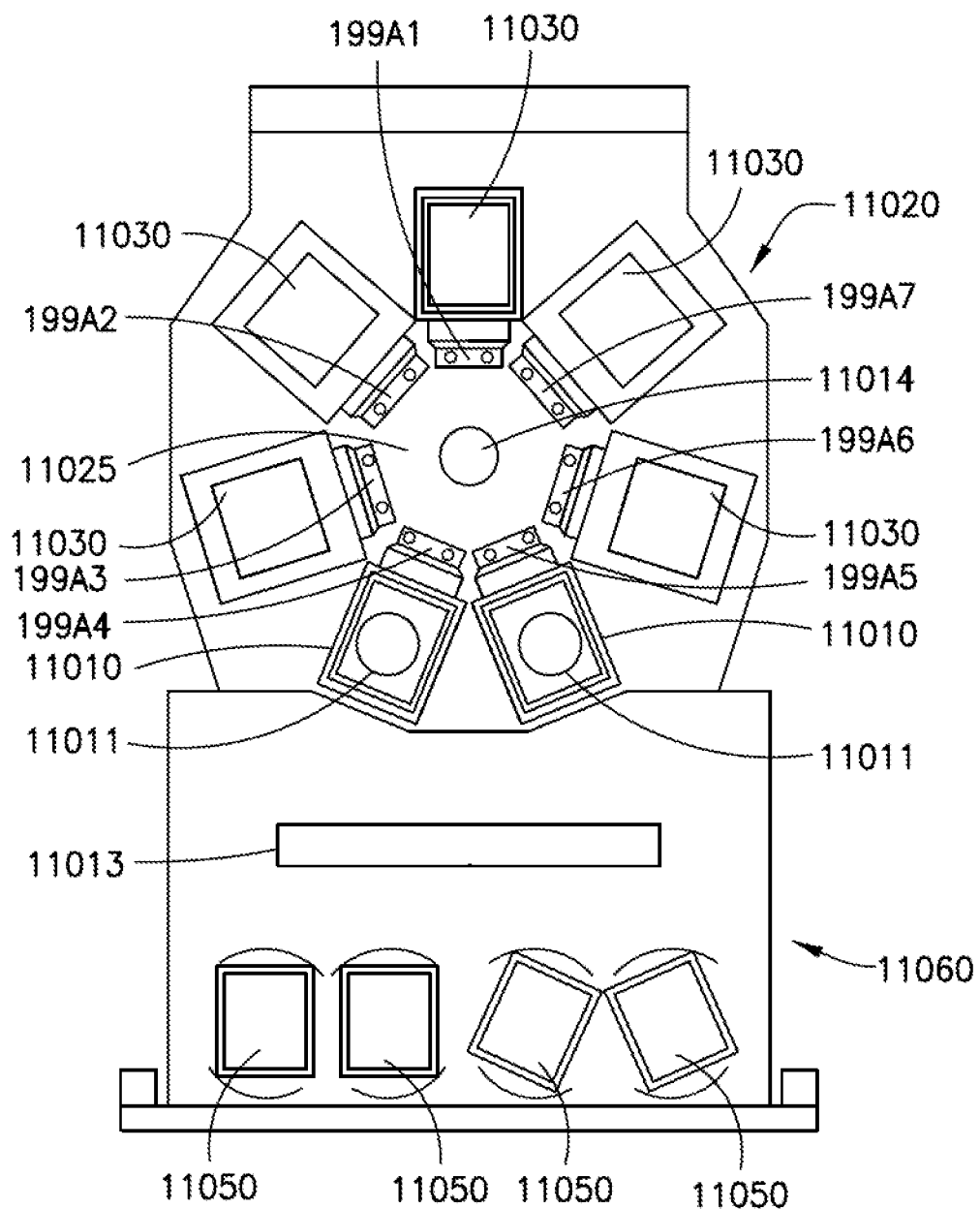

Referring to FIGS. 1A and 1B, a processing apparatus, such as for example a semiconductor tool station 11090 is shown in accordance with aspects of the disclosed embodiment. Although a semiconductor tool 11090 is shown in the drawings, the aspects of the disclosed embodiment described herein can be applied to any tool station or application employing robotic manipulators. In this example the tool 11090 is shown as a cluster tool, however the aspects of the disclosed embodiment may be applied to any suitable tool station such as, for example, a linear tool station such as that shown in FIGS. 1C and 1D and described in U.S. Pat. No. 8,398,355, entitled "Linearly Distributed Semiconductor Workpiece Processing Tool," issued Mar. 19, 2013, the disclosure of which is incorporated by reference herein in its entirety. The tool station 11090 generally includes an atmospheric front end 11000, a vacuum load lock 11010 and a vacuum back end 11020. In other aspects, the tool station may have any suitable configuration. The components of each of the front end 11000, load lock 11010 and back end 11020 may be connected to a controller 11091 which may be part of any suitable control architecture such as, for example, a clustered architecture control. The control system may be a closed loop controller having a master controller, cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized. The controller 11091 includes any suitable memory and processor(s) that include non-transitory program code for operating the processing apparatus described herein to effect the automatic substrate centering and/or automatic location of substrate holding stations of a substrate processing apparatus and teaching a substrate transport apparatus the locations of the substrate holding stations as described herein. For example, in one aspect, the controller 11091 includes embedded substrate locating commands (e.g. for determining an eccentricity between the substrate and end effector of the substrate transport apparatus). In one aspect the substrate locating commands may be embedded pick/place commands that move the substrate, and the end effector on which the substrate is held, past or through one or more automatic substrate centering sensors. The controller is configured to determine the center of the substrate and a reference position of the end effector and determine an eccentricity of the substrate relative to the reference position of the end effector. In one aspect, the controller is configured to receive detection signals corresponding to one or more features of the end effector and/or transport arm of a substrate transport apparatus/robot and determine a thermal expansion or contraction of the substrate transport apparatus or a component of the substrate transport apparatus due to, for example a temperature within the processing module.

As may be realized, and as described herein, in one aspect, the substrate station is located inside, and the auto-teaching described herein occurs in, a process module having a vacuum pressure environment therein. In one aspect the vacuum pressure is a high vacuum such as $10^{-5}$ Torr or below. In one aspect, the auto-centering and/or teaching described herein occurs within a substrate station feature located for example within a process module that is in a state of process security (e.g. for processing substrates). The state of process security for processing substrates is a condition of the process module wherein the process module is sealed in a cleanliness state ready for introducing process vacuum or atmosphere into the process module, or a state ready for introducing a production wafer into the process module.

In one aspect, the front end 11000 generally includes load port modules 11005 and a mini-environment 11060 such as for example an equipment front end module (EFEM). The load port modules 11005 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer or 450 mm wafer interfaces or any other suitable substrate interfaces such as for example larger or smaller wafers or flat panels for flat panel displays. Although two load port modules 11005 are shown in FIG. 1A, in other aspects any suitable number of load port modules may be incorporated into the front end 11000. The load port modules 11005 may be configured to receive substrate carriers or cassettes 11050 from an overhead transport system, automatic guided vehicles, person guided vehicles, rail guided vehicles or from any other suitable transport method. The load port modules 11005 may interface with the mini-environment 11060 through load ports 11040. In one aspect the load ports 11040 allow the passage of substrates between the substrate cassettes 11050 and the mini-environment 11060.

In one aspect, the mini-environment 11060 generally includes any suitable transfer robot 11013 that incorporates one or more aspects of the disclosed embodiment described herein. In one aspect the robot 11013 may be a track mounted robot such as that described in, for example, U.S. Pat. No. 6,002,840, the disclosure of which is incorporated by reference herein in its entirety or in other aspects, any other suitable transport robot having any suitable configuration. The mini-environment 11060 may provide a controlled, clean zone for substrate transfer between multiple load port modules.

The vacuum load lock 11010 may be located between and connected to the mini-environment 11060 and the back end 11020. It is again noted that the term vacuum as used herein may denote a high vacuum such as $10^{-5}$ Torr or below in which the substrates are processed. The load lock 11010 generally includes atmospheric and vacuum slot valves. The slot valves may provide the environmental isolation employed to evacuate the load lock after loading a substrate from the atmospheric front end and to maintain the vacuum in the transport chamber when venting the lock with an inert gas such as nitrogen. In one aspect, the load lock 11010 includes an aligner 11011 for aligning a fiducial of the substrate to a desired position for processing. In other aspects, the vacuum load lock may be located in any suitable location of the processing apparatus and have any suitable configuration and/or metrology equipment.

The vacuum back end 11020 generally includes a transport chamber 11025, one or more processing station(s) or module(s) 11030 and any suitable transfer robot or apparatus 11014. The transfer robot 11014 will be described below and may be located within the transport chamber 11025 to transport substrates between the load lock 11010 and the various processing stations 11030. The processing stations 11030 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 11030 are connected to the transport chamber 11025 to allow substrates to be passed from the transport chamber 11025 to the processing stations 11030 and vice versa. In one aspect the load port modules 11005 and load ports 11040 are substantially directly coupled to the vacuum back end 11020 so that a cassette 11050 mounted on the load port interfaces substantially directly (e.g. in one aspect at least the mini-environment 11060 is omitted while in other aspects the vacuum load lock 11010 is also omitted such that the cassette 11050 is pumped down to vacuum in a manner similar to that of the vacuum load lock 11010) with a vacuum environment of the transfer chamber 11025 and/or a processing vacuum of a processing station 11030 (e.g. the processing vacuum and/or vacuum environment extends between and is common between the processing station 11030 and the cassette 11050).

Referring now to FIG. 1C, a schematic plan view of a linear substrate processing system 2010 is shown where the tool interface section 2012 is mounted to a transport chamber module 3018 so that the interface section 2012 is facing generally towards (e.g. inwards) but is offset from the longitudinal axis X of the transport chamber 3018. The transport chamber module 3018 may be extended in any suitable direction by attaching other transport chamber modules 3018A, 3018I, 3018J to interfaces 2050, 2060, 2070 as described in U.S. Pat. No. 8,398,355, previously incorporated herein by reference. Each transport chamber module 3018, 3019A, 3018I, 3018J includes any suitable substrate transport 2080, which may include one or more aspects of the disclosed embodiment described herein, for transporting substrates throughout the processing system 2010 and into and out of, for example, processing modules PM (which in one aspect are substantially similar to processing stations 11030 described above). As may be realized, each chamber module may be capable of holding an isolated or controlled atmosphere (e.g. N2, clean air, vacuum).

Figure 1D:
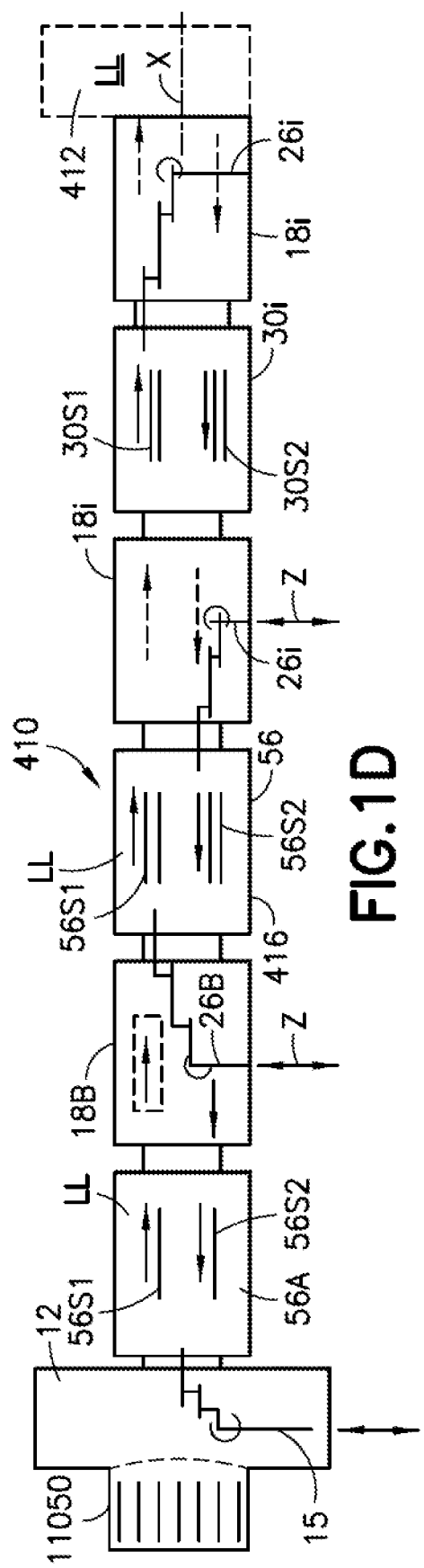

Referring to FIG. 1D, there is shown a schematic elevation view of an exemplary processing tool 410 such as may be taken along longitudinal axis X of the linear transport chamber 416. In the aspect of the disclosed embodiment shown in FIG. 1D, tool interface section 12 may be representatively connected to the transport chamber 416. In this aspect, interface section 12 may define one end of the tool transport chamber 416. As seen in FIG. 1D, the transport chamber 416 may have another workpiece entry/exit station 412 for example at an opposite end from interface station 12. In other aspects, other entry/exit stations for inserting/removing workpieces from the transport chamber may be provided. In one aspect, interface section 12 and entry/exit station 412 may allow loading and unloading of workpieces from the tool. In other aspects, workpieces may be loaded into the tool from one end and removed from the other end. In one aspect, the transport chamber 416 may have one or more transfer chamber module(s) 18B, 18i. Each chamber module may be capable of holding an isolated or controlled atmosphere (e.g. N2, clean air, vacuum). As noted before, the configuration/arrangement of the transport chamber modules 18B, 18i, load lock modules 56A, 56 and workpiece stations forming the transport chamber 416 shown in FIG. 1D is merely exemplary, and in other aspects the transport chamber may have more or fewer modules disposed in any desired modular arrangement. In the aspect shown, station 412 may be a load lock. In other aspects, a load lock module may be located between the end entry/exit station (similar to station 412) or the adjoining transport chamber module (similar to module 18i) may be configured to operate as a load lock.

Figure 2A:
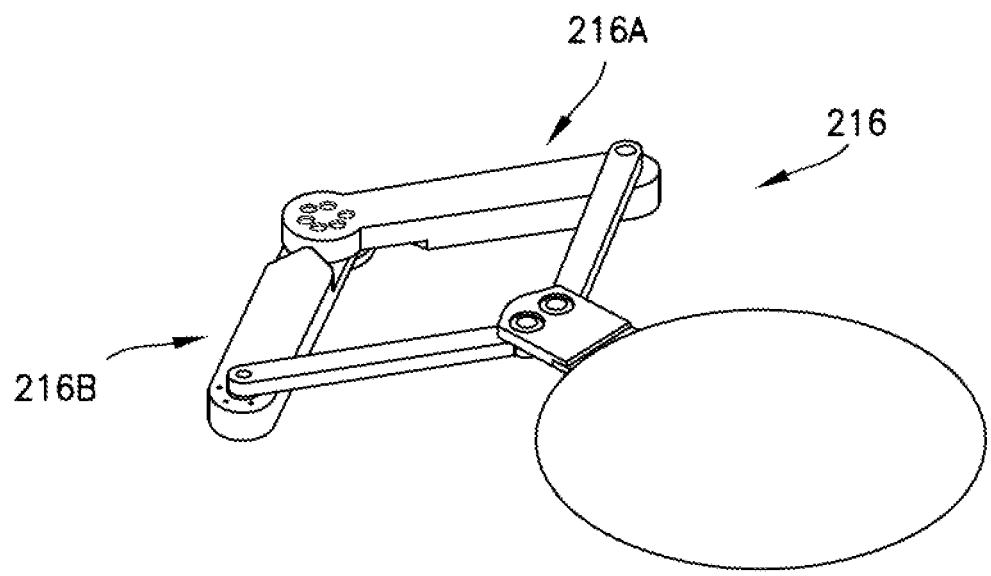
Figure 2B:
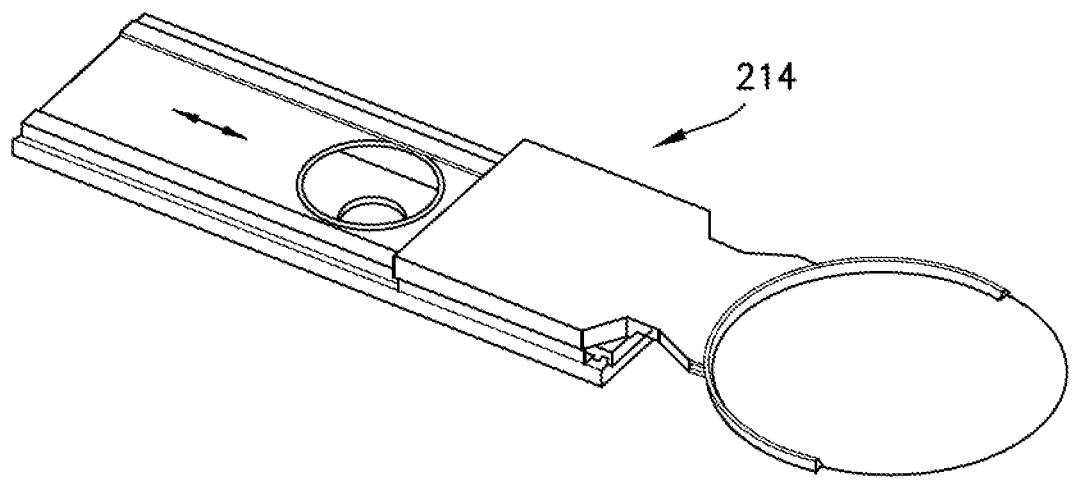
Figure 2C:
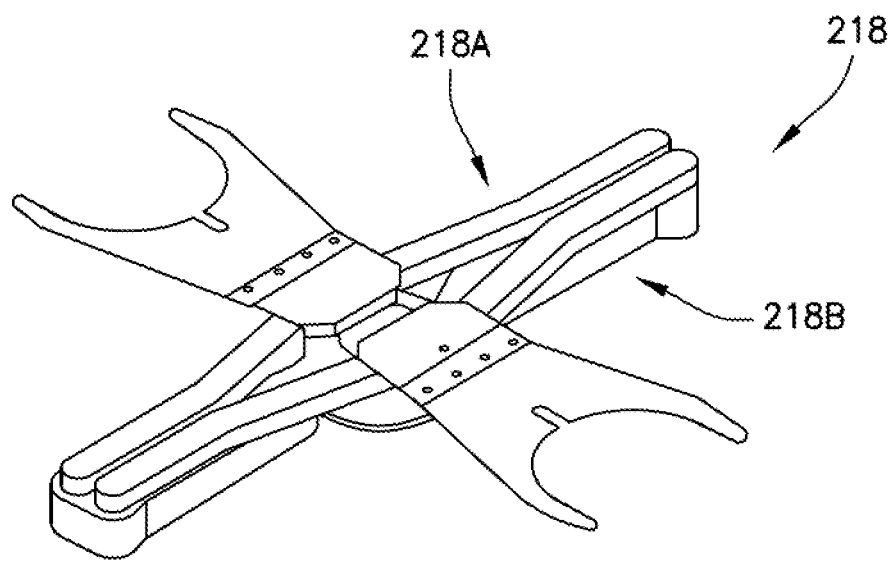
Figure 2D:
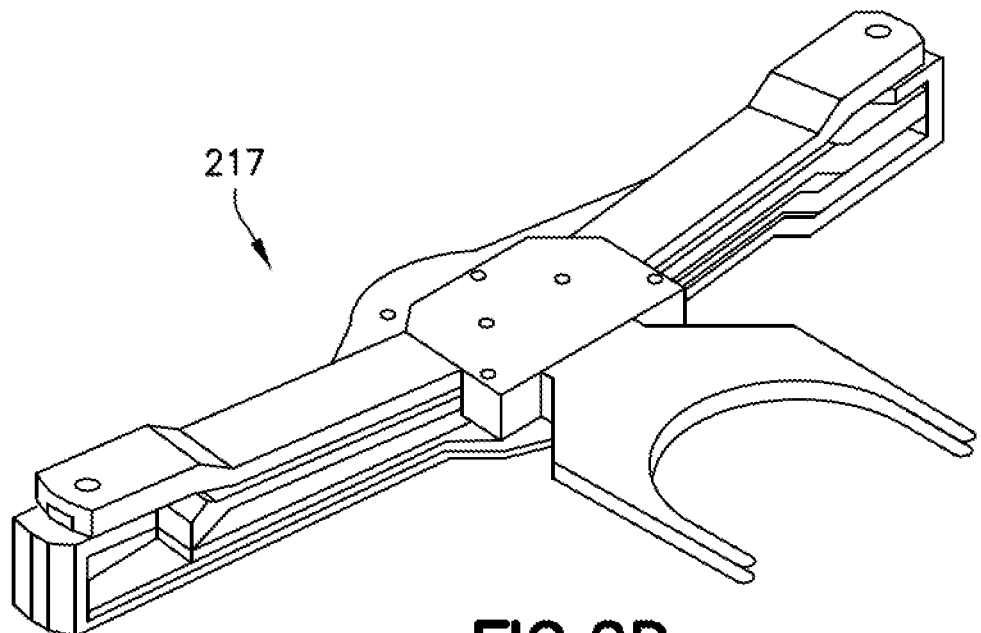

As also noted before, transport chamber modules 18B, 18i have one or more corresponding transport apparatus 26B, 26i, which may include one or more aspects of the disclosed embodiment described herein, located therein. The transport apparatus 26B, 26i of the respective transport chamber modules 18B, 18i may cooperate to provide the linearly distributed workpiece transport system in the transport chamber. In this aspect, the transport apparatus 26B (which may be substantially similar to the transport apparatus 11013, 11014 of the cluster tool illustrated in FIGS. 1A and 1B) may have a general SCARA arm configuration (though in other aspects the transport arms may have any other desired arrangement such as, for example, a linearly sliding arm 214 as shown in FIG. 2B or other suitable arms having any suitable arm linkage mechanisms. Suitable examples of arm linkage mechanisms can be found in, for example, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011, U.S. Pat. No. 8,419,341 issued Apr. 16, 2013 and U.S. patent application Ser. No. 13/293,717 entitled "Dual Arm Robot" and filed on Nov. 10, 2011 and Ser. No. 13/861,693 entitled "Linear Vacuum Robot with Z Motion and Articulated Arm" and filed on Sep. 5, 2013 the disclosures of which are all incorporated by reference herein in their entireties. In aspects of the disclosed embodiment, the at least one transfer arm may be derived from a conventional SCARA (selective compliant articulated robot arm) type design, which includes an upper arm, a band-driven forearm and a band-constrained end-effector, or from a telescoping arm or any other suitable arm design. Suitable examples of transfer arms can be found in, for example, U.S. patent application Ser. No. 12/117,415 entitled "Substrate Transport Apparatus with Multiple Movable Arms Utilizing a Mechanical Switch Mechanism" filed on May 8, 2008 and U.S. Pat. No. 7,648,327 issued on Jan. 19, 2010, the disclosures of which are incorporated by reference herein in their entireties. The operation of the transfer arms may be independent from each other (e.g. the extension/retraction of each arm is independent from other arms), may be operated through a lost motion switch or may be operably linked in any suitable way such that the arms share at least one common drive axis. In still other aspects the transport arms may have any other desired arrangement such as a frog-leg arm 216 (FIG. 2A) configuration, a leap frog arm 217 (FIG. 2D) configuration, a bi-symmetric arm 218 (FIG. 2C) configuration, etc. In another aspect, referring to FIG. 2E, the transfer arm 219 includes at least a first and second articulated arm 219A, 219B where each arm 219A, 219B includes an end effector 219E configured to hold at least two substrates S1, S2 side by side in a common transfer plane (each substrate holding location of the end effector 219E shares a common drive for picking and placing the substrates S1, S2) where the spacing DX between the substrates S1, S2 corresponds to a fixed spacing between side by side substrate holding locations. Suitable examples of transport arms can be found in U.S. Pat. No. 6,231,297 issued May 15, 2001, U.S. Pat. No. 5,180,276 issued Jan. 19, 1993, U.S. Pat. No. 6,464,448 issued Oct. 15, 2002, U.S. Pat. No. 6,224,319 issued May 1, 2001, U.S. Pat. No. 5,447,409 issued Sep. 5, 1995, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011 and U.S. patent application Ser. No. 13/293,717 entitled "Dual Arm Robot" and filed on Nov. 10, 2011 and Ser. No. 13/270,844 entitled "Coaxial Drive Vacuum Robot" and filed on Oct. 11, 2011 the disclosures of which are all incorporated by reference herein in their entireties. The aspects of the disclosed embodiment are, in one aspect, incorporated into the transport arm of a linear transport shuttle such as those described in, for example, U.S. Pat. Nos. 8,293,066 and 7,988,398 the disclosures of which are incorporated herein by reference in their entireties.

In the aspect of the disclosed embodiment shown in FIG. 1D, the arms of the transport apparatus 26B may be arranged to provide what may be referred to as fast swap arrangement allowing the transport to quickly swap wafers (e.g. pick a wafer from a substrate holding location and then immediately place a wafer to the same substrate holding location) from a pick/place location. The transport arm 26B may have any suitable drive section (e.g. coaxially arranged drive shafts, side by side drive shafts, horizontally adjacent motors, vertically stacked motors, etc.), for providing each arm with any suitable number of degrees of freedom (e.g. independent rotation about shoulder and elbow joints with Z axis motion). As seen in FIG. 1D, in this aspect the modules 56A, 56, 30i may be located interstitially between transfer chamber modules 18B, 18i and may define suitable processing modules, load lock(s) LL, buffer station(s), metrology station(s) or any other desired station(s). For example the interstitial modules, such as load locks 56A, 56 and workpiece station 30i, may each have stationary workpiece supports/shelves 56S1, 56S2, 30S1, 30S2 that may cooperate with the transport arms to effect transport or workpieces through the length of the transport chamber along linear axis X of the transport chamber. By way of example, workpiece (s) may be loaded into the transport chamber 416 by interface section 12. The workpiece(s) may be positioned on the support(s) of load lock module 56A with the transport arm 15 of the interface section. The workpiece(s), in load lock module 56A, may be moved between load lock module 56A and load lock module 56 by the transport arm 26B in module 18B, and in a similar and consecutive manner between load lock 56 and workpiece station 30i with arm 26i (in module 18i) and between station 30i and station 412 with arm 26i in module 18i. This process may be reversed in whole or in part to move the workpiece(s) in the opposite direction. Thus, in one aspect, workpieces may be moved in any direction along axis X and to any position along the transport chamber and may be loaded to and unloaded from any desired module (processing or otherwise) communicating with the transport chamber. In other aspects, interstitial transport chamber modules with static workpiece supports or shelves may not be provided between transport chamber modules 18B, 18i. In such aspects, transport arms of adjoining transport chamber modules may pass off workpieces directly from end effector or one transport arm to end effector of another transport arm to move the workpiece through the transport chamber. The processing station modules may operate on the substrates through various deposition, etching, or other types of processes to form electrical circuitry or other desired structure on the substrates. The processing station modules are connected to the transport chamber modules to allow substrates to be passed from the transport chamber to the processing stations and vice versa. A suitable example of a processing tool with similar general features to the processing apparatus depicted in FIG. 1D is described in U.S. Pat. No. 8,398,355, previously incorporated by reference in its entirety.

Figure 3:
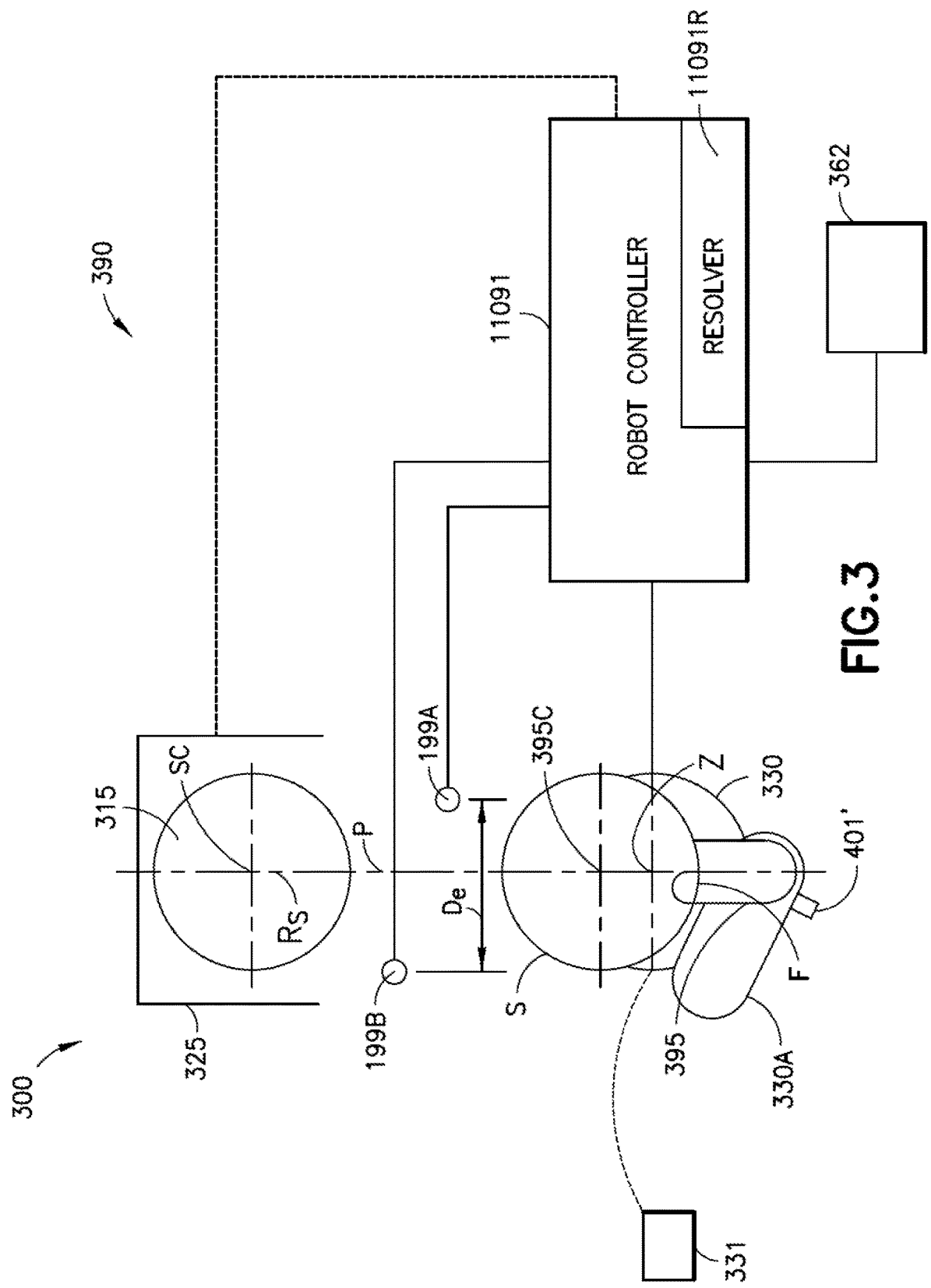
FIG. 3 is a schematic illustration of a portion of a substrate processing apparatus in accordance with aspects of the disclosed embodiment.

Referring now to FIG. 3, a schematic illustration of a portion of any suitable processing tool 390 is illustrated. Here the processing tool 390 is substantially similar to one or more of the processing tools described above. The processing tool 390 may generally include transport robot 130, at least one static detection sensor (e.g. such as automatic wafer centering (AWC) sensor 199A, 199B) and robot controller (which in one aspect is controller 11091) that form, for example, an automatic substrate centering and station teaching apparatus 300. While two sensors 199A, 199B are shown in FIG. 3 for exemplary purposes, in other aspects the processing tool may have more or less than two sensors. FIG. 3 also shows an exemplary processing module 325 of the processing tool 390. In FIG. 3, the transport robot 330 is rendered entirely schematically, and as noted before robot 330 may have any desired configuration. The robot 330 is shown holding a substrate S thereon for transport to processing module 325 (which is substantially similar to processing stations 11030, PM described above). The processing module 325 has a substrate holding station 315 that defines a predetermined center position SC. It is desired that the center of substrate S, when positioned in holding station 315 be substantially coincident with the station center SC. In other aspects, the substrate station may be defined by any desired portion of the processing apparatus where a substrate may be positioned by the robot. The substrate locations and/or the holding station 315 and sensor(s) 199A, 199B relative to the robot 330, shown in FIG. 3 is merely exemplary. In other aspects, the substrate holding stations and sensor(s) may be located as desired relative to the transport robot. In FIG. 3, substrate transport robot 330, sensors 199A, 199B and controller are shown connected, as will be described below, to form an on the fly (i.e. during substrate transport movement) substrate centering system capable of at determining at least the eccentricity of substrate S, held on a wafer or substrate holding station 395S (FIG. 4A) on robot end effector 395, as the robot transports the substrate along a transport path P to holding station 315, and generating a centering factor for adjusting a position of the transport robot 330 ensuring the robot places the substrate S on the substrate station center SC. As described herein, the thermal expansion and/or contraction of the robot 330 is also determined such that the centering of the substrate S is performed based on the thermal expansion and/or contraction of at least the robot 330. As also seen in FIG. 3, in one aspect, the processing tool 390 may include an aligner or automatic wafer centering station 362. In one aspect, the controller 11091 may use information or data (e.g. substrate diameter, fiducial F position, etc.) provided by or derived from the aligner 362 to effect on the fly automatic substrate centering.

As may be realized, the substrate transport robot 330 is connected to and communicates with controller 11091 so that the controller 11091 may control the movements of the substrate transport robot 330 in order to bring the robot end effector 395, specifically the predetermined end effector center or reference position 395C of the end effector 395, to any desired position in processing tool 390 in a known and controlled manner. For example the substrate transport robot 330 may have desired position determining devices (e.g. such as position or motor encoders 331) that are connected to the controller 11091 and send suitable signals to the controller 11091 enabling the controller 11091 to define both positional coordinates and momentum defining parameters of the end effector center 395C in any desired reference system associated with the robot 330. For example, the robot 330, may be pivotally mounted to allow whole body rotation about a shoulder axis of rotation Z and may be articulated to move the end effector center 395C at least in a radial manner relative to the shoulder axis of rotation Z. The encoders 331 of the substrate transport robot 330 are connected to the controller 11091 to identify relative or absolute movement of the robot motors effecting movement. Further, controller 11091 is programmed to convert the encoder data and (in combination with geometry information of the robot, programmed in the controller) generate the position coordinates and inertial parameters of the end effector center 395C. Thus, controller 11091 knows the location coordinates (in a desired coordinate reference frame) of the end effector center 395C at any given time, and the location of any destination of the end effector (for example the center SC of the substrate stations).

In one aspect, aligner 362 may be any suitable substrate aligner. In one aspect, aligner 362 is located in the front or atmospheric section 11000 of the apparatus (see FIG. 1), though in other aspects the aligner may be located in any desired position in the apparatus. An example of a suitable aligner is disclosed in U.S. Pat. No. 8,545,165 entitled "High Speed Aligner Apparatus", which is incorporated by reference herein in its entirety. As noted before aligner 362 may have a suitable sensor(s), such as a through beam sensor, capable of detecting a fiducial F on the substrate S. As may be realized, the fiducial F serves to identify a desired alignment of the substrate S related to process characteristics of one or more of the processing modules. For example, process module 325, shown in FIG. 3, may be capable of carrying out a given process on a substrate S that demands the substrate have a specific orientation. The aligner 362 for example may position the substrate S, when in the aligner, so that when subsequently transported and placed by substrate transport robot 330 in the substrate holding station 315, the substrate S has the desired orientation. In other aspects, the aligner 165 may identify position information to the controller 11091 so that the controller 11091 controls the substrate transport robot 330 to place the substrate S in the process module 325 with the desired orientation. The orientation of the substrate established by aligner 362, positions the fiducial F of the substrate in a known position. The known position of the fiducial for the substrate is communicated to the controller 11091. The controller 11091 is programmed to establish an expected location of the fiducial F with respect to the end effector 395, when the substrate 315 is transported by the end effector 395, from the fiducial position information provided by the aligner 362. The expected fiducial location on the end effector 395 may be used by the controller 11091 to effect automatic wafer centering using for example sensor(s) 199A, 199B identifying at least two points on the substrate S.

In one aspect, the controller 11091 may be programmed to monitor and register various ephemeral data of the processing tool 390 and substrate S, to be used for effecting automatic wafer centering. As may be realized, dimensional characteristics of the substrate S may vary with environmental conditions, especially temperature. For example, the substrate 315 may undergo thermal expansion and contraction as it is subjected to temperature variations during processing. In one aspect, the controller 11091 is configured to determine the center of the substrate in any suitable manner substantially free from data regarding the prior location and temperature of the substrate S, such as by detecting a sufficient number of points (e.g. three or more) along the edge of the substrate. In other aspects, the controller 11091 may have information regarding the prior location of the substrate, and of the environmental temperature to which the substrate may have been subjected in its prior location, as well as time of exposure and any other relevant information. For example, the substrate S may have been removed at some prior time from a baking module placed in a transport container at some temperature and held there for a period of time, and then loaded into processing tool 390 having a certain front end temperature. The controller 11091 memory may thus hold data regarding temperatures in various regions of the processing tool 390 through which the substrates S may be transported or in which the substrate S was held as well as other desired portions of the semiconductor fabrication facility. For example, temperature information may be stored in the controller 11091 for the transport containers 11050 (FIG. 1) in which the substrates are transported to the apparatus. Temperature information may be stored for the front section 11000 (see FIG. 1), load locks 11010 and any buffer stations (not shown) where the substrates may be buffered. Similarly in the vacuum section 11090, thermal information, such as temperatures of radiating surfaces or thermally absorbing surfaces (e.g. heating plates, cooling plates, etc.) may also be stored with controller 11091 as may be realized, in the exemplary embodiment, the controller 170 may also monitor and store temporal information of the substrate, such as location and time. Thus the controller 11091, in the exemplary embodiment may have in its memory data for desired parameters to sufficiently define the thermal condition of the substrate S in a desired period of time, such as when passing by sensor(s) 199A, 199B. For example, the controller may have a suitable thermal balance algorithm to suitably establish the thermal condition (i.e. temperature) of the substrate at a given time such as at measurement of the radius by aligner 362 and when passing sensor(s) 199A, 199B. In alternate embodiments, the data for identifying the thermal condition for the substrate may be accessed by the controller from a desired outside memory location. In still other alternate embodiments, the thermal condition of the substrate may be directly measured by a suitable device such as an optical thermometer. Data on the temperature of the substrate may be communicated to the controller for use to determine dimensional variance of the substrate S due to the thermal condition of the substrate. In other aspects, the center of the substrate S may be determined independent of the temperature of the substrate such as by detecting at least three points on the edge of the substrate with, for example sensors 199A, 199B and determining the center based on the at least three detected points.

Still referring to FIG. 3, the sensors 199A, 199B may be of any suitable type, such as a through beam or reflectance sensor, capable of detecting the presence of the substrate 315 as the substrate is moved past the sensors by the substrate transport robot 330. In the exemplary embodiment, sensors 199A, 199B may each have a beam source and detector that generates an appropriate signal when it detects or fails to detect the beam. The sensor 199A, 199B may be located offset with respect to the transport path P of the substrate, so that the substrate edge passes through the sensing area of and is detected by one or more of sensors 199A, 199B. The transport path P of the substrate S is shown in FIG. 3 as a substantially radial path (i.e. the path extends through the shoulder axis of rotation Z of substrate transport robot 330) for example purposes. In other aspects the substrate S may have any desired transport path. For example, the path may be a rectilinear path P offset but substantially parallel to the radial path P while in other aspects, the path may be an arced path. In other aspects, the path may be offset and at a desired angle relative to the radial path P. The sensor 199A, 199B may be optimally located for improved sensitivity for detecting the subject edge as described in U.S. Pat. No. 6,990,430 incorporated by reference herein in its entirety.

In one aspect, the location of one or more of the sensors 199A, 199B relative to the transport path P may be based on the expected orientation of the substrate 315 (i.e. on the expected position of the fiducial F) on the end effector 395, and hence on the substrate orientation parameters associated with the processing module 325 to which the substrate is to be transported. The anticipated orientation of the substrates being transported to a given processing module is determinable at set up of the apparatus when the processing modules and robots are being installed. The on the fly automatic substrate centering sensor 199A, 199B, may be accordingly positioned with respect to the transport path P to ensure that under the expected substrate orientation on the robot end effector 395, dependent on the orientation parameters associated with the given processing modules, the fiducial F is not expected within an exclusion zone defined by the sensor.

In one aspect, the controller 11091 is configured to determine the center location of the substrate S relative to the reference position 395C of the end effector 395 using one or more of sensors 199A, 199B in the manner described in, for example, U.S. Pat. No. 6,990,430 issued on Jan. 24, 2006 and U.S. Pat. No. 7,925,378 issued on Apr. 12, 2011 the disclosures of which are incorporated by reference in their entireties. In other aspects, the controller 11091 is configured to determine the center location of the substrate S relative to the reference position 395C of the end effector 395 in any suitable manner, such as in the manner described in U.S. Pat. No. 4,819,167 issued on Apr. 4, 1989 and U.S. Pat. No. 5,980,194 issued on Nov. 9, 1999 the disclosures of which are incorporated herein by reference in their entireties.

As described above, the controller 11091 is also configured to determine the thermal expansion and/or contraction of the substrate transport apparatus 395 when automatically centering the substrate for picking and placing the substrate at a substrate holding station 315. In one aspect, referring to FIG. 4A, the end effector 395 is a self-centering end effector that is provided with one or more datum or center deterministic feature 401, 402 that is integral to (formed as a one piece unitary member) or mounted to the end effector in any suitable manner for effecting a determination of the end effector reference point location. While the datum features 401, 402 are described herein with respect to the end effector 395 it should be understood that in other aspects the datum features may be located on any suitable portion of the substrate transport robot 330 such as on an arm link. The one or more datum features 401, 402 are deterministic with respect to the reference position 395C of the end effector 395 (also denoted in FIG. 4A as position Xc, Yc) and thus every spatial position of the end effector. For example, the one or more datum feature 401, 402 has a fixed predetermined relationship with the reference position 395C independent of a temperature of the end effector 395 and datum feature 401, 402 as will be described in greater detail herein. In one aspect, the end effector 395 (including the one or more datum feature 401, 402) is dimensionally stable at, for example, high temperatures such as at the upper range of temperatures described above (e.g. about 850° C. or greater) in that the end effector 395 material has substantially limited thermal expansion and contraction. In one aspect, the end effector 395 and one or more datum feature 401, 402 comprise alumina or other suitable material having a substantially limited amount of thermal expansion and contraction at high temperatures. It should also be understood that the end effector and datum feature material is also dimensionally stable at temperatures below about 850° C. It is noted that while, high temperatures and thermal expansion of the end effector 395 are described it should be understood that the aspects of the disclosed embodiment are applicable to, for example, moderate substrate processing temperatures of about 500° C. and to low processing temperatures of about 200° C.

Figure 4A:
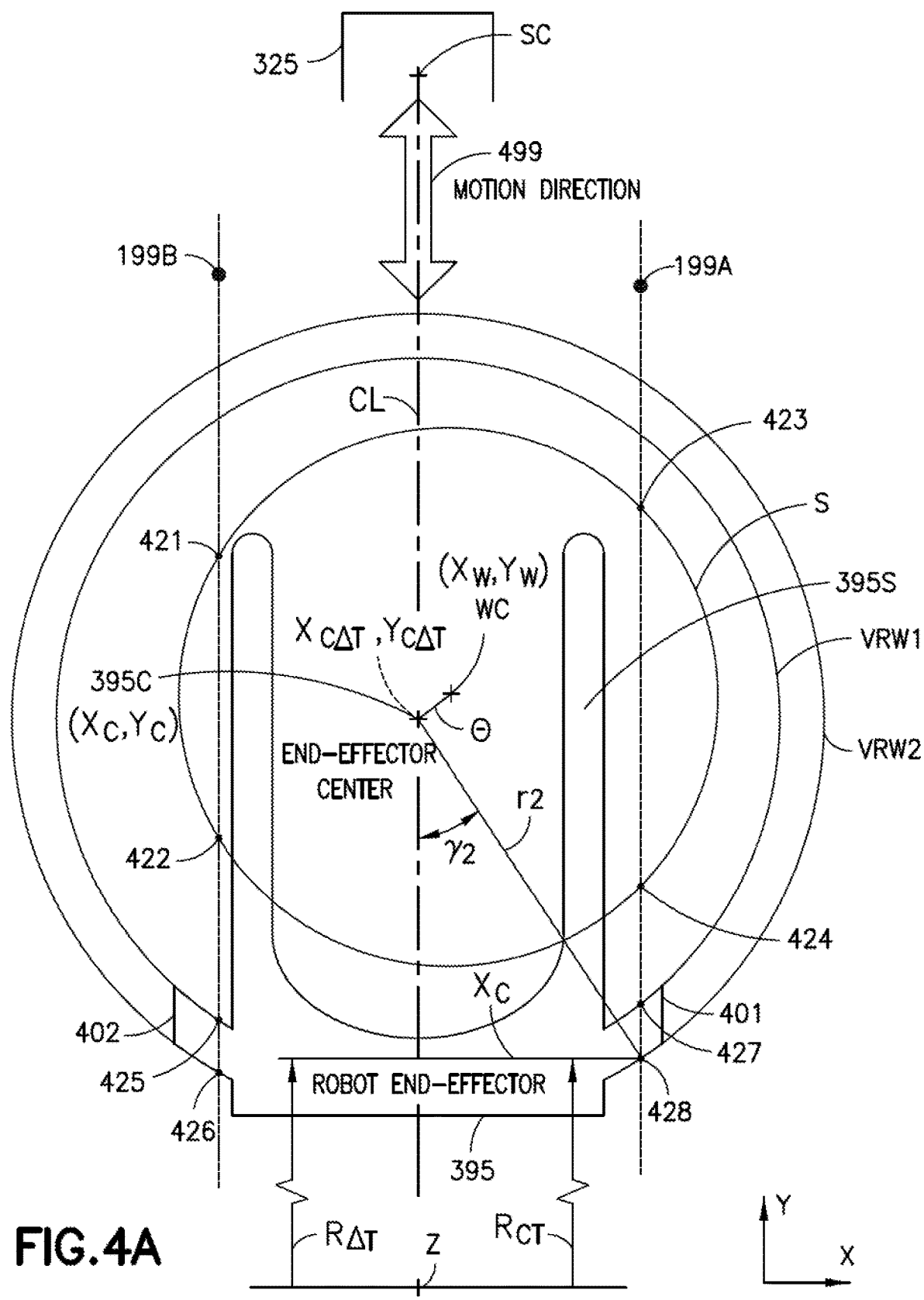
FIG. 4A is a schematic illustration of a portion of a substrate processing apparatus in accordance with aspects of the disclosed embodiment.

In one aspect, referring to FIGS. 3 and 4A, the one or more datum features 401, 402 are shaped and positioned on, for example, the end effector 395 or at any other suitable location of the substrate transport apparatus 330 so as to be detected by automatic substrate or wafer centering sensors, such as one or more of sensors 199A, 199B, during motion 499 (e.g. on the fly) of the substrate transport 330 transfer arm 330A past the sensor(s) 199A, 199B where the motion is one or more of a radial extension/retraction motion (e.g. R motion), a rotational motion (e.g. θ motion) or any suitable rectilinear or curved motion. In one aspect, the datum features 401, 402 are also positioned relative to the substrate S held on the end effector 395 so as to be sensed by the sensors 199A, 199B while the substrate S is held or carried by the end effector 395. For example, the substrate holding station 395S of the end effector 395 is unobstructed by the one or more datum features 401, 402. It is also noted that the one or more datum features 401, 402 are unobstructed by the substrate S held by the end effector 395. In one aspect, the datum features 401, 402 are disposed on the substrate transport robot 330 separate and distinct from the substrate holding station 395S. In one aspect, as can be seen in FIG. 3, one or more datum features 401' are located on the arm 330A of the substrate transport apparatus 330. For example, the end effector 395 is in one aspect, coupled to the arm 330A by a wrist blade 395WR or other suitable mechanical interface that couples the end effector to a link of the arm 330A. The wrist blade 395WR in one aspect defines the wrist axis of the substrate transport apparatus arm 330A and includes a coupling support or seat to which the end effector 395 is attached.

As may be realized, the substrate S may be held on the end effector in a centered position (e.g. the center of the substrate is coincident with the end effector reference point 395C) or in an eccentric position (e.g. the center of the substrate is not coincident with the end effector reference point). The sensors 199A, 199B are configured to detect the transitions 421-422 of the substrate past the respective sensor 199A, 199B as well as the transitions 425-428 of the datum features past the respective sensor 199A, 199B on the fly during motion 499 of the end effector 395. As may be realized, the substrate S may rest on the end effector 395 with an arbitrary eccentricity e between the substrate center WC and the end effector reference point 395C. As described herein, the predetermined deterministic relationship between the datum features 401, 402 and the reference point 395C of the end effector 395 provides for the identification of the substrate center offset (e.g. eccentricity e) independent from any teaching fixtures, identification of the end effector center or reference location 395C when the substrate transport robot 330 (e.g. at least the arm 330A of the robot) is under thermal displacement (e.g. expansion or contraction), identification of the end effector center or reference location 395C relative to the sensors 199A, 199B so that the station holding locations SC can be identified and taught, and the minimization of hysteresis effects (e.g. sensor latency) in the detection of the robot 395 positions associated with the respective sensor transitions 421-428.

Each of the datum features 401, 402 has a known predetermined shape that defines a unique deterministic solution for the detection of respective edge or transition points 425, 426, 427, 428 scanned by the sensors 199A, 199B relative to the end effector reference point 395C. This known predetermined shape is detected or sensed by the sensors 199A, 199B to determine the end effector reference point 395C location Xc, Yc prior to thermal expansion/contraction and the location of the end effector reference point 395 after thermal expansion/contraction. In one aspect, the sensors 199A, 199B are positioned within the processing tool 390 so that each sensor is offset to a longitudinal centerline CL of the end effector 395 as the end effector travels past the sensors 199A, 199B. Here the sensors 1199A, 199B are located on opposite sides of the centerline CL while in other aspects, there may be one or more sensors located on a common side of the centerline CL.

In the aspect illustrated in FIG. 4A there are two datum features 401, 402 that extend or depend from opposite lateral (where lateral is generally in the X direction and the longitudinal axis is defined by the end effector centerline CL) sides of the end effector 395 but in other aspects, there may be more or less than two datum features 401, 402. For example, referring to FIG. 4B, in one aspect there is a single datum feature 401 disposed on (e.g. extends or depends from) a single lateral side of the end effector 395. In other aspects, the end effector 395 includes supplemental datum features disposed on a common lateral side or opposite lateral sides. For example, referring to FIG. 4C the reference datums 401, 402' are located on a common lateral side of the end effector 395 where the datum features 401, 402' provide for a supplemental end effector reference point 395C location determination using either pair of transition points 425', 426' and 427, 428 where each of the supplemental datum feature 401, 402' is supplemental to another of the datum features and provides for a respective unique deterministic solution for determining the end effector reference point 395C location Xc, Yc that can be combined and averaged as described herein to increase the accuracy of the location determination. While the supplemental reference datum features 401, 402' are illustrated on a common lateral side of the end effector 395, in other aspects, the supplemental datum features may be located on opposite lateral sides of the end effector. In other aspects, referring to FIGS. 4D and 4E, the end effector 395 includes one or more datum feature 403 where the datum feature 403 is formed as internal datum features such as an aperture (e.g. slot or hole) in the end effector 395. The one or more datum feature 403 has any suitable shape and configuration to effect the determination of the end effector reference point 395C location Xc, Yc in a manner substantially similar to that described herein. For example, the one or more datum feature 403 may be a single feature or multiple features 403A, 403B that is/are shaped to be scanned in one or more directions to determine a location and size of the feature which where the shape and sized are then used by the controller to determine the thermal expansion or contraction of the end effector and the location Xc, Yc of the end effector reference point 395C. In one aspect, the one or more datum features 403 are shaped and sized so as to be scanned during movement of the substrate transfer robot 330 in a manner similar to that described herein with respect to datum features 401, 402. In one aspect, the thermal effects as described herein are determined independent of a wafer eccentricity determination and may be sensed with different datum features located anywhere on the arm 330A, the end effector 395 and/or the wrist blade 395WR. For example, in one aspect, at least a portion of the one or more internal datum features 403, 403A, 403B corresponds to an external datum feature, such as edge 395EG of the end effector 395. For example, edge 403E of datum features 403A, 403B have a predetermined relationship with edge 395EG such that edges 403E and 395EG are sensed/detected in the manner described with respect to the edges of datum features 401, 402 to effect determination of at least the end effector reference point 395C. It should be understood that the shape and number of the datum features 403, 403A, 403B are representative and in other aspects, there may be any suitable number of datum features each having any suitable shape. In still other aspects, referring to FIG. 4F, the datum features 401", 402" are coincident with one or more edges of the end effector 395. For example, the end effector includes a wrist portion 395W and a substrate holding portion 395H. In this aspect, the wrist portion 395W, or any other suitable portion of the end effector 395, is shaped so that the edges of the wrist portion 395W integrally form the datum features 401", 402" coincident with the edges of the wrist portion 395W. In other aspects, datum feature(s) described herein are incorporated in or on one or more of the arm 330A of the substrate transport apparatus 330 and the mechanical interface (e.g. wrist plate which may be similar to wrist portion 395W) between the end effector 395 and the arm 330A.

In the aspect illustrated in FIG. 4A the datum features 401, 402 are illustrated as having a curved shape so that the leading and trailing edges (corresponding to transitions 425-428) of each respective datum feature 401, 402 have a substantially constant radius where the detection of the leading and trailing edges at the transitions 425-428 are resolved by the controller 11091, with e.g. position data from the encoders 331, to establish the location Xc, Yc of the end effector reference point 395C. In other aspects, the datum features 401, 402 have any suitable shape that has a unique solution with respect to the end effector reference point 395C that will resolve to identify the location Xc, Yc of the end effector reference point 395C. For example, in one aspect, referring to FIG. 5 the datum features 501, 502 include straight edges that have predetermined offsets FS1, FS2 and angles α with respect to the location Xc, Yc of the end effector reference point 395C. In one aspect, each of the datum features described herein is configured to independently resolve the end effector reference point 395C of the substrate holding station 395S. In one aspect, the datum features described herein are disposed on the end effector 395 or other suitable position of the substrate transport robot 330 arm 330A so that detection of the datum feature defines a variance in dimension of the substrate transport robot 330 independent of the end effector 395 where the variance is, in one aspect, due to thermal effects on the substrate transport robot 330.

In one aspect, still referring to FIG. 4A, multiple datum features 401, 402 are provided on the end effector to improve the accuracy with respect to determining the reference location Xc, Yc of the end effector reference point 395C. For example, the datum features 401, 402 are substantially similar to each other and arranged oppositely relative to each other so that a shape of each of the datum features 401, 402 aligns with one or more common virtual reference features such as for example, a first circle VRW1 (corresponding to transitions 425, 427) and a second circle VRW2 (corresponding to transitions 426, 428). While two circles are illustrated, in other aspects the transitions may correspond to a single circle or more than two circles. In other aspects, the datum features 401, 402 may define any suitable geometric features/shapes that have a predetermined relationship with, for example, the end effector reference point 395C. Each circle VRW1, VRW2 has a known diameter and hence, each circle VRW1, VRW2 (and the edges of the datum features 401, 402 corresponding to the respective circles and transitions 425, 427 and 426, 428) has a respective deterministic solution with respect to determining the location Xc, Yc of the end effector reference point 395C. In one aspect, each of the solutions for the circles VRW1, VRW2 and the positional data from the encoders 331 corresponding to transitions 425, 427 and 426, 428 are combined and averaged by the controller 11091 in any suitable manner to, for example, substantially eliminate noise variations in sensor 199A, 199B signals and robot encoder data. In other aspects the solutions for each of the datum features, such as a single datum feature, datum features on opposite sides of the end effector and/or datum features on a common side of the end effector (whether supplemental features or non-supplemental features) can be combined and averaged to eliminate noise variations in the sensor and encoder data.

As may be realized, there may be hysteresis effects (e.g. in the sensor 199A, 199B signals) due to, for example, velocity effects of the moving transport arm 330A and end effector 395 when detecting one or more of the transitions 421-428. For example, a higher transport arm 330A velocity results in greater variance effects due to a lag between the time a sensor 199A, 199B senses one or more of at least transitions 425-428 and the time the sensor signal is received by the controller 11091. The hysteresis effects are, in one aspect, resolved by combining, for example, the radial extension position encoder values of the transport arm 330A corresponding to the detection signal of the respective transitions 425-428 at different velocities. While radial extension of the arm 330A is used as an example, in other aspects the positional information of the arm 330A obtained from the encoders 331 may be any suitable position data corresponding to any suitable coordinate system. For example, the transport arm 330A transports extends into the substrate holding station 315 at a first velocity for placing the substrate S and retracts from the substrate holding station 315, after placing the substrate S, at a second velocity that is different than the first velocity. Transition 425-428 data is received by the controller 11091 for both the extend and retract passes of the transport arm 330A where, for example, the end effector passes by the sensors 199A, 199B and the encoders 331 send position values/data to the controller 11091 that correspond with the transition 425-428 data. The controller 11091 is configured to combine and average the position values/data from the encoders 331 that correspond with the transition 425-428 data for the extend and retract passes to compensate for the hysteresis effects. As may be realized, multiple extend and retract passes may be combined and averaged to substantially reduce or eliminate the hysteresis effects. While radial extension of the arm 330A is described with respect to the hysteresis compensation example described above, in other aspects, the arm 330A may pass by the sensors along any suitable path in multiple directions at different velocities where the position data corresponding to the sensor transitions is combined and averaged to compensate for hysteresis effects.

Referring still to FIG. 4A, an exemplary operation of the aspects of the disclosed embodiment will be described. As described above, conventional automatic wafer or substrate centering algorithms utilize a substrate centering fixture to define the reference wafer location at zero eccentricity. In the aspects of the disclosed embodiment the datum features 401, 402 have a predetermined deterministic relationship with the wafer location at zero eccentricity (e.g. the location of the end effector reference point 395C). As such, measurements obtained from the datum features 401, 402 define the end effector reference point 395C location Xc, Yc. The transitions 425-428 detected by one or more of the sensor(s) 199A, 199B as the datum features 401, 402 pass by the respective sensor 199A, 199B are measured as the end effector positions reported by the substrate transport robot 330 encoders 331 at the instants that the respective sensors 199A, 199B detect each transition 425-428. In one aspect, the location Xc, Yc of the end effector reference point 395C is determined substantially simultaneously (e.g. on the same pass or in a single pass of the end effector, datum features, and/or substrate by the sensor(s) 199A, 199B) with the eccentricity determination of the substrate S held on the end effector 395.

Figure 6:
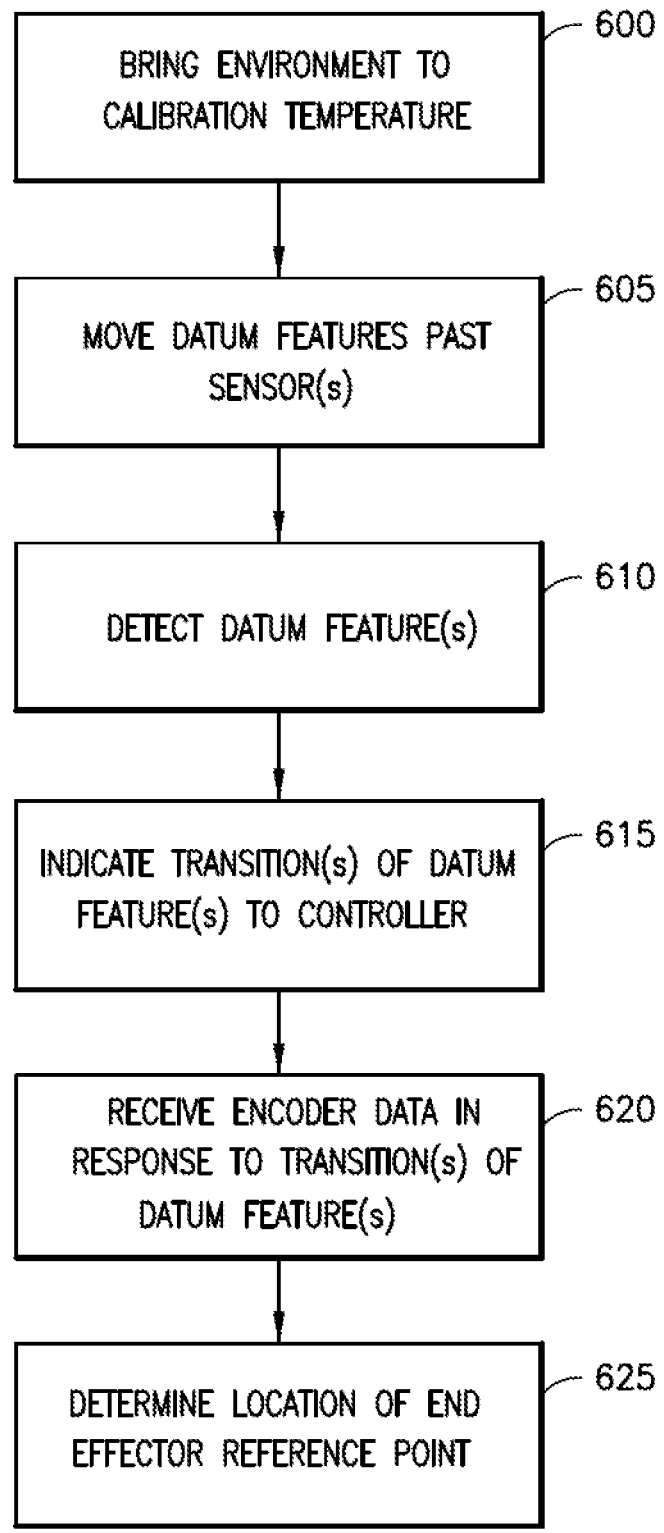
FIG. 6 is a flow diagram in accordance with aspects of the disclosed embodiment.
Figure 7:
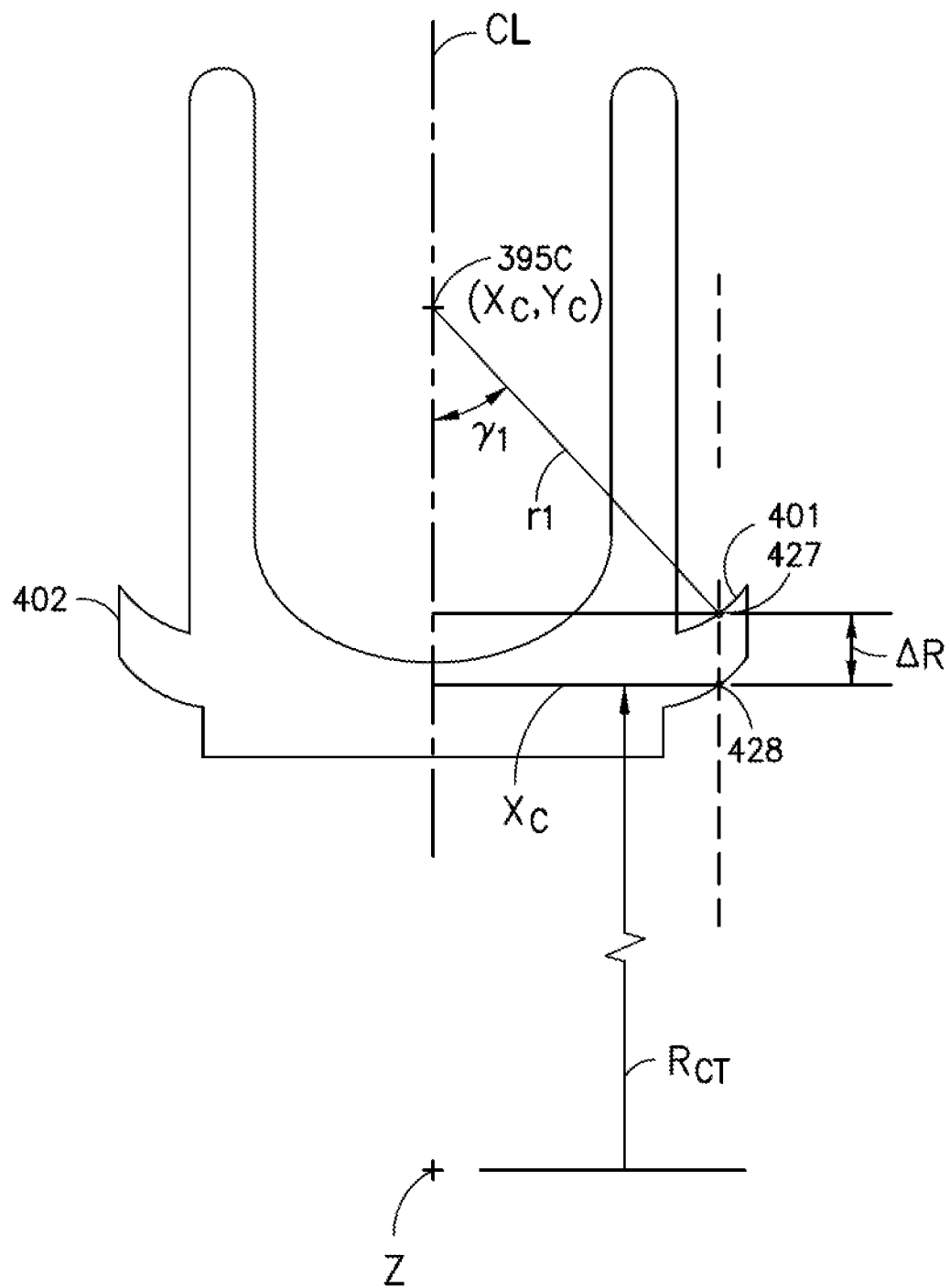
FIG. 7 is a schematic illustration of a portion of a substrate processing apparatus in accordance with aspects of the disclosed embodiment.

In one aspect, the automatic substrate centering and station teaching apparatus 300 described herein is calibrated at a predetermined calibration or reference temperature $T_{REF}$ so that at least the encoder data of the substrate transport robot 330 is correlated to the end effector reference point 395C as the datum features 401-402 pass the one or more sensors 199A, 199B. The calibration temperature may be any suitable temperature such as, for example, a temperature at which the substrate transport arm 330 is free from thermal expansion or contraction and/or a temperature at which the substrate holding stations 315 were taught to the substrate transport apparatus 330. In other aspects, the calibration temperature is a temperature at which an amount of thermal expansion or contraction is known for the substrate transport apparatus 330. In one aspect, to calibrate the automatic substrate centering and station teaching apparatus 300 the environment in which substrate transport robot is brought to the calibration temperature (FIG. 6, Block 600). The substrate transport robot 330 moves within, for example, a transport chamber to a substrate holding station 315 location. As the substrate transport robot 330 moves to the substrate holding station 315 the end effector 395 (e.g. the datum feature(s)) is moved past one or more sensors 199A, 199B (FIG. 6, Block 605). One or more of the sensors 199A, 199B detects, for example, the leading and trailing edges of one or more of the datum features 401, 402 at transitions 425-428 (FIG. 6, Block 610). At each transition 425-428 the one or more sensors 199A, 199B sends a signal to the controller 11091 indicting the respective transition 425-428 occurred (FIG. 6, Block 615) and in response to this signal the encoders of the substrate transport robot 330 send signals to the controller 11091 indicating the position of the substrate transport robot 330 (e.g. the controller 11091 receives encoder data in response to the transition detections) (FIG. 6, Block 620). The controller determines the location Xc, Yc of the end effector reference point 395C (e.g. the substrate location at zero eccentricity) based on the encoder data corresponding to transitions 425-428 and the known deterministic relationship between the datum features 401, 402 and the end effector reference point 395C in any suitable manner so that the encoder data (and e.g. the radial extension position) of the substrate transport robot 330 is correlated to the end effector reference point 395C (e.g. the location Xc, Yc of the end effector reference point is known by the controller) (FIG. 6, Block 625). In one aspect, the controller 11091 determines the location Xc, Yc using, for example, the following equations with respect to transition points 427, 428 and reference datum 401, and referring to FIGS. 4A and 7:

$r1 \sin \gamma1 = r2 \sin \gamma2$; where $$\gamma1 = \arcsin\left(\frac{r2}{r1}\sin \gamma2\right)$$

$$\Delta R = r1\cos\left(\arcsin\left(\frac{r2}{r1}\sin \gamma2\right)\right) - r2\cos \gamma2$$

$Y_C = R_{CT} + r2 \cos \gamma2$ and
$X_C = r2 \sin \gamma2$ where r1 and r2 are respectively the radii of virtual circles VRW1 and VRW2 defined by the datum features 401, 402; γ1 and γ2 are the respective angles to transition points 427 and 428 on the virtual circles VRW1, VRW2; and ΔR is the difference between the radial extension of the arm at transition 427 and transition 428. Similar calculations for transitions 425, 426 for reference datum 402 may be performed and averaged with the results of the calculations for transitions 427, 428 to increase the accuracy of the calibration.

Again, it should be understood that other solutions/equations are applicable depending on the geometric configuration of the datum features 401, 402. As may be realized, calibration of the automatic substrate centering and station teaching apparatus 300 is performed at, for example, tool setup or when the substrate transport is replaced and need not be performed once the substrate processing apparatus is in the state of process security (e.g. where the temperatures within the sealed processing apparatus are brought up to substrate processing temperatures). In addition, the radial extension $R_{CT}$ of the substrate transport arm 330A at the calibration temperature is determined for at least one of the transitions 425-428 however, in other aspects, where the extension of the substrate transport arm is not radial the X and Y coordinates (or the coordinates of the substrate transport robot in any other suitable coordinate system) of the substrate transport for at least one of the transitions 425-428 are recorded by the controller 11091 and correlated to the transitions 425-428.

As noted above, temperature effect on substrate processing equipment such as, for example, the substrate transport robot 330 may be a source of accuracy errors in, for example, the placement and picking of substrates S from substrate holding stations 315. The thermal expansion and/or contraction of, for example, the substrate transport robot 330 is compensated for on the fly, in one aspect substantially simultaneously with substrate processing, with substrate transport robot 330 arm 330A positional data corresponding to datum feature 401, 402 transition data during the pick and placement of substrates S from and to substrate holding stations such as substrate holding station 315 (FIG. 3). In one aspect, thermal effects on the substrate processing module 325 (and the components there such as substrate holding station 315) are also compensated for by, for example, storing a configurable scale in the controller 11091 that relates thermal expansion/contraction of the substrate processing module 325 to the thermal/contraction of the substrate transport apparatus 330. In one aspect, the value of thermal expansion/contraction of the substrate processing module 325 is estimated by the controller based on the known value of the thermal expansion/contraction of the substrate transport apparatus 330 as described herein. For example, the thermal expansion/contraction of the arm 330A may serve as a temperature sensor to estimate the substrate processing module 325 expansion/contraction, the correlation of which may be indicated in the configurable scale.

Figure 8:
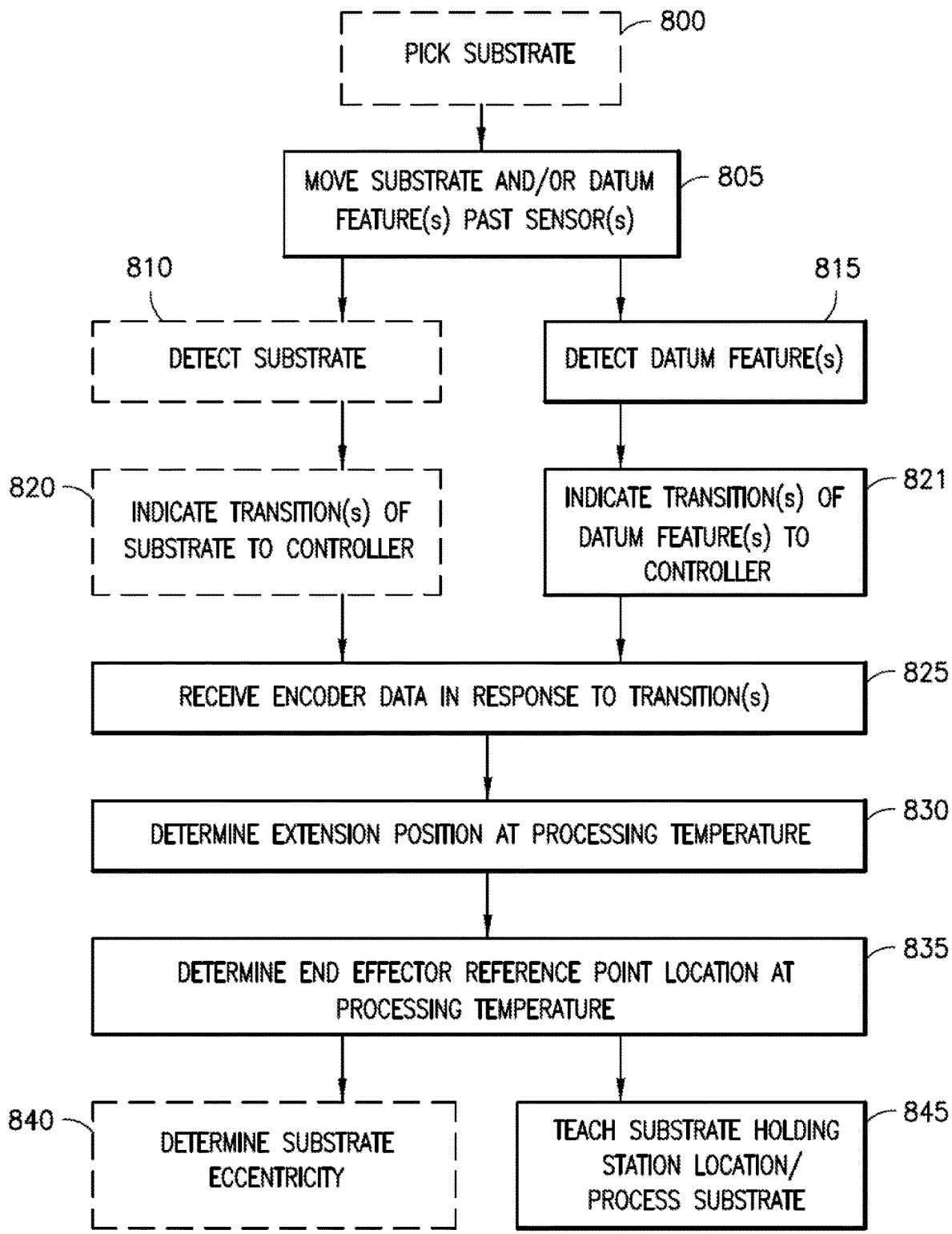
FIG. 8 is a flow diagram in accordance with aspects of the disclosed embodiment.
Figure 9:
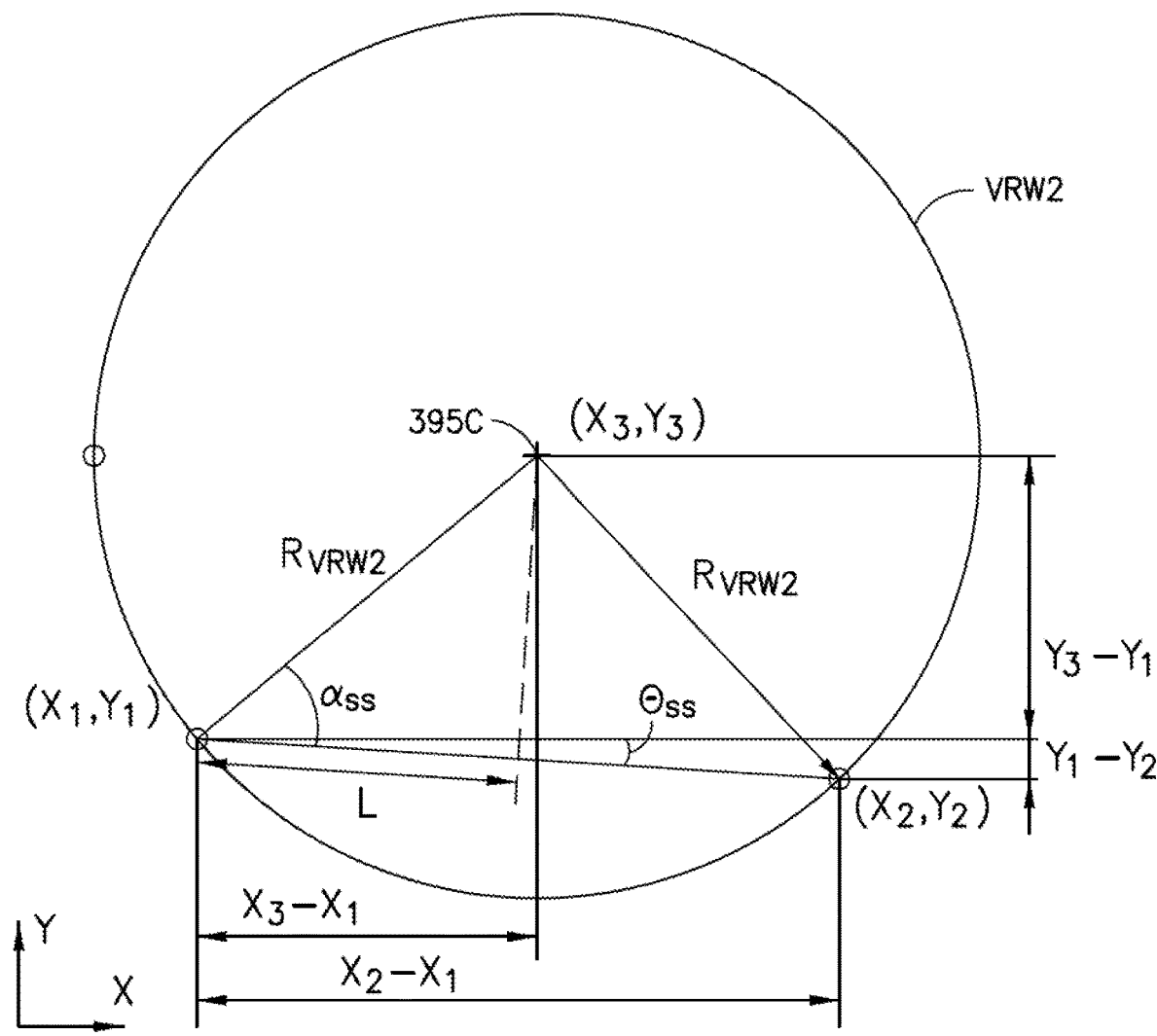
FIG. 9 is a schematic illustration of a portion of a substrate processing apparatus in accordance with aspects of the disclosed embodiment.

As may be realized, as the processing temperature of the substrate processing equipment changes, the detected transitions 425-428 of the datum features 401, 402 drift, with respect to the position of the substrate transport robot 330, as a result of thermal expansion or contraction of the substrate transport apparatus 330, such as the transport arm 395. As such it is possible to measure the resultant thermal expansion or contraction effects by comparing the substrate transport apparatus 330 position data to their relative values at the calibration temperature $T_{REF}$. Referring to FIG. 9, the location of the end effector reference point 395C should be unique except when, for example, there is distortion due to temperature effects. If desired, to quantify the effect of temperature distortion of, for example the substrate transport arm 330A, it is possible to measure the location Xc, Yc at the calibration temperature $T_{REF}$ and store the location as part of a calibration procedure (as noted above). When the substrate transport robot extends or retracts to and from the substrate holding station 315 of the substrate process module 325 at an arbitrary temperature T, the effect of temperature can be calculated as:

$(\Delta X(T), \Delta Y(T)) = (Xc(T) - Xc(T_{REF})), (Yc(T) - Yc(T_{REF}))$ where the measured distortion is incorporated into the wafer offset measurement and correction in any suitable manner such that the wafer center WC is placed aligned with the station location SC. In one aspect $\Delta X(T), \Delta Y(T)$ may be used to determine the thermal effect on the substrate processing module 325 as described herein. For example, in one aspect, the substrate transport robot 330 picks a substrate S from any suitable substrate holding location with the end effector 395 (FIG. 8, Block 800). It is noted that in one aspect, thermal compensation is performed without the end effector holding a substrate S (e.g. block 800 of FIG. 8 is optional) and may be performed prior to or during substrate processing. The substrate transport robot 330 moves within, for example, a transport chamber or other controlled environment to a substrate holding station 315 location. As the substrate transport robot 330 moves towards the substrate holding station 315 of the substrate process module 325 (e.g. to place the substrate S or to move the datum features 401, 402 past the sensors 199A, 199B), the substrate S and/or end effector 395 (e.g. datum features 401, 402) are moved past one or more of the sensors 199A, 199B (FIG. 8, Block 805). In aspects where the end effector 395 is holding a substrate, one or more of the sensors 199A, 199B detects on the fly, for example, the leading and trailing edges of the substrate S at the transitions 421-424 (FIG. 8, Block 810). In one aspect, one or more of the sensors 199A, 199B detects on the fly, for example, in addition to or in lieu of the detection of transitions 421-424 (e.g. detection of the substrate in Block 810 of FIG. 8 is in one aspect optional), the leading and trailing edges of one or more of the datum features 401, 402 at transitions 425-428 (FIG. 8, Block 815). At each transition 421-428 the one or more sensors 199A, 199B sends a signal to the controller 11091 indicting the respective transition 421-428 occurred (FIG. 8, Blocks 820 and 821 noting that Block 820 occurs only when the end effector is holding a substrate) and in response to this signal the encoders of the substrate transport robot 330 send signals to the controller 11091 indicating the position of the substrate transport robot 330 (e.g. the controller 11091 receives encoder data in response to the transition detections) (FIG. 8, Block 825). In one aspect the thermal compensation of the end effector reference position 395C at the processing temperature (e.g. at ΔT) is determined based on, for example, the radial extension position $R_{AT}$ of the substrate transport robot 330 at one or more of the transitions 425-428, such as for example, transition 428. For example, $R_{AT}$ is determined (FIG. 8, Block 830) by the controller 11091 when sensor 119A detects transition 428 and the encoders 331 of the substrate transport apparatus 330 send position signals to the controller 11091 indicating the position of the substrate transport apparatus 330. It is noted that $R_{AT}$ corresponds or otherwise reflects the dimensional changes of the substrate transport robot 330 arm 330A from the sensor 199A to the shoulder axis Z due to, for example, thermal expansion or contraction. As such, the location $X_{CAT}$, $Y_{CAT}$ of the end effector reference point 395C at the processing temperature is determined, e.g. substantially simultaneously with substrate processing, (FIG. 8, Block 835) from the following equations:

$$Y_{CAT} = R_{AT} + r2 \cos \gamma 2 \text{ and}$$

$$X_{CAT} = r2 \sin \gamma 2 = Xc$$

where r2 cos γ2 is unchanged from the calibration value of r2 cos γ2 due to, for example, the thermal stability of the end effector 395 material and $X_{CAT}$ is substantially constant (e.g. equal to Xc), again due to the thermal stability of the end effector 395 material. In one aspect, the dimensional factors of the process module (e.g. due to thermal effects) may be combined, as desired, such as by summation with $Y_{CAT}$ and $X_{CAT}$ to incorporate the effects of dimensional variance of the process module 325 station 315 for commutation of the transport robot to place the substrate S at the process module station 315. In one aspect, the actual value of the processing temperature need not be known to compensate for the thermal expansion of the substrate transport arm 330A as the temperature compensation effect is achieved by, for example, naturally detecting the relative deviations of transitions 425-428 at the processing temperature from the corresponding location values of transitions 425-428 at the calibration temperature. The controller 11091 controls movement of the substrate transport robot 330 based on the location $X_{CAT}$, $Y_{CAT}$ of the end effector reference point 395C at the processing temperature to compensate, on the fly, for the thermal expansion and/or contraction of the substrate transport robot 330, e.g. the location Xc, Yc is adjusted on the fly based on $R_{AT}$ at the processing temperature.

While the determination of the location $X_{CAT}$, $Y_{CAT}$ of the end effector reference point 395C at the processing temperature is determined above from transition 428, in other aspects, the location $X_{CAT}$, $Y_{CAT}$ is determined using more than one point on, for example, the first circle VRW1 and the second circle VRW2 where the multiple points correspond to a common one of the circles VRW1, VRW2. For example, two points such as transitions 426 and 428 are used (or in other aspects transitions 425 and 427 are used) to determine the location $X_{CAT}$, $Y_{CAT}$. For example, referring to FIG. 9, the location $X_{CAT}$, $Y_{CAT}$ can be found by sensing, for example, transitions 426, 428 using the following equations:

$$L = \frac{\sqrt{(Y2-Y1)^2 + (X2-X1)^2}}{2}$$

$$\theta_{SS} + \tan^{-1}\left(\frac{Y2-Y1}{X2-X1}\right)$$

$$\alpha_{SS} = \cos^{-1}\left(\frac{L}{R}\right)$$

$$X3 - X1 = R \cos(\alpha_{SS} - \theta_{SS}) \rightarrow X3 = X1 + R \cos(\alpha_{SS} - \theta_{SS})$$

$$Y3 - Y1 = R \sin(\alpha_{SS} - \theta_{SS}) \rightarrow Y3 = Y1 + R \sin(\alpha_{SS} - \theta_{SS})$$

where these equations locate the end effector reference point 395C using one or more of the virtual circles VRW1, VRW2 which represent a centered substrate held by the end effector 395. As may be realized, the equations using two points on a circle can be applied to both of the circles VRW1, VRW2 where the respective resultant locations for the end effector reference point 395C are averaged to increase the accuracy of the determination of location $X_{CAT}$, $Y_{CAT}$. Here, as with the other aspects of the disclosed embodiment, the location of the end effector reference point 395C may be determined, each and every time the substrate transport apparatus 330 extends the arm 330A to and from substrate processing module/station 325, independent from a location of the substrate S held on the end effector 395. Again in one aspect, the dimensional variance of the process module 325 may be combined with the determination of the location $X_{CAT}$, $Y_{CAT}$ as described herein to effect placement of the substrate S at the process module station 315.

In one aspect, where the end effector holds a substrate S, the controller 11091 is configured to determine the eccentricity e if desired (FIG. 8, Block 840) of the substrate S based on the substrate sensor transition data for transitions 421-424 and the end effector reference point 395C location $X_{CAT}$, $Y_{CAT}$ at the processing temperature. In one aspect, the eccentricity e of the substrate S is determined on the fly in any suitable manner such as, for example in the manner described in U.S. Pat. Nos. 6,990,430; 7,925,378; 4,819,167; and 5,980,194, previously incorporated herein by reference in their entireties. For example, referring to FIG. 4A, the location Xw, Yw of the substrate center WC, the location Xc, Yc of the end effector reference point 395C and the eccentricity e of the substrate S are illustrated. It should be understood that the location Xw, Yw of the substrate center WC and the location Xc, Yc of the end effector reference point 395C represent either the locations at the calibration temperature or at the processing temperature ΔT where the locations Xw, Yw and Xc, Yc ($X_{CAT}$, $Y_{CAT}$) are determined as described herein. In one aspect the eccentricity e can be determined using the following equation:

$$e=(\Delta X, \Delta Y)=(Xw-Xc, Yw-Yc)$$

While it is noted above that the substrate holding station 315 locations are taught to the substrate transport robot 330 at the calibration temperature, in one aspect the substrate holding station 315 location(s) are re-taught (or are taught in lieu of teaching at the calibration temperature) in any suitable manner to the substrate transport robot at the processing temperature (FIG. 8, Block 845) based on for example, the reference point location $X_{CAT}$, $Y_{CAT}$ and/or the eccentricity e of the substrate as determined at the processing temperature. For example, the controller 11091 is configured to learn a center location SC of a substrate processing module/station 325 of the substrate processing tool 390 from the detection of the datum features described herein. In one aspect, the controller 11091 is configured to identify and learn the center location SC of the substrate processing module 325 of the substrate processing tool 390 from sensor data corresponding to the detection of at least one edge of at least one of the datum features described herein. In one aspect, the location(s) of the substrate holding station(s) 315 are taught to the substrate processing robot 330 at the processing temperature a manner substantially similar to that described in U.S. patent application Ser. No. 14/937,676 entitled "Tool Auto-Teach Method and Apparatus" and filed on Nov. 10, 2015, the disclosure of which is incorporated herein by reference in its entirety.

Figure 10:
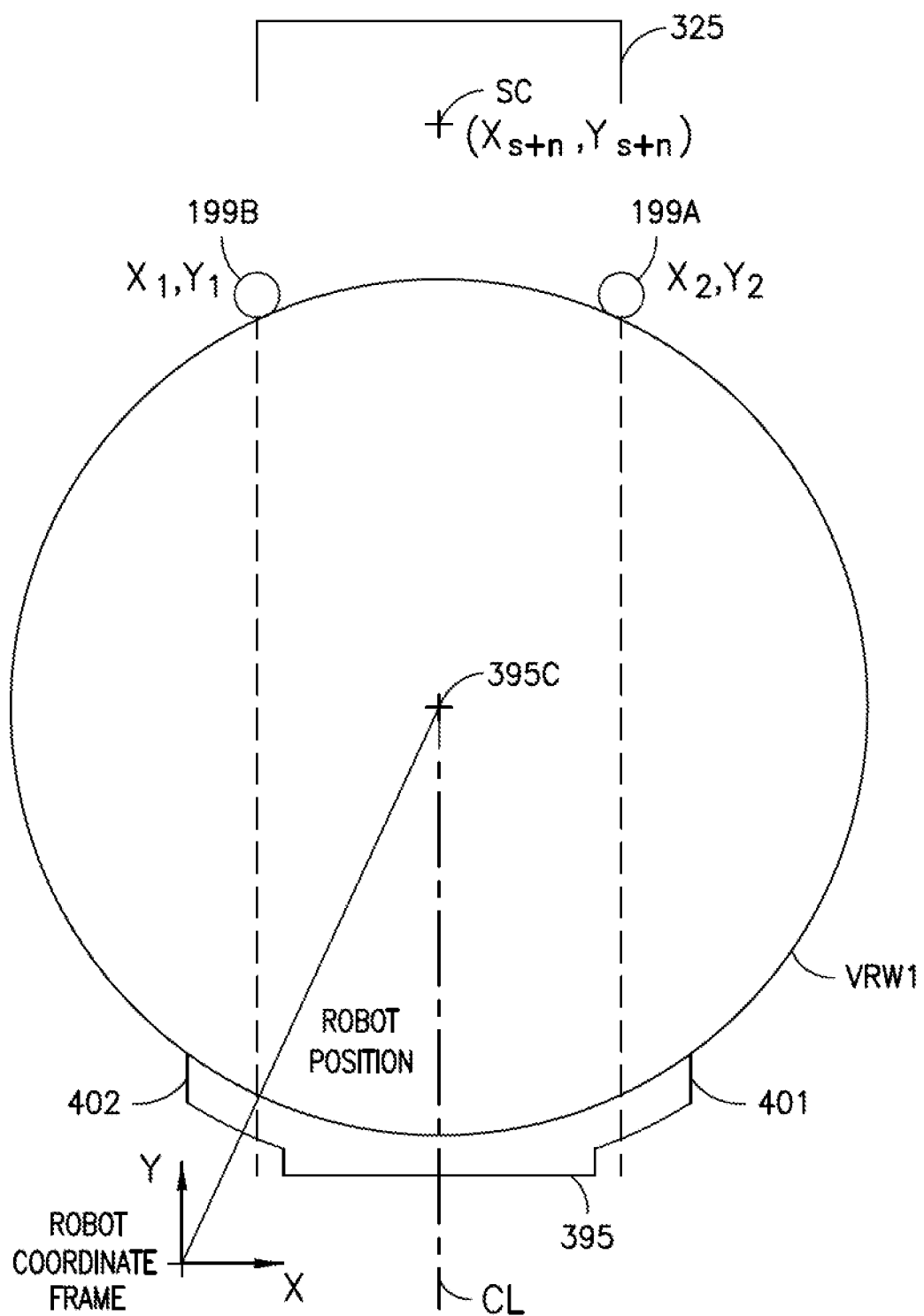
FIG. 10 is schematic illustration of a portion of a substrate processing apparatus in accordance with aspects of the disclosed embodiment.
Figure 11:
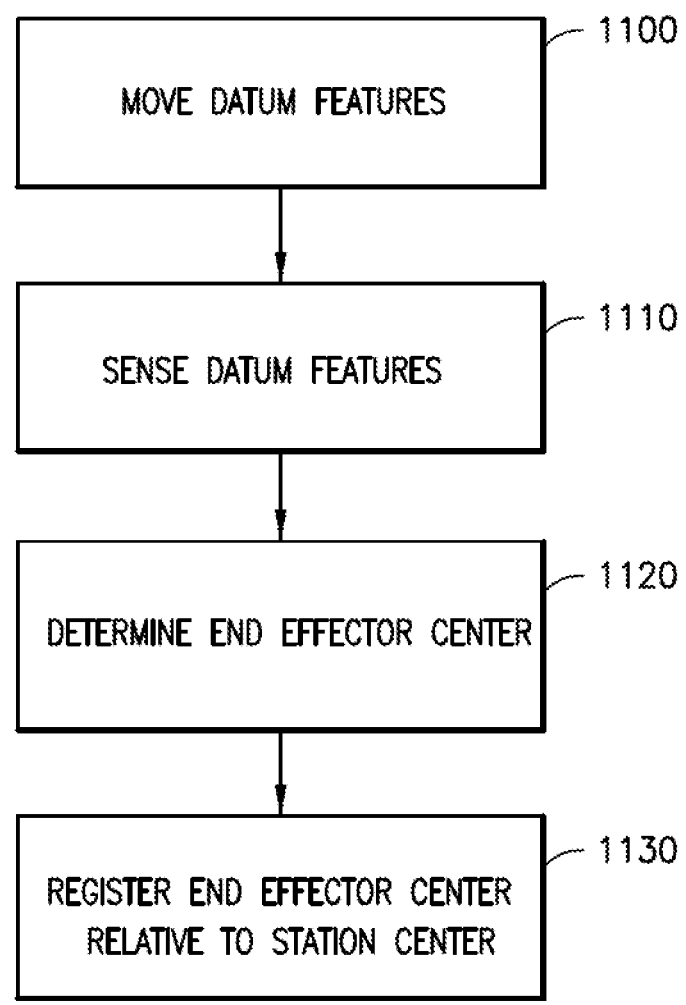
FIG. 11 is a flow diagram in accordance with aspects of the disclosed embodiment.

In one aspect, referring to FIGS. 4A and 10, the position 395C of the substrate transfer robot 330 end effector 395 is determined and the station center SC is taught to the substrate transport apparatus 330 in one pass or step without a teaching wafer. For example, the sensors 199A, 199B (which are opposingly arranged on opposite sides of the centerline CL but need not be symmetrically arranged) have a predetermined spatial relationship with the station center SC so that sensing the datum features, such as datum features 401, 402, serve both to determine the end effector center or reference position 395C and learn the station center SC. For example, the teaching of a station center SC will be described with reference to virtual circle VRW1 defined by the datum features 401, 402 of the end effector 395, but it should be understood that the station center SC can be taught in a similar manner using circle VRW2 defined by the datum features and/or substrate S. In one aspect the wafer S and/or the datum features 401, 402 are moved by the end effector 395 towards the sensors 199A, 199B. (FIG. 11, Block 1100). The wafer S and/or the datum features 401, 402 are sensed with the sensors (FIG. 11, Block 1110) and the determination of one or more of the wafer center WC and the position of the substrate transport apparatus (i.e. reference position 395C) is determined (FIG. 11, Block 1120). For example, the reference position 395C is determined using circle VRW1 as described herein. As may be realized, because the location of the sensors 199A, 199B relative to the station center SC is known and because the wafer center WC is substantially coincident with the end effector center reference point 395C the location of the substrate holding station is also known relative to the end effector center reference point 395C and is taught to the substrate transport apparatus where sensing the wafer S and/or datum features 401, 402 effects registration of the end effector center reference point 395C (i.e. the position of the substrate transport apparatus) relative to the station center in one pass (or step) of the end effector by the sensors 199A, 199B (FIG. 11, Block 1130).

In one aspect, referring to FIGS. 1A and 3, controller 11091 is programmed with a kinematic model and/or algorithm relating or otherwise describing a position of arm 330A (or a position of a predetermined reference point on the arm 330A such as e.g. end effector 395/substrate S center 395C (Xc, Yc) or other suitable reference point) and motions of the arm 330A to a transport module 11025 or processing station 11030 reference frame. In one aspect, the kinematic model and/or algorithm is based on arm 330A dimensions (such as the dimensions $L_{Ui}$, $L_{Fi}$ of each arm link 330AU, 330AF, see FIG. 12) and arm 330A geometry (e.g. fixed pivot, SCARA, frog-leg, a leap frog arm, a bi-symmetric arm, linearly sliding, etc.). In one aspect, the kinematic model or algorithm relates an arm reference point or datum (such as e.g. datum features 401, 402) to a position of the end effector 395, such as the center 395C of the end effector 395 where the distance from the shoulder axis Z to the center 395C of the end effector 395 or to the arm reference point or datum (such as center deterministic/datum feature 401, 402) is generally referred to as the radial position or distance R of the arm 330A as illustrated in FIGS. 4A, 9, 12 and 13.

Figure 12:
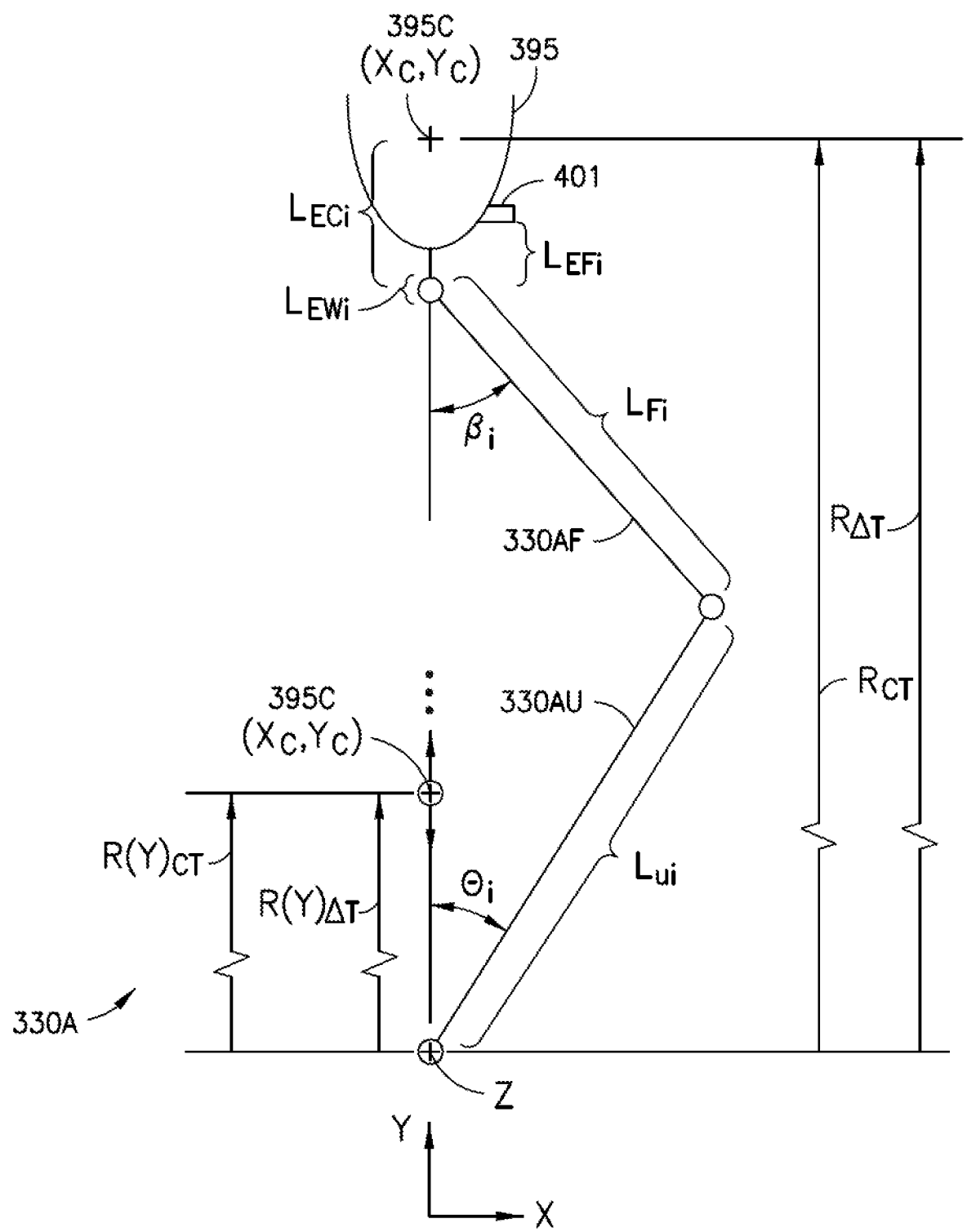
FIG. 12 is a schematic illustration of a portion of a substrate processing apparatus in accordance with aspects of the disclosed embodiment.

Referring to FIG. 12, a schematic representation of a SCARA arm (which also applies to a bi-symmetric arm configuration) is illustrated for exemplary purposes. In other aspects the arm may be, e.g., one of the arms described above with respect to FIGS. 2A-2E or any other suitable robotic arm. With respect to the SCARA arm illustrated in FIG. 12, the upper arm 330AU has a length $L_{Ui}$, the forearm 330AF has a length $L_{Fi}$ and the end effector 395 may have one or more reference point dimensions $L_{Ei}$ such as, e.g., a dimension of the wrist of the SCARA arm $L_{EWi}$, a dimension ($L_{EFi}$) (e.g. from the wrist) to one or more datum or center deterministic feature 401, 402 (similar to features 401, 402 shown in FIGS. 4A-4C and/or the center deterministic feature shown in FIGS. 4D-5 as described above), and/or dimension (e.g. from the wrist) to a center $L_{ECi}$ of the end effector 395 or substrate S. The upper arm 330AU and forearm 330AF links also have link angles $\varepsilon_i$, $\beta_i$ where an angle of the end effector 395 is approximately equal to zero (0) for radial extension of the SCARA arm 330A (e.g., along axis Y that extends through pivot axis Z).

The kinematic model and/or algorithm generates a value for the radial position R of the SCARA arm 330A as a dimension describing the extension/retraction position of a predetermined reference point or datum on the SCARA arm 330A. For example, referring to FIGS. 4 and 7, the radial position $R_{AT}$ of the arm 330A at the processing temperature and the radial position $R_{CT}$ of the arm 330A at the calibration temperature $T_{REF}$ are determined to the one or more datum or center deterministic feature 401, 402 on the robot end effector 395 while in FIG. 9 the radial position $R_{AT}$ of the arm 330A at the processing temperature and the radial position $R_{CT}$ of the arm 330A at the calibration temperature $T_{REF}$ are determined to the center 395C of the end effector 395. Thus, for SCARA arm 330A (or each arm in the bi-symmetric arm) $R_i$ is a function of $L_{Ui}$, $L_{Fi}$, $L_{Ei}$, $\varepsilon_i$ and $\beta_i$, e.g., $R_i$=f($L_{Ui}$, $L_{Fi}$, $L_{Ei}$, $\in_i$, $\beta_i$). For the radial position $R_{CT}$ of the SCARA arm 330A at the calibration temperature $T_{REF}$ the length $L_{Ui}$ of the upper arm $L_{Ui}$ and the length $L_{Fi}$ of the forearm $L_{Fi}$ are known, and link angles $\varepsilon_i$, $\beta_i$ are determined from motor encoder data (for respective arms) with known initial values. The end effector reference point dimension $L_{Ei}$ (whether it be at the wrist $L_{Ewi}$, at the one or more datum or center deterministic feature 401, 402 ($L_{EFi}$), or at center of the end effector or substrate $L_{ECi}$) may be considered a constant as described above. Thus, during motion of the arm 330A the radial position $R_{AT}$ of the arm 330A at the processing temperature and the radial position $R_{CT}$ of the arm 330A at the calibration temperature $T_{REF}$ is/are generated by the kinematic model and/or algorithm at any predetermined position such as when a sensor signal from one or more of automatic wafer centering (AWC) sensors 199A, 199B detect an arm 330A feature or substrate feature (as described above with respect to FIGS. 3, 4A-4F, 5, 7 and 9) and from the geometric relationship of the arm links 330AU, 330AF, 395 and the predetermined reference point on the arm 330A. In one aspect, the predetermined reference point on the arm is determined both with respect to the arm 330A reference frame (e.g. in a radial R, θ coordinate system) and to the transport or processing chamber reference frame (e.g. in a Cartesian coordinate system).

Figure 13:
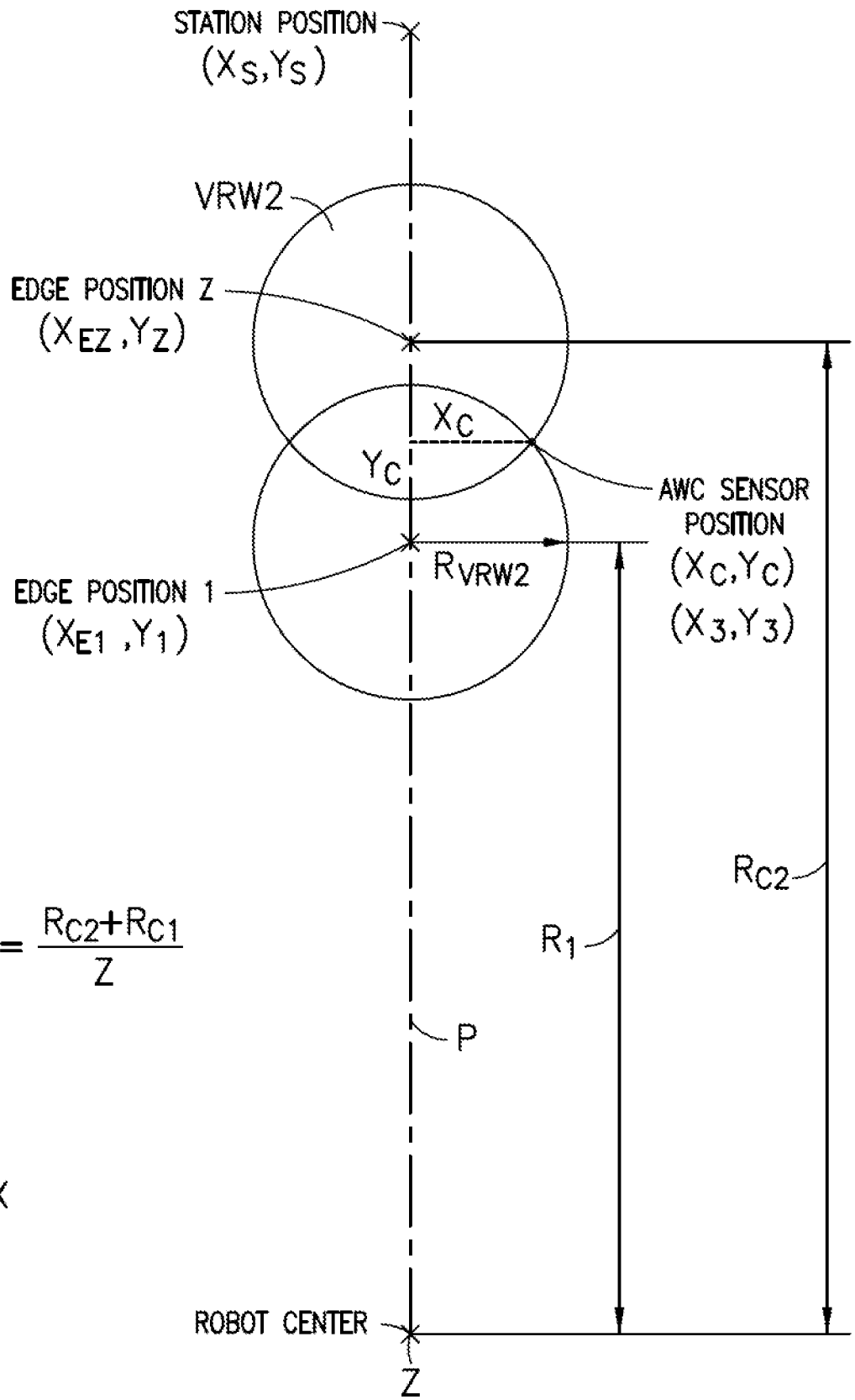
FIG. 13 is a schematic illustration of a portion of a substrate processing apparatus in accordance with aspects of the disclosed embodiment.

Referring to FIGS. 3, 9 and 13, where, for example, the radial extension position R of the arm 330A in the kinematic model and/or algorithm is set to the center position of the end effector 395, where $$Y_3 = \frac{R_{C2} + R_{C1}}{2},$$

where $Y_2 - Y_1 = R_{C2} - R_{C1}$ and $X_2 - X_1 = D_c$ where $D_c$ is a known dimension between sensors 199A, 199B and $Y_3$, $Y_2$, $Y_1$, $X_2$, $X_1$ are similar to that described above.

Further, as previously described herein, the radial position R of the arm 330A changes with thermal changes of the transport chamber 11025 and/or processing stations 11030 and the change in radial position $R_{AT}$ due to the thermal effects is detected by sensor(s) 199A, 199B, as previously described herein, and entered into the kinematic model and/or algorithm so that the radial position $R(y)_{AT}$ (i.e. the radial arm position throughout the range of motion along the y axis as determined by the kinematic model or algorithm) of the arm 330A at the processing temperature is corrected from the radial position $R(Y)_{CT}$ of the arm at the calibration temperature $T_{REF}$ also as previously described herein. In general, and as will be described in greater detail, the radial positions ($R_{AT}$ and $R_{CT}$) of the arm at the processing temperature and at the calibration temperature $T_{REF}$ define a proportion or expansion factor $K_S$ that is applied in the kinematic model or algorithm establishing the radial position $R(Y)_{AT}$ of the arm 330A.

In one aspect, the controller 11091 includes a kinematic effects resolver 11091R (see FIG. 3) that is configured to resolve effects of kinematic model and/or algorithm sensitivity as a function of the change in temperature ΔT of the transport chamber 11025 and/or processing stations 11030. In one aspect the resolver 11091R is configured to determine, from the detection of the at least one edge of the center deterministic feature 401, 402, a relation between a expansion factor variance and the detection of the at least one edge by the sensor(s) 199A, 199B on the fly with the substrate transport apparatus in motion (such as in radial motion) and further resolve effects of the determined expansion factor variance on the expansion factor determining the variance of the arm. For example, the resolver 11091R is configured to resolve a relationship between a kinematically defined dimension (such as, e.g., $R_{AT}$) of the arm 330A, the expansion factor $K_S$ and the variance of the arm 330A dimensions (such as from thermal effects) as further described below. For example, the resolver 11091R may effect a factorization, by the kinematic model and/or algorithm, that relates (e.g. through the expansion or proportion factor $K_S$) the radial position $R_{AT}$ of the SCARA arm 330A at the processing temperature and the radial position $R_{CT}$ of the SCARA arm 330A at the calibration temperature $T_{REF}$, where $K_S$ may be generally expressed as:

$$K_S = \frac{R_{\Delta T}}{R_{CT}}$$

In one aspect, the expansion factor $K_S$ may be consistently applied to values for the radial position $R(Y)_{CT}$ (e.g., the radial position of the arm 330A along the Y axis at the calibration temperature $T_{REF}$, or in other words without thermal effects) of the arm 330A at the calibration temperature $T_{REF}$ to correct the radial position R of the arm 330A, such as radial position $R(Y)_{\Delta T}$ at the processing temperature or any other temperature, in the kinematic model and/or algorithm throughout the radial range of motion of the arm 330A.

In other aspects, the expansion factor $K_S$ may be determined to remove the effects of arm members with negligible contribution to thermal effects of the arm 330A, such as where the end effector 395 is thermally stable and $X_{CAT}$, $Y_{CAT}$ (see FIG. 4A) is substantially constant, as described herein. Where $K_S$ is determined to remove the effects of arm members with negligible contribution to thermal effects of the arm 330A, $K_S$ may be expressed as:

$$K_S = \frac{(R_{\Delta T} - L_{Ei})}{(R_{CT} - L_{Ei})}$$

and where the radial position R of the arm 330A is set to be the end effector center 395C (Xc, Yc), as shown in FIGS. 9, 12 and 13, $L_{Ei}$ is equal to $L_{ECi}$.

In one aspect, the resolver 11091R may be applied in the kinematic model and/or algorithm directly to the expansion factor $K_S$ to filter, or compensate, for non-linear effects of thermal changes in dimensions $L_{Ui}$, $L_{Fi}$ of the arm 330A, generated by non-linear variances and other non-linearities in the arm 330A and substrate processing system. The non-linear variances include, but are not limited to, variable expansion in each arm link (such as upper arm 330AU and forearm 330AF expanding at different rates) of the arm 330A, variable expansion of different arms 216A, 216B, 218A, 218B, 219A, 219B of a common substrate transport apparatus (such as in a frog-leg robot configuration, bi-symmetric robot configuration or where the substrate transport apparatus has multiple independent arms, see e.g. FIGS. 2A, 2C and 2E), variable temperatures to which different arm links or different arms of the substrate transport apparatus are subjected to (e.g. one portion of the arm (or a first arm) is subjected to a different temperature than another different portion of the arm (or a second arm)). An example of when one arm may be subjected to a different temperature (s) than another different arm of the substrate transport apparatus is when the substrate transport apparatus has multiple arms that are stacked one above the other such that an uppermost arm may be subjected to higher temperatures (e.g. due to thermal gradients) than a lowermost arm. Another example of when one arm of a multi-arm substrate transport apparatus may be subjected to a different temperature(s) than another different arm is when one arm is consistently used to pick a hot substrate and the other arm is consistently used to pick a cold substrate. Still a further example, is when the forearm 330AF is extend into a process module while the upper arm 330UA remains within the transport chamber such that the forearm 330AF is subjected to higher temperatures than the upper arm 330AU.

In one aspect, the resolver 11091R may be history based and configured to apply a suitable filter, such as a finite impulse filter or a running average filter that compensates for non-linear effects of thermal changes in dimensions $L_{Ui}$, $L_{Fi}$ of the arm 330A, where the thermal changes in dimensions $L_{Ui}$, $L_{Fi}$ are generated by non-linear variances in the substrate processing system and consequently the resultant non-linear effects in establishing the radial dimension $R(Y)_{\Delta T}$ of the arm 330A with the kinematic model or algorithm. In one aspect the resolver 11091R is applied directly to the expansion factor $K_S$ in both heating and cooling environments where the expansion factor $K_S(t)_i$ is determined with each pass of the arm 330A (or a predetermined portion thereof, such as the predetermined reference points/datums described herein) past the sensor(s) 199A, 199B during thermal transients. The value of the expansion factor $K_S(t)_i$ at each pass is entered into the resolver 11091R and the expansion factor $K_S(t)$ is updated after each pass and applied by controller 11091 to movements of arm 330A. The resolved expansion factor $K_S(t)$ can be expressed generally as a finite impulse filter in the form of:

$$K_S(t) = \sum_{i=1}^{n-1} a_i K_S(t-i)$$

where i=Δt between sequential arm 330A moves and n is any suitable measurement window value (such as any suitable integer value). The resolved expansion factor $K_S(t)$ can be expressed more specifically as:

$$K_S(t) = \frac{\sum (K_{s(t)} + K_{s(t-\Delta t)} + K_{s(t-2\Delta t)} + \ldots)}{N_{samples}}$$

where $N_{samples}$ is the number of times $K_S$ has been sampled.

Thus, for the range of radial motion of the arm 330A (of any given movement time (i=1, 2, 3 . . . ) after calibration at the predetermined calibration temperature $T_{REF}$), the radial dimension $R(Y)_{\Delta T}$ for that radial motion determined by the kinematic model or algorithm for the arm 330A can be expressed as:

$$R_i = G * K_S(t)(R_{CTK} - L_{Ei}) + L_{Ei}$$

where $R_{CTK}$ is the corresponding radial motion of the arm 330A determined by the kinematic model or algorithm at the predetermined calibration temperature $T_{REF}$ and G is a gain or scaling factor that may be included to compensate for a predetermined bias (such as a steady state bias) identified at respective position of the arm 330A (e.g. substrate holding stations, processing modules, etc.) Thus, $R_i$ is the radial distance R from the kinematic model compensated for thermal change effects (such as when the different links of the arm are not at a uniform steady state temperature) and applied to determine automatic wafer centering (AWC) and substrate holding/processing station location as previously described and otherwise known.

In one aspect, the expansion factor $K_S$ may have a configurable threshold where the resolver 11091R of controller 11091 is configured to continually apply the running average filter when $K_S$ is above a predetermined threshold value. When $K_S$ is below the predetermined threshold value the error in arm 330A motions due to thermal expansion of the arm 330A upper arm and forearm links 330AU, 330AF may be considered steady state and the running average filter may not be applied to the expansion factor $K_S$ such that the expansion factor $K_S$ is applied to the arm motions, in the kinematic model or algorithm, by controller 11091 substantially without filtering. In one aspect the resolver 11091R may be configured to commence and/or apply the resolved expansion factor $K_S(t)$ based on an initial threshold $K_S(t-i)$ value that is set as desired (e.g. the initial threshold value may be $K_S$=1.0001).

The resolver 11091R for the sensitivity of the kinematic model or algorithm may be configured to apply a backfill value $K_S(B)$ for periods of time that the arm 330A is idle. For example, the resolver 11091R may use the filtered expansion value $K_S(t)$ of one or more prior pick/place movement(s) of the arm 330A (e.g. a prior run of arm movements before the arm became idle) as an initial expansion factor $K_S(B)$ value in a non-filtered measurement window. In one aspect, the backfill value $K_S(B)$ may depend on an idle time period between the last run of arm 330A movements and the restarting of the arm 330A movements. In one aspect, any suitable backfill $K_S(B)$ value may be used, including a predetermined decay function based on the idle time period. The resolver may be configured so that the resolved expansion factor $K_S(t)$ may be determined for each arm separately, for each AWC sensor separately (e.g. for each sensor 199A, 199B or each sensor group 199A1-199A7 corresponding to a respective substrate holding/processing station 11030, see FIG. 1B), separately for thermal growth of one or more arms 330A and separately for thermal contraction of one or more arms 330A.

Figure 14:
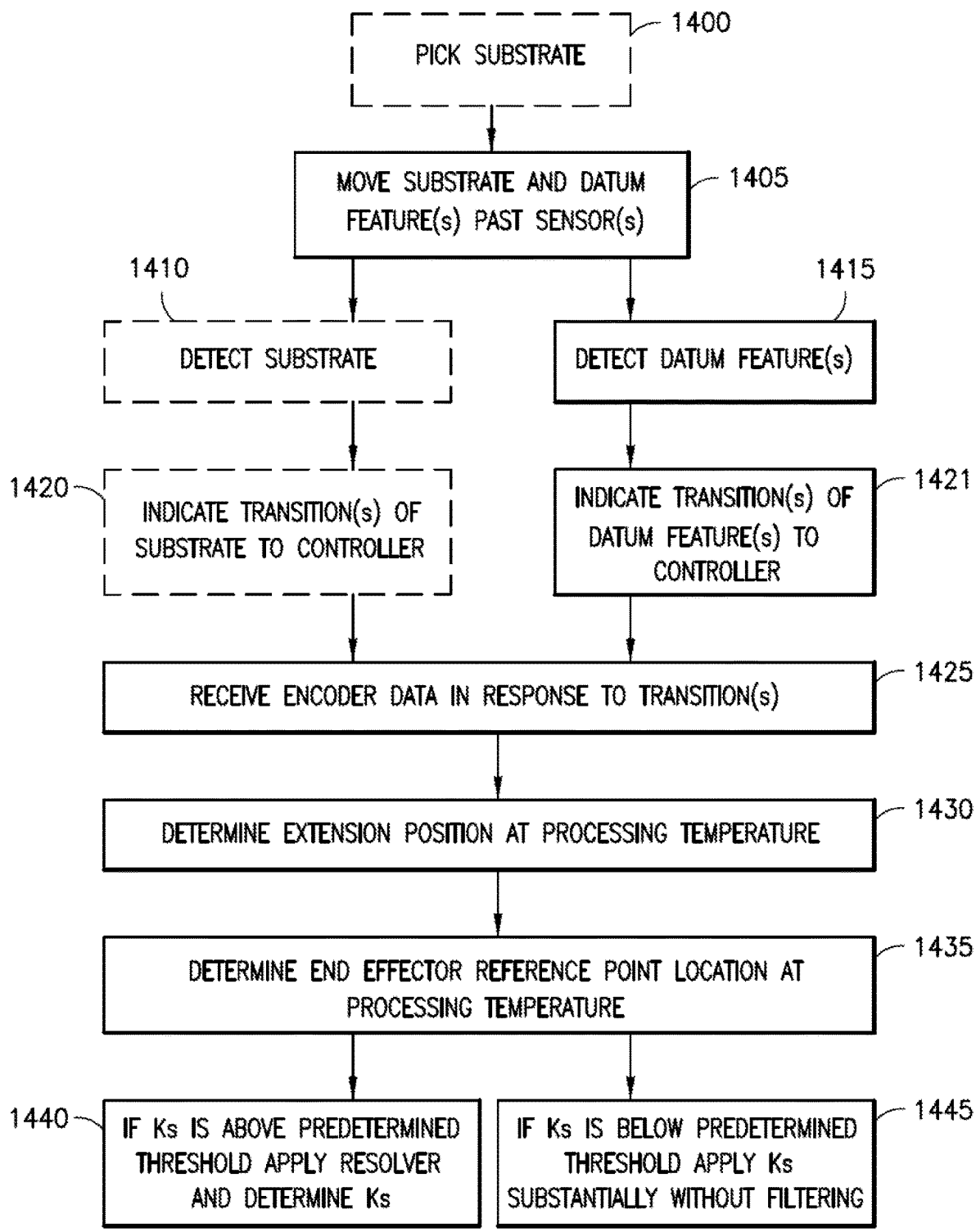
FIG. 14 is a flow diagram in accordance with aspects of the disclosed embodiment.

As an example of the implementation of the resolved and unresolved expansion factor, referring to FIG. 3, in one aspect the substrate transport robot 330 picks a substrate S from any suitable substrate holding location with the self-centering end effector 395 (FIG. 14, Block 1400). As noted above, in one aspect thermal compensation is performed without the end effector holding a substrate S (e.g. block 1400 of FIG. 14 is optional) and may be performed prior to or during substrate processing. In other aspects, thermal compensation may be performed on the fly while the substrate transport robot 330 is transporting one or more substrates S on the end effector 395. The substrate transport robot 330 moves within, for example, a transport chamber or other controlled environment to a substrate holding station 315 location. As the substrate transport robot 330 moves towards the substrate holding station 315 of the substrate process module 325 (e.g. to place the substrate S or to move the datum features 401, 402 past the sensors 199A, 199B), the substrate S and/or end effector 395 (e.g. datum features 401, 402) are moved past one or more of the sensors 199A, 199B (FIG. 14, Block 1405). Referring also to FIG. 4A, in aspects where the end effector 395 is holding a substrate, one or more of the sensors 199A, 199B detects on the fly, for example, the leading and trailing edges of the substrate S at the transitions 421-424 (FIG. 14, Block 1410). In one aspect, one or more of the sensors 199A, 199B detects on the fly, for example, in addition to or in lieu of the detection of transitions 421-424 (e.g. detection of the substrate in Block 1410 of FIG. 14 is in one aspect optional), the leading and trailing edges of one or more of the datum features 401, 402 at transitions 425-428 (FIG. 14, Block 1415). At each transition 421-428 the one or more sensors 199A, 199B sends a signal to the controller 11091 indicating the respective transition 421-428 occurred (FIG. 14, Blocks 1420 and 1421 noting that Block 1420 occurs only when the end effector is holding a substrate) and in response to this signal the encoders of the substrate transport robot 330 send signals to the controller 11091 indicating the position of the substrate transport robot 330 (e.g. the controller 11091 receives encoder data in response to the transition detections) (FIG. 14, Block 1425). This simultaneously informs both end effector center position thermal variance effects in the arm dimensions. The controller 11091 is configured to identify a variance in a dimension of the substrate transport robot 330 arm 330A based on the encoder data and determine the expansion factor $K_S$ relating the variance in the dimension to a dimension of the arm 330A. In one aspect the thermal compensation or expansion factor $K_S$ of the end effector reference position, which in one aspect is the center 395C of the end effector 395, at the processing temperature (e.g. at $\Delta T$) is determined based on, for example, the radial extension position $R_{AT}$ of the substrate transport robot 330 at one or more of the transitions 425-428, such as for example, transition 428. For example, $R_{AT}$ is determined (FIG. 14, Block 1430) by the controller 11091 when sensor 119A detects transition 428 and the encoders 331 of the substrate transport apparatus 330 send position signals to the controller 11091 indicating the position of the substrate transport apparatus 330. As noted above, $R_{AT}$ corresponds or otherwise reflects the dimensional changes of the substrate transport robot 330 arm 330A from the sensor 199A to the shoulder axis Z due to, for example, thermal expansion or contraction. As such, the location $X_{CAT}$, $Y_{CAT}$ of the end effector reference point 395C or $R_{AT}$ at the processing temperature is determined, e.g. substantially simultaneously with substrate processing, (FIG. 14, Block 1435) as described above. The controller 11091 also compares the expansion factor $K_S$ with the predetermined threshold and if the value of the expansion factor $K_S$ is above the predetermined threshold the running average filter, described above, is applied directly to the expansion factor $K_S$ when determining arm 330A motions in the manner described above (FIG. 14, Block 1440). If the value of $K_S$ is below the predetermined threshold value the expansion factor $K_S$ is applied when determining the arm 330A motions, substantially without filtering.

Another aspect of the system and method described herein provides an approach that estimates the temperatures and respective thermal expansions of each of the individual manipulator/arm links of the transport robots described herein as well as takes the non-linear effects of the transport robot arm kinematics into account. As an example, this approach explicitly corrects the transport robot arm kinematic equations to report a more accurate transport robot arm position. Further, once the transport robot reaches a steady state the approach, described in greater detail below, reports similar results to current implementations.

As noted above, in the exemplary aspects of the disclosed embodiment, referring to FIGS. 12 and 13, the controller 11091 is configured to recognize the non-linear effects to the thermal effects relation model from:

the $K_S$ parameter which depends on the link angle (e.g. $\varepsilon_i$, $\beta_i$ as shown in FIG. 12), and the upper arm and forearm temperature may be different (see FIG. 15) and can change over time at a different rate than $K_S$ is calculated.

Figure 15:
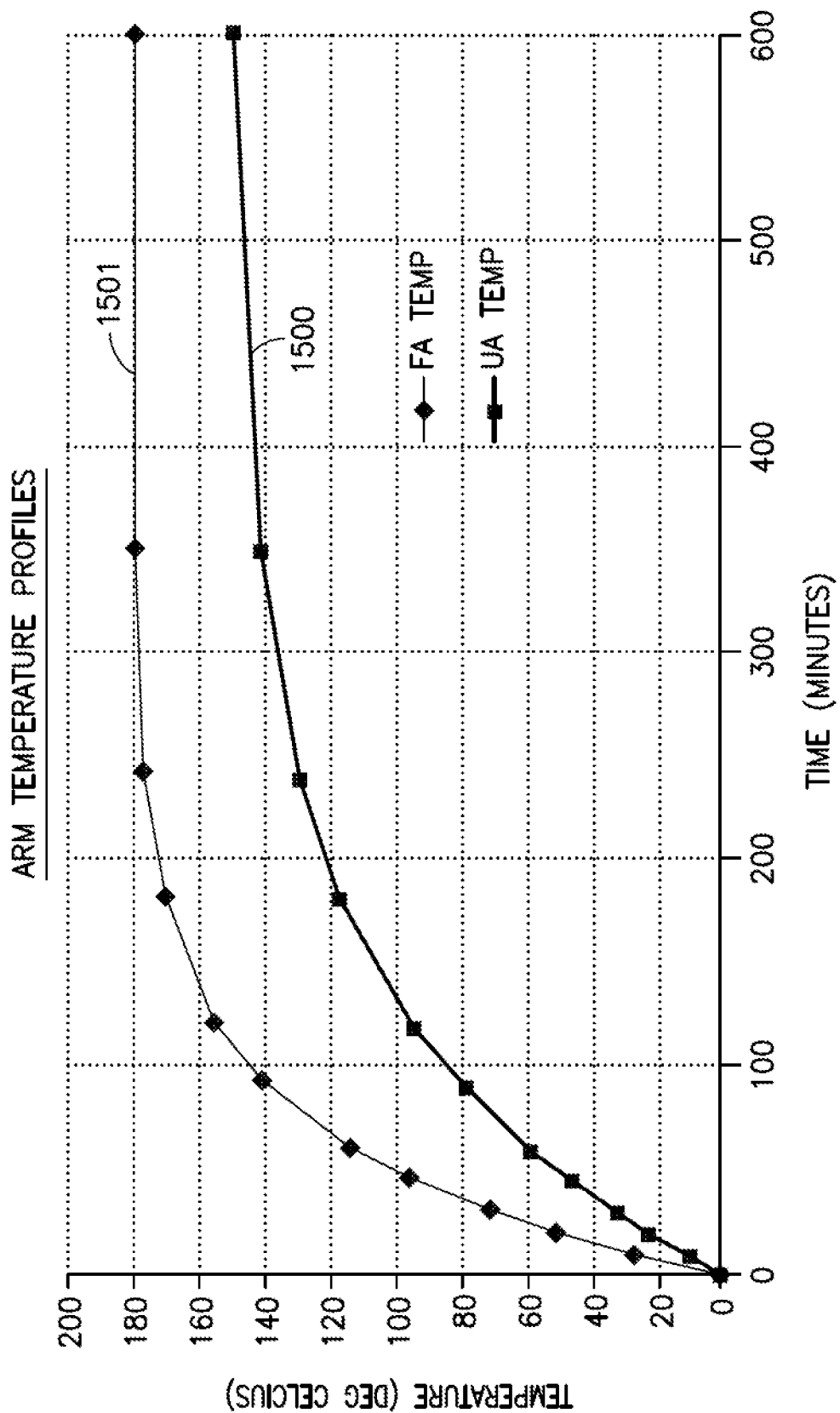
FIG. 15 is an exemplary graph illustrating substrate processing apparatus arm link thermal gradients over time in accordance with aspects of the disclosed embodiment.

Referring also to FIG. 15 a representative upper arm temperature profile 1500 versus time and a representative forearm temperature profile 1501 versus time are shown. The representative upper arm and forearm temperature profiles 1500, 1501 are observed on an exemplary customer application with hot process modules (e.g. the process modules are at operating temperatures). As can be seen in FIG. 15, even when the transport robot reaches a steady state (e.g. thermally), there is a temperature gradient between the upper arm and forearm of the transfer arm (such as e.g. transfer arm 330A illustrated in FIG. 12).

Figure 16:
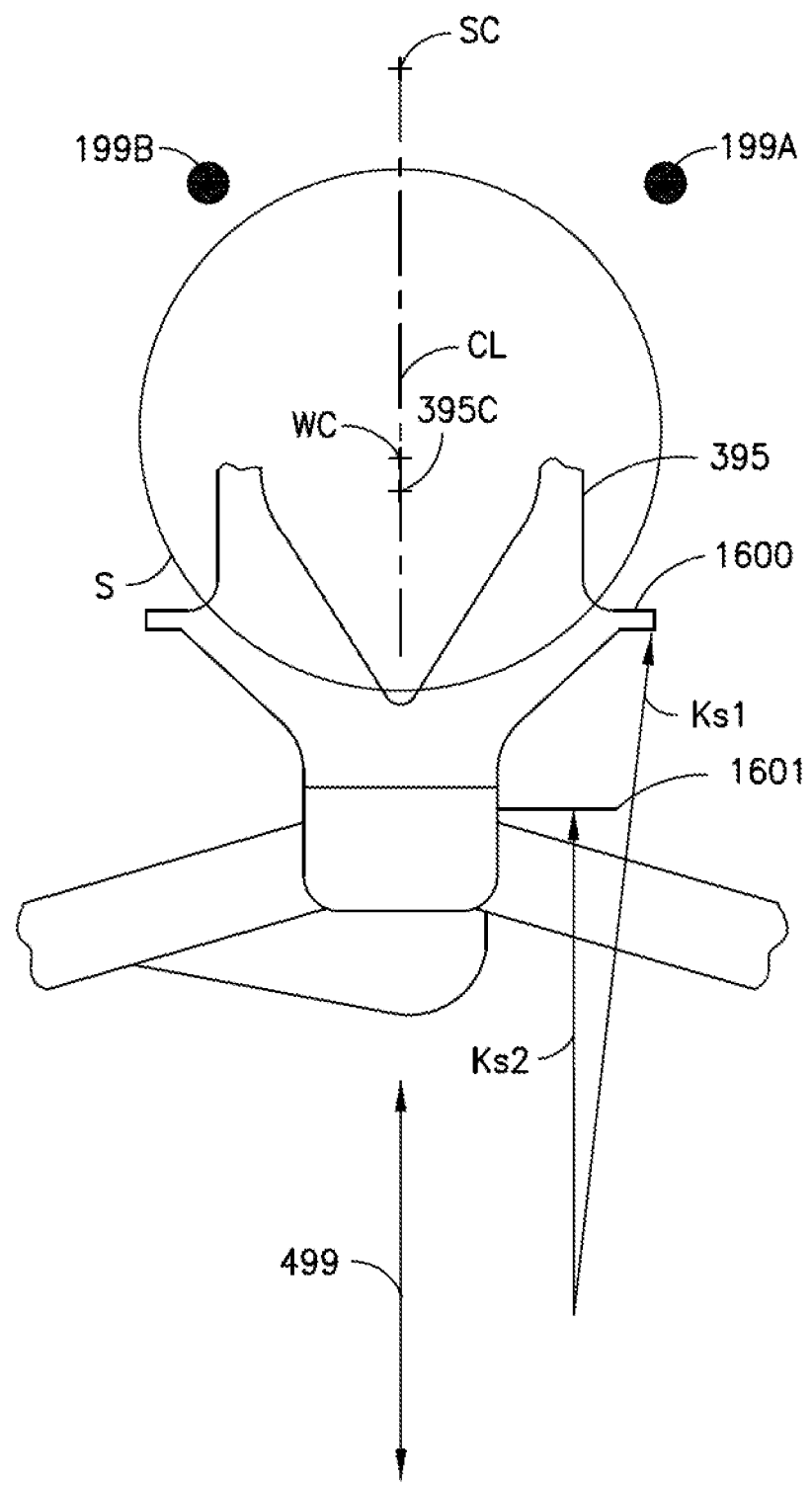
FIG. 16 is a schematic illustration of a portion of a substrate processing apparatus in accordance with aspects of the disclosed embodiment.

FIG. 16 illustrates another exemplary arrangement, in accordance with aspects of the disclosed embodiment, of an end effector 395 having, for example, two datum features 1600, 1601 (similar to those end effectors described above) that are located at distinct kinematic locations on the end effector 395. As noted above, the datum features 1600, 1601 have a representative configuration and are shown on one side of the end effector 395 for exemplary purposes however, in other aspects datum features may be disposed on opposite sides of the end effector 395 (as described above) for averaging the $K_S$ values as described above. Also, in other aspects, one or both of the datum features 1600, 1601 may be a center position Xc, Yc determining feature or be configured to determine any other suitable positon of the transfer arm (as described above). In other aspects, the datum features 1600, 1601 may be provided with other datum features that determine, e.g., the center position Xc, Yc (or other position of the transfer arm). In one aspect, the datum features 1600, 1601 are displaced linearly along a direction 499 of radial extension/retraction (e.g. a predetermined extension dimension as generated by the kinematic model, see FIGS. 15 and 17) so that the corresponding $K_S$ values ($K_{S1}$, $K_{S2}$) for each datum feature 1600, 1601 effects discriminating between the non-linear effects contributions between the upper arm and forearm links noted above for a given temperature setting. The respective $K_S$ values, such as $K_{S1}$, $K_{S2}$, respectively associated with the sensor 199A, 119B detection of datum feature 1600, 1601 on the same pass by the sensor 199A, 199B (e.g. in a common extension or retraction move past the sensor(s)) are substantially different due to, for example, the different kinematics for each datum feature 1600, 1601 when each datum feature 1600, 1601 is detected. Accordingly, the respective $K_S$ values, such as $K_{S1}$, $K_{S2}$, can thus be used to provide an indication of the temperature gradients between the upper arm and the forearm links. As a result, the transport robot kinematics can be corrected to report the end effector 395 location with increased accuracy, compared to conventional thermal compensation algorithms.

Figure 17:
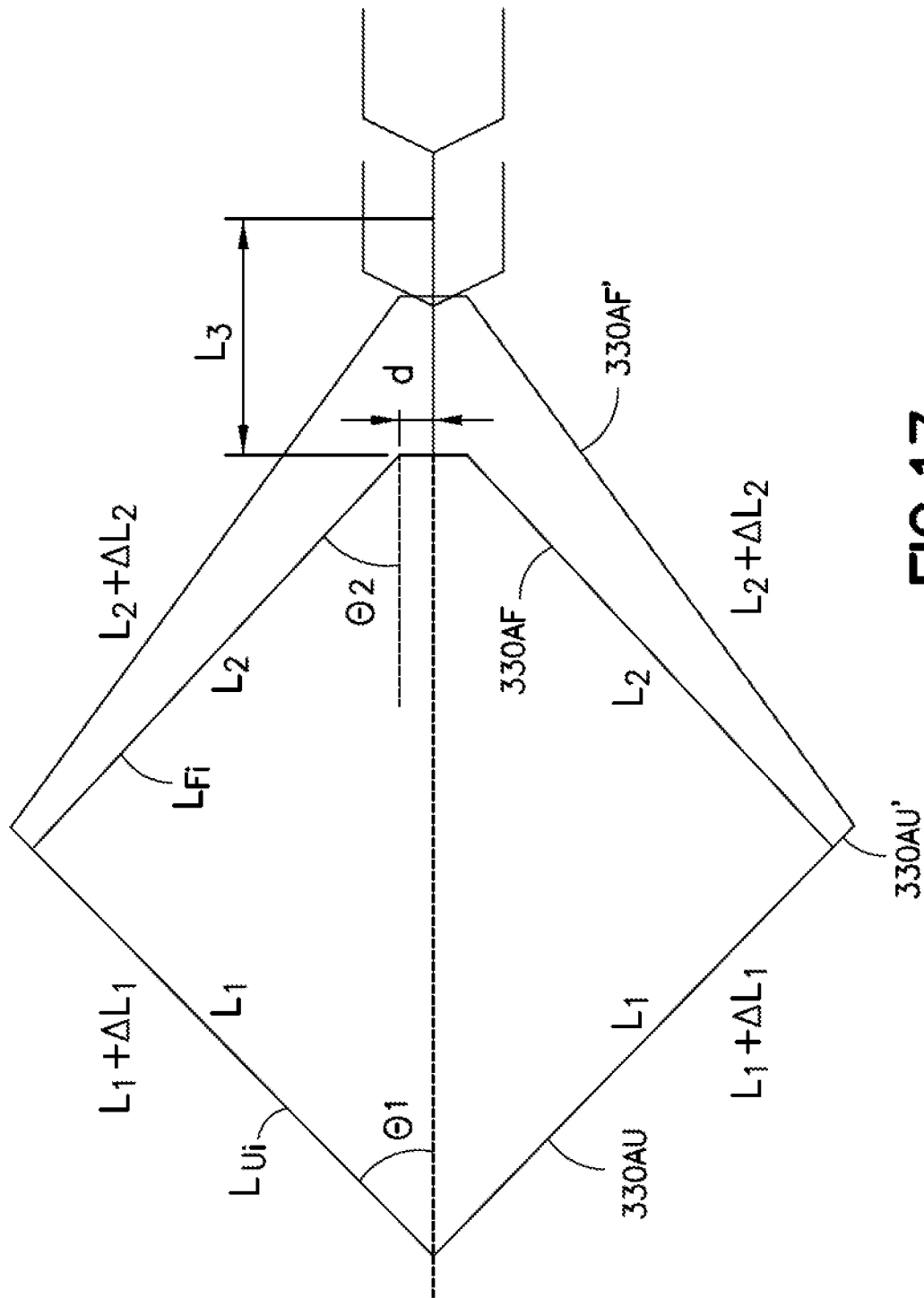
FIG. 17 is a schematic illustration of a portion of a substrate processing apparatus in accordance with aspects of the disclosed embodiment.

In one aspect, referring to FIGS. 16 and 17 (which illustrates a frog leg arm configuration for exemplary purposes but it should be understood that the aspects of the disclosed embodiment apply equally to SCARA arm configurations, bi-symmetrical arm configurations and the other arm configurations described above such as, e.g., with respect to FIGS. 2A-2E) the relationship between $K_{S1}$ and $K_{S2}$, otherwise expressed as $K_{S1}:K_{S2}$ (where $K_{S1}$ and $K_{S2}$ are respective $K_S$ values associated with each datum feature 1600, 1601 as previously described above) is dependent on effects of respective thermal expansion/contraction of the upper arm link 330AU (see also $L_{Ui}$), and of the forearm link 330AF (see also $L_{Fi}$). Any difference between the thermal expansion/contraction of the upper arm link $L_{Ui}$ and that of the forearm link $L_{Fi}$, and correspondingly any difference in temperature between the upper arm link and forearm link causing such expansion/contraction difference, will be reflected and identified from the corresponding change in the $K_{S1}$:$K_{S2}$ relation. Thus, as the arm 330A is cycled (e.g. extended and/or retracted) in different passes during thermal transients, the respective relative thermal expansion values $K_{S1(i)}$ and $K_{S2(i)}$ associated with the corresponding datum feature 1600, 1601, at each pass (i), when related to each other are determinative of the thermal difference $\Delta T_{U/Ai}$ between the upper arm link temperature $T_{Ui}$ and the forearm link temperature $T_{Fi}$ for the given pass (i). It is noted that the respective arm temperatures $T_{Ui}$, $T_{Fi}$ may be considered averaged for the corresponding length L1, L2 of the respective arm link $L_{Ui}$, $L_{Fi}$. In other aspects, the respective arm temperatures $T_{Ui}$, $T_{Fi}$ may be associated with a predetermined location somewhere on the corresponding arm (such as at an end point of the arm link, at the middle of the arm link or at any other location or locations along the length L1, L2 of the respective arm link $L_{Ui}$, $L_{Fi}$). It is also noted that though the relation between the respective arm temperatures $T_{Ui}$, $T_{Fi}$ is described as a difference, any suitable relation between the respective arm temperatures $T_{Ui}$, $T_{Fi}$ may be used (e.g. $T_{Ui}$: $T_{Fi}$).

In accordance with another aspect of the disclosed embodiment, the unique relationship between the different respective arm temperatures ($T_{Ui}$, $T_{Fi}$), of the upper arm link $L_{Ui}$ and the forearm link $L_{Fi}$, and the different respective expansion factors $K_{S11}$, $K_{S12}$ (associated with each datum feature 1600, 1601), may be expressed in a look up table, or any suitable algorithm that is stored in controller 11091 (see e.g. FIGS. 1 and 3). The relationship embodied by the look up table/algorithm may be identified empirically, or by suitable modeling, or a combination thereof.

Figure 19:
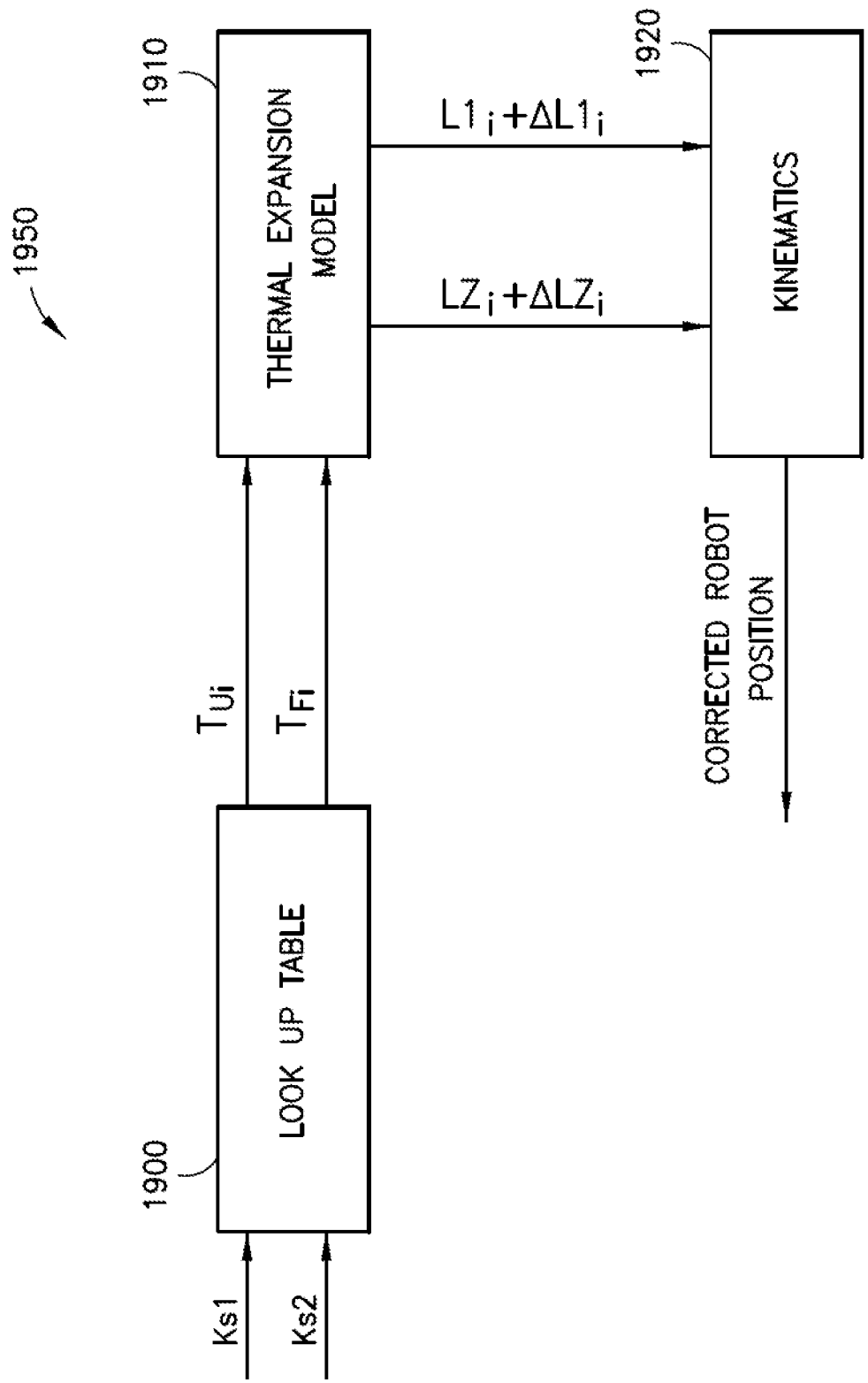
FIG. 19 is an exemplary block diagram of a position calculation in accordance with aspects of the disclosed embodiment.
Figure 20:
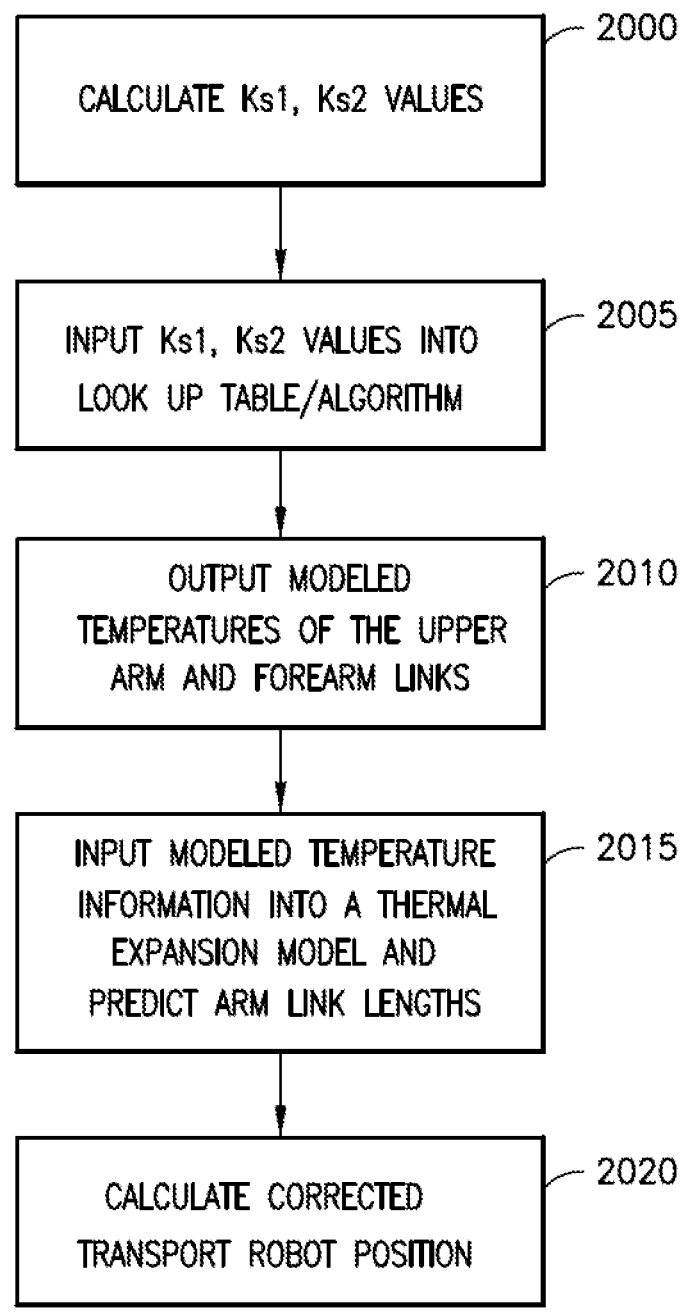
FIG. 20 is a flow diagram in accordance with aspects of the disclosed embodiment.

Referring also to FIG. 19, a schematic diagram is shown illustrating a non-linear variance resolver 1950 (which may part of controller 11091) for the determination of a corrected robot position in accordance with aspects of the disclosed embodiment. In accordance with an aspect of the disclosed embodiment, values for $K_{S1}$ and $K_{S2}$ are calculated as described above with respect to, e.g., FIGS. 12 and 13 for each of the datum features 1600, 1601 (FIG. 20, Block 2000). In one aspect, the values for $K_{S1}$ and $K_{S2}$ are input into, for example, a look up table or any suitable algorithm 1900 (FIG. 20, Block 2005) that outputs a modeled temperature $T_{Ui}$, $T_{Fi}$ respectively of the upper arm links 330AU, $L_{Ui}$ and the forearm links 330AF, $L_{Fi}$ (FIG. 20, Block 2010) where the upper arm links 330AU, $L_{Ui}$ and the forearm links 330AF, $L_{Fi}$ have respective link lengths L1i, L2i at the predetermined calibration temperature. In one aspect, the modeled temperature information is input into a thermal expansion model 1910 that predicts the expanded (or contracted) link lengths (e.g. L1i+$\Delta$L1i and L2i+$\Delta$L2i, denoted by links 330AU' and 330AF' in FIG. 17, due to thermal effects) (FIG. 20, Block 2015) and the corrected transport robot position is calculated using a kinematic model 1920 that is corrected for the expanded link lengths L1+$\Delta$L1, L2+$\Delta$L2 (FIG. 20, Block 2020), noting that the length L3 of the end effector 395 is substantially constant as described above.

Figure 21:
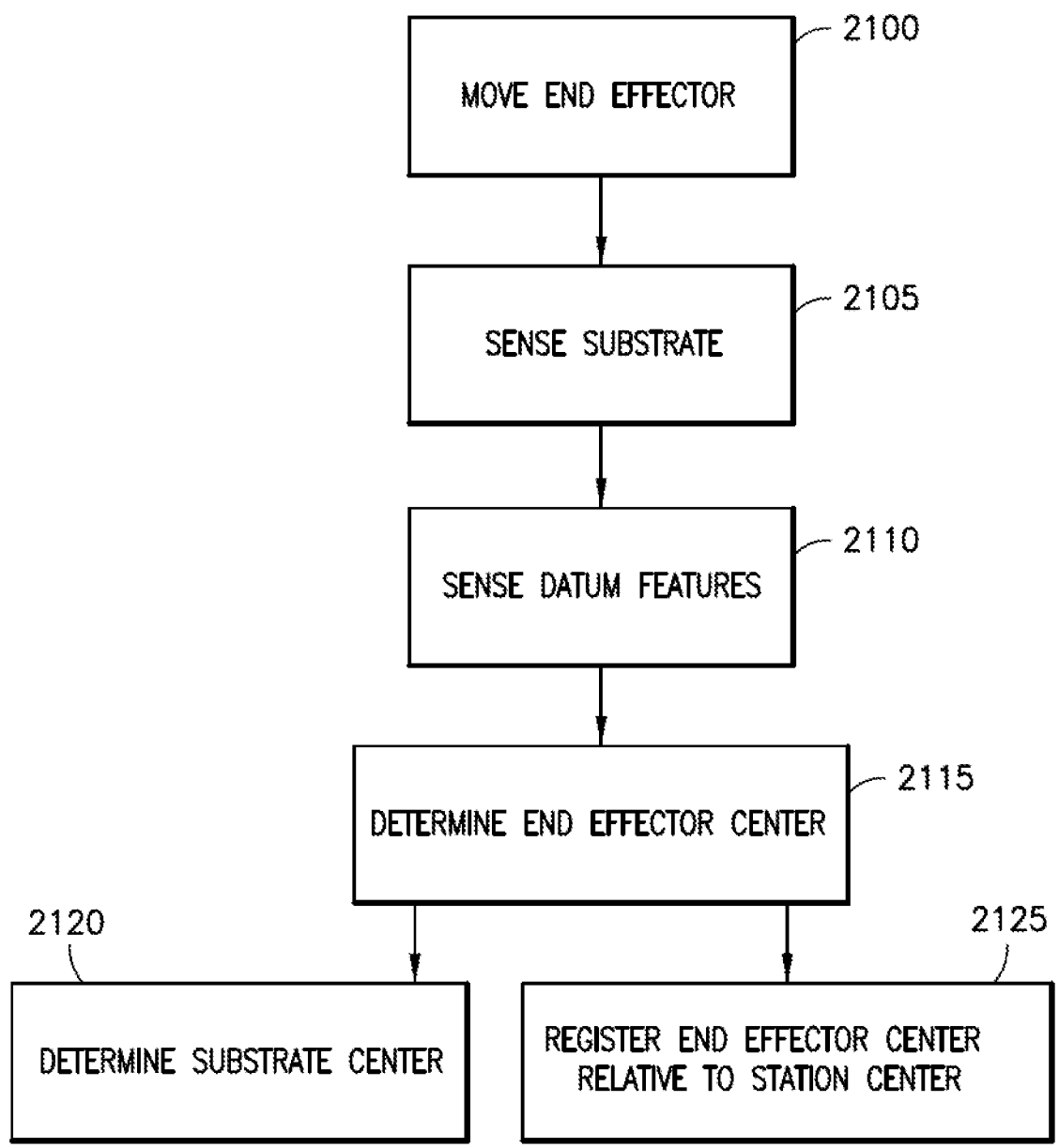
FIG. 21 is a flow diagram in accordance with aspects of the disclosed embodiment.

In one aspect of the disclosed embodiment, in a manner similar to that described above, referring again to FIG. 16, the datum features 1600, 1601 provide for the center determination of a substrate S (see FIG. 4A) and the center determination of the end effector 395 (e.g. without a teaching wafer for registering the end effector center relative to the station center—the station center SC is taught to the substrate transport apparatus 330) in one pass of the substrate/end effector by the sensors 199A, 199B. For example, as described above, the sensors 199A, 199B (see also FIG. 4A—which are opposingly arranged on opposite sides of the end effector centerline CL but need not be symmetrically arranged) have a predetermined spatial relationship with the station center SC (see also FIG. 4) so that sensing the datum features, such as datum features 1600, 1601, serve to determine the end effector center or reference position 395C, the substrate/wafer center WC (see also FIG. 4) and learn the station center SC. For example, the teaching of a station center SC (and the wafer center determination) will be described with reference the datum features 1600, 1601 of the end effector 395, but it should be understood that the station center SC can be taught in a similar manner using substrate/wafer S. In one aspect the end effector 395 is moved (FIG. 21, Block 2100) to move the substrate S and/or the datum features 1600, 1601 towards the sensors 199A, 199B. The substrate S is sensed with the sensors (FIG. 21, Block 2105) and the datum features 1600, 1601 are sensed with the sensors (FIG. 21, Block 2110) and the determination of the substrate center WC and the position of the substrate transport apparatus (i.e. reference position 395C) are determined (FIG. 21, Blocks 2115 and 2120) in any suitable manner, such as that described above (e.g. such as by using circle VRW1 as described herein). As may be realized, because the location of the sensors 199A, 199B relative to the station center SC is known and because the substrate center WC is substantially coincident with the end effector center reference point 395C the location of the substrate holding station is also known relative to the end effector center reference point 395C and is taught to the substrate transport apparatus where sensing the substrate S and/or datum features 1600, 1601 effects registration of the end effector center reference point 395C (i.e. the position of the substrate transport apparatus) relative to the station center in one pass (or step) of the end effector by the sensors 199A, 199B (FIG. 21, Block 2125).

Figure 22:
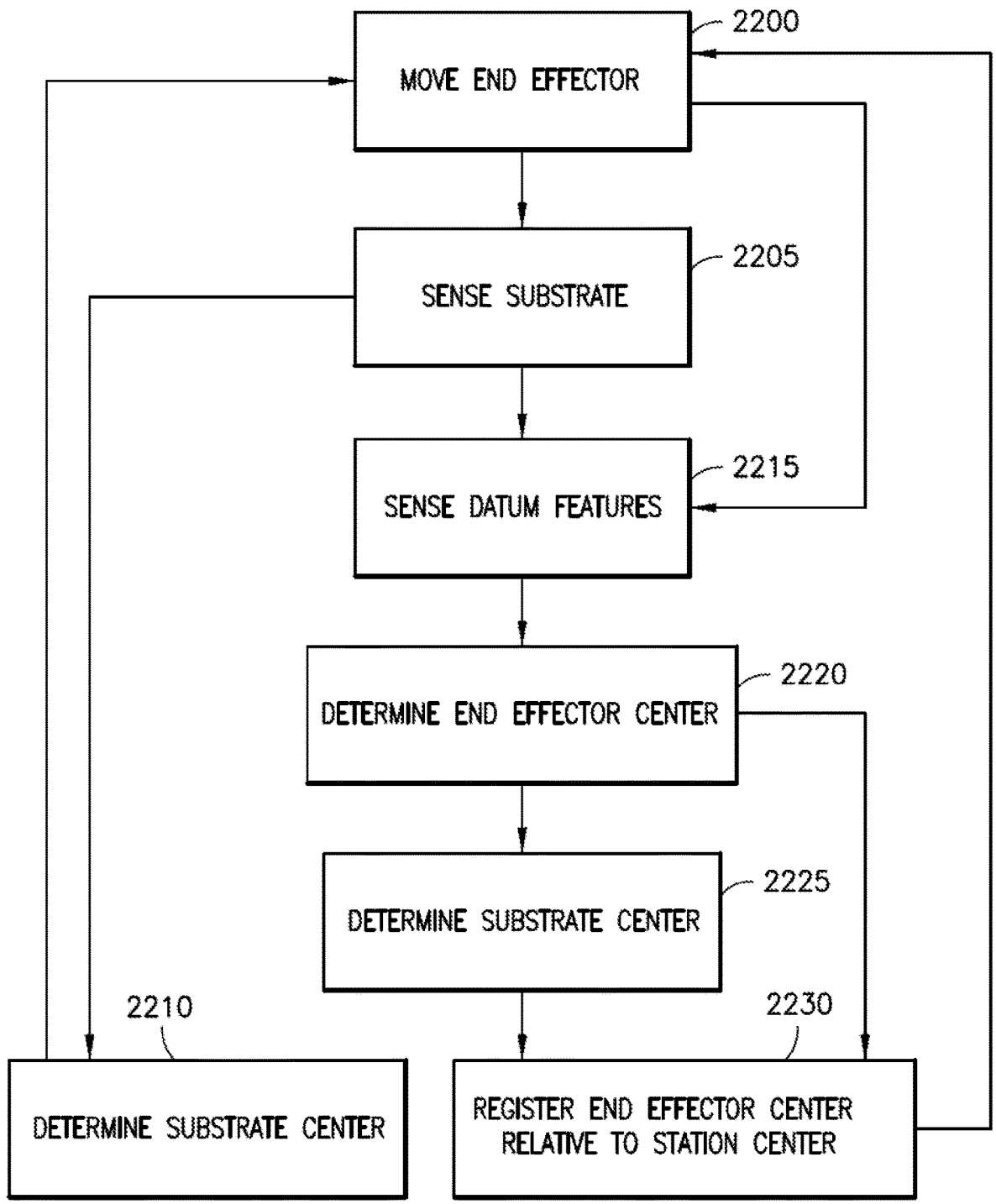
FIG. 22 is a flow diagram in accordance with aspects of the disclosed embodiment.

In another aspect, the registration of the end effector center 395C with the station center SC and the determination of the substrate center WC may be determined with one pass or with multiple passes. For example, still referring to FIG. 16, where both the substrate center 395C and the station location SC is to be taught the end effector 395 is moved (FIG. 22, Block 2200) to move the substrate S and/or the datum features 1600, 1601 towards the sensors 199A, 199B. The substrate S is sensed with the sensors (FIG. 22, Block 2205) and the datum features 1600, 1601 are sensed with the sensors (FIG. 22, Block 2215) and the determination of the substrate center WC and the position of the substrate transport apparatus (i.e. reference position 395C) are determined (FIG. 22, Blocks 2220 and 2225) in any suitable manner, such as that described above (e.g. such as by using circle VRW1 as described herein). The registration of the end effector center reference point 395C relative to the station center SC is effected in the manner described above (FIG. 22, Block 2230).

Where only the substrate center 395C is to be determined the end effector is moved (FIG. 22, Block 2200) so that the substrate is moved towards the sensors 199A, 199B and the substrate is sensed (FIG. 22, Block 2205) as described above. The center of the substrate is determined (FIG. 22, Block 2210) so that the substrate may be placed at the station location SC. In one aspect, any suitable number of substrates may be transferred to and from the station location SC before the station location SC is taught again (with or without a substrate held on the end effector 395). For example, the station location SC may be taught after the placement of 10 substrates, 20 substrates or any other suitable number of substrates. In other aspects, the station location SC may be taught after at any suitable predetermined time intervals (e.g. minutes, 60 minutes or any other suitable time interval). The substrate station SC may be taught by moving the end effector towards the sensors 199A, 199B (FIG. 22, Block 2200) so that the datum features 1600, 1601 are sensed (FIG. 22, Block 2215). The end effector center 395C is determined (FIG. 22, Block 2220) in the manner described above and the end effector center is registered with the station center SC (FIG. 22, Block 2230) in the manner described above. If the end effector is holding a substrate while the station center SC is taught the center of the substrate WC may be determined in the same pass of the end effector by the sensors 199A, 199B (e.g. in one pass) or in a second pass of the end effector past the sensors 199A, 199B such that the substrate center WC and the station location SC are taught on different passes.

Figure 18:
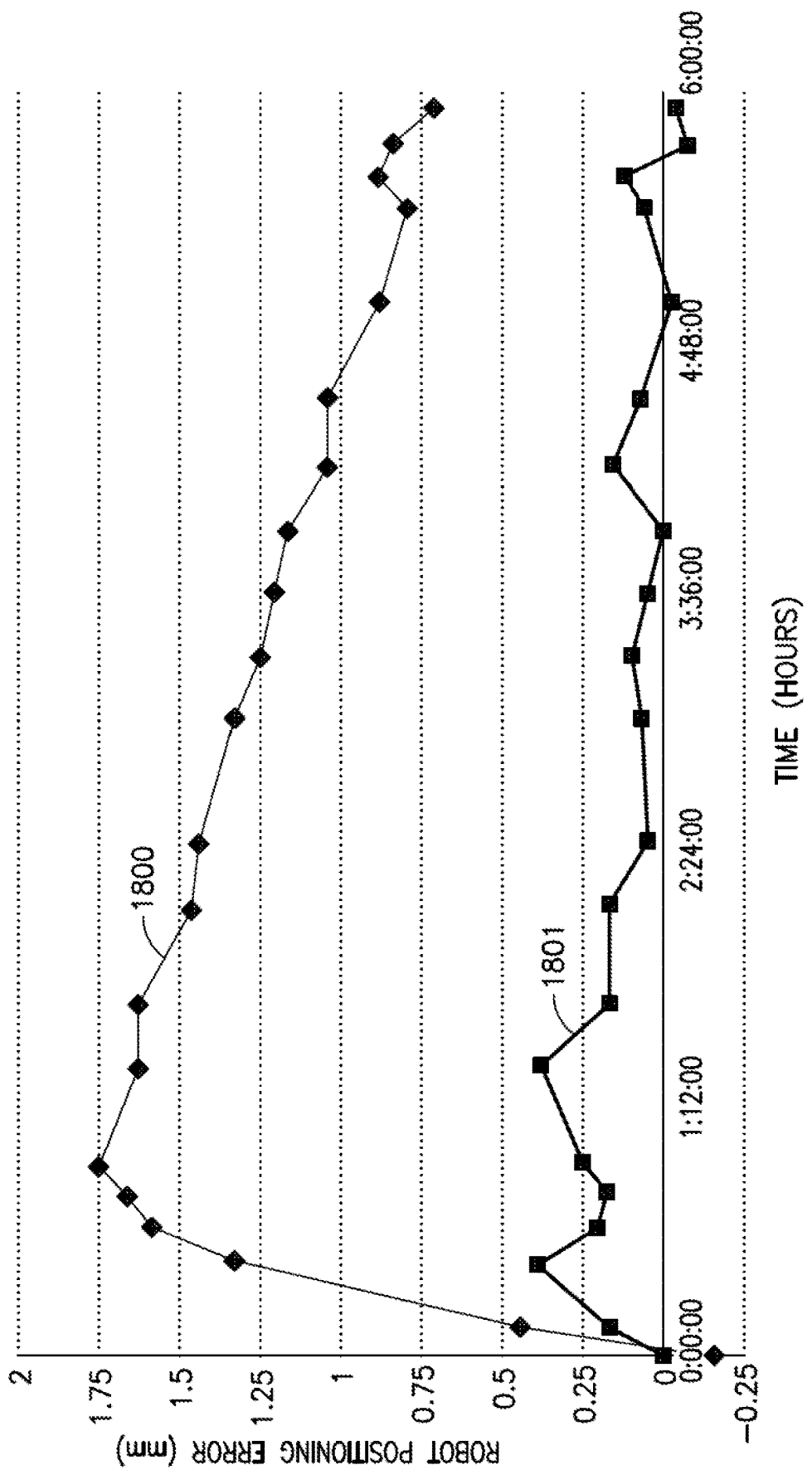
FIG. 18 is an exemplary graph illustrating substrate processing apparatus positon compensation data in accordance with aspects of the disclosed embodiment.

Referring also to FIG. 18, an exemplary graph illustrating a comparison between the thermal compensation 1801 for the transfer arm (such as the transfer arms described herein) according to the aspects of the disclosed embodiment and the thermal compensation 1800 for the transfer arm according to conventional prior art thermal compensation algorithms. In the exemplary graph of FIG. 18, the positioning error of the transfer arm is plotted against time where it can be seen that the thermal compensation in accordance with aspects of the disclosed embodiment provide for increased position accuracy when compared to the conventional thermal compensation algorithms.

Figure 23:
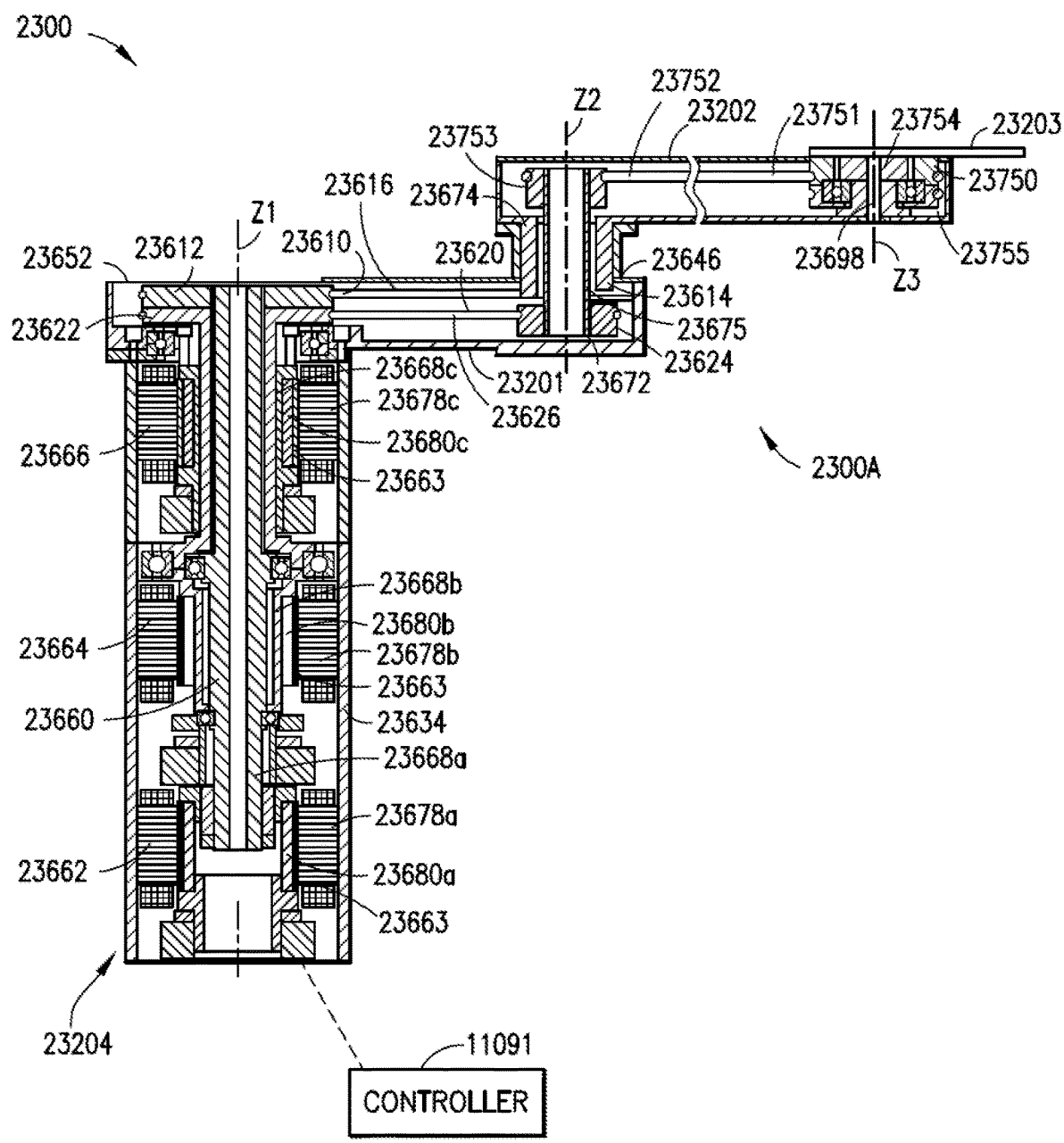
FIG. 23 is a schematic illustration of a portion of a substrate processing apparatus in accordance with aspects of the disclosed embodiment.

Referring to FIG. 23 in one aspect of the disclosed embodiment, thermal compensation of the transport arm is provided in a manner similar to that described above where discrete effects of the change in length as a function of temperature (e.g. $L_i f(\Delta T_i)$) are resolved/determined for each arm link of a transport robot due to different temperatures of each arm link, both during transients as the arm comes up to temperature and once the arm reaches a steady state temperature condition. This aspect of the disclosed embodiment is described with respect to determining and compensating for thermal variance of a transport apparatus 2300 having a SCARA arm 2300A however, this aspect of the disclosed embodiment is equally applicable to any suitable transport arm, such as those described above and including but not limited to Leap Frog arm configurations, Bi-symmetric arm configurations and articulated wrist configurations. Generally the transport apparatus 2300 includes the SCARA arm 2300A which has an upper arm 23201, a forearm 23202, a substrate holder 23203, and drive section 23204. A controller 11091 may be connected to the transport apparatus 2300 to move the arm sections of the SCARA arm 2300A as desired. In other aspects, the arm assembly may have any other desired general SCARA configuration. For example, the assembly may have multiple forearms and/or multiple substrate holders.

The substrate holder 23203 is rotatably connected to the forearm 23202 by shaft assembly 23754 at a wrist 23755 of the transport apparatus 2300. Substrate holder 23203 may be rotatably connected by support shaft 23698 to the forearm 23202. In one aspect, the substrate holder 23203 may be a forked end effector. The substrate holder 23203 may have active mechanical or passive edge gripping. In other aspects, the substrate holder 23202 may be a paddle end effector with a vacuum chuck. The forearm 23202 is rotatably connected by a coaxial shaft assembly 23675 to the upper arm 23201 at elbow 23646 of the transport apparatus 2300. The substrate holder 23203 has a predetermined center where the end effector is configured to hold a substrate so that the center of the substrate is coincident with the predetermined center of the end effector for transporting the substrate within a substrate processing apparatus such as those described herein. The upper arm 23201 is rotatably connected at the shoulder 23652 to drive section 23204. In this aspect the upper arm 23201 and the forearm 23202 have equal lengths but in other aspects, the upper arm 23201, for example, may be shorter in length than forearm 23202 or vice versa.

In the aspect shown, drive section 23204 may have an outer housing 23634H which houses a coaxial shaft assembly 23660, and three motors 23662, 23664, 23666. In other aspects, the drive section could have more or fewer than three motors. The drive shaft assembly 23660 has three drive shafts 23668a, 23668b, 23668c. In other aspects, more or fewer than three drive shafts could be provided. The first motor 23662 comprises a stator 23678a and a rotor 23680a connected to the inner shaft 23668a. The second motor 23662 comprises a stator 23678b and a rotor 23680b connected to the middle shaft 23668b. The third motor 23666 comprises a stator 23678c and a rotor 23680c connected to the outer shaft 23668c. The three stators 23678a, 23678b, 23678c are stationarily attached to the housing 23634H at different vertical heights or locations along the housing. In this aspect the first stator 23678a is the bottom stator, the second stator 23678b is the middle stator and the third stator 23678c is the top stator. Each stator generally comprises an electromagnetic coil. The three shafts 23668a, 23668b, and 23668c are arranged as coaxial shafts. The three rotors 23680a, 23680b, 23680c are preferably comprised of permanent magnets, but may alternatively comprise a magnetic induction rotor which does not have permanent magnets. Sleeves 23663 are located between the rotor 23680 and the stators 23678 to allow the transport apparatus 2300 to be useable in a vacuum environment with the drive shaft assembly 23660 being located in a vacuum environment and the stators 23678 being located outside of the vacuum environment. However, the sleeves 23663 need not be provided if the transport apparatus 2300 is only intended for use in an atmospheric environment.

The first shaft 23668a is the inner shaft and extends from the bottom stator 23678a. The inner shaft has the first rotor 23680a aligned with the bottom stator 23678a. The middle shaft 23668b extends upward from the middle stator 23678b. The middle shaft has the second rotor 23680b aligned with the second stator 23678b. The outer shaft 23668c extends upward from the top stator 23678c. The outer shaft has the third rotor 23680c aligned with the upper stator 23678c. Various bearings are provided about the shafts 23668 and the housing 23634H to allow each shaft to be independently rotatable relative to each other and the housing 23634H. Each shaft 23668 may be provided with a suitable position sensor to signal the controller 11091 of the rotational position of the shafts 23668 relative to each other and/or relative to the housing 23634H. Any suitable sensor could be used, such as an optical or induction sensor.

The outer shaft 23668c is fixedly connected to the upper arm 23201 so that shaft 23668c and upper arm 23201 rotate together as a unit about axis Z1. The middle shaft 23668b is connected to a first transmission 23620 in the upper arm 23201 and the inner shaft 23668a is connected to a second transmission 23610 in the upper arm 23201 as shown in FIG. 23. The first transmission 23620 preferably comprises a drive pulley 23622, an idler pulley 23624 and drive cables or belts 23626. The drive pulley 23622 is fixedly mounted to the top of the middle shaft 23668b and is connected by drive belt 23626 to the idler pulley 23624. The idler pulley 23624 is fixedly mounted to the bottom of the inner shaft 23672 of coaxial shaft assembly 23675 connecting the forearm 23202 to the upper arm 23201. The second transmission 23610 in the upper arm 23201 preferably comprises a drive pulley 23612, an idler pulley 23614 and drive belts or cables 23616. Drive pulley 23612 is fixedly mounted to the top of the inner shaft 23668a of coaxial shaft assembly 23660 in drive section 23204. The idler pulley 23614 is fixedly mounted to the bottom of the outer shaft 23674 of the coaxial shaft assembly connecting the forearm 23202 to the upper arm 23201. Drive belt 23616 connects the drive pulley 23612 to the idler pulley 23614. The diameter ratio (e.g. pulley ratio) between the idler and drive pulleys 23624, 23622 of the first transmission 23626 and between the idler and drive pulleys 23614, 23612 of the second transmission 23610 may be any suitable drive ratio such as those described herein. The drive belts 23616, 23626 are configured to rotate the respective idler pulleys 23614, 23624 in the same direction as the corresponding drive pulley 23612, 23622 (e.g. clockwise rotation of drive pulleys 23612, 23622 causes clockwise rotation of idler pulleys 23614, 23624).

The coaxial shaft assembly 23675 connecting the forearm 23202 to the upper arm 23201 is rotatably supported from the upper arm 23201 by suitable bearings which allow the outer and inner shafts 23674, 23672 of the shaft assembly to rotate about axis Z2 relative to each other and to the upper arm 23201. The outer shaft 23674 of coaxial shaft assembly 23675 is fixedly mounted to the forearm 23202 so that the shaft 23674 and forearm 23202 rotate together as a unit about Z2. The forearm 23202 is rotated about axis Z2 when the idler pulley 23614 of the second transmission 23610 in the upper arm 23201 is rotated by inner shaft 23668a of drive section 23204. Thus, the inner shaft 23668a of drive section 23204 is used to independently rotate forearm 23202 relative to the upper arm 23201.

The inner shaft 23672 of the coaxial shaft assembly is fixedly attached to drive pulley 23753 of a third transmission 23752 in the forearm 23202. The third transmission 23752 in the forearm 23202 preferably comprises drive pulley 23753, an idler pulley 23750 and drive belts or cables 23751. Idler pulley 23750 is fixedly mounted to shaft 23698. Drive belt 23751 connects the drive pulley 23753 to idler pulley 23750. Shaft 23698 is rotatably supported from the forearm 23202 by suitable bearings which allow the shaft 23698 to rotate about axis Z3 relative to the forearm 23202. The diameter ratio between the idler and drive pulleys 23750, 23753 of the third transmission 23752 in this aspect is any suitable drive ratio such as those described herein. The drive belts 23751 are configured to rotate the idler pulley 23750 in the same direction as the drive pulley 23753 (e.g. clockwise rotation of drive pulley 23753 causes clockwise rotation of idler pulley 23750).

Shaft 23698 is fixedly mounted to the substrate holder 23203. Thus, the shaft 23698 and substrate holder 23203 rotate together as a unit about axis Z3. The substrate holder 23203 is rotated about axis Z3 when idler pulley 23750 of the third transmission 23752 is rotated by drive pulley 23753. Drive pulley 23753 in turn is rotated by inner shaft 23672 of the coaxial shaft assembly 23675. Inner shaft 23672 is rotated when idler pulley 23624 of the first transmission 23626 in the upper arm 23201 is rotated by middle shaft 23268b of drive section 23204. Hence, the substrate holder 23203 may be independently rotated with respect to forearm 23202 and upper arm 23201 about axis Z3.

Figure 24:
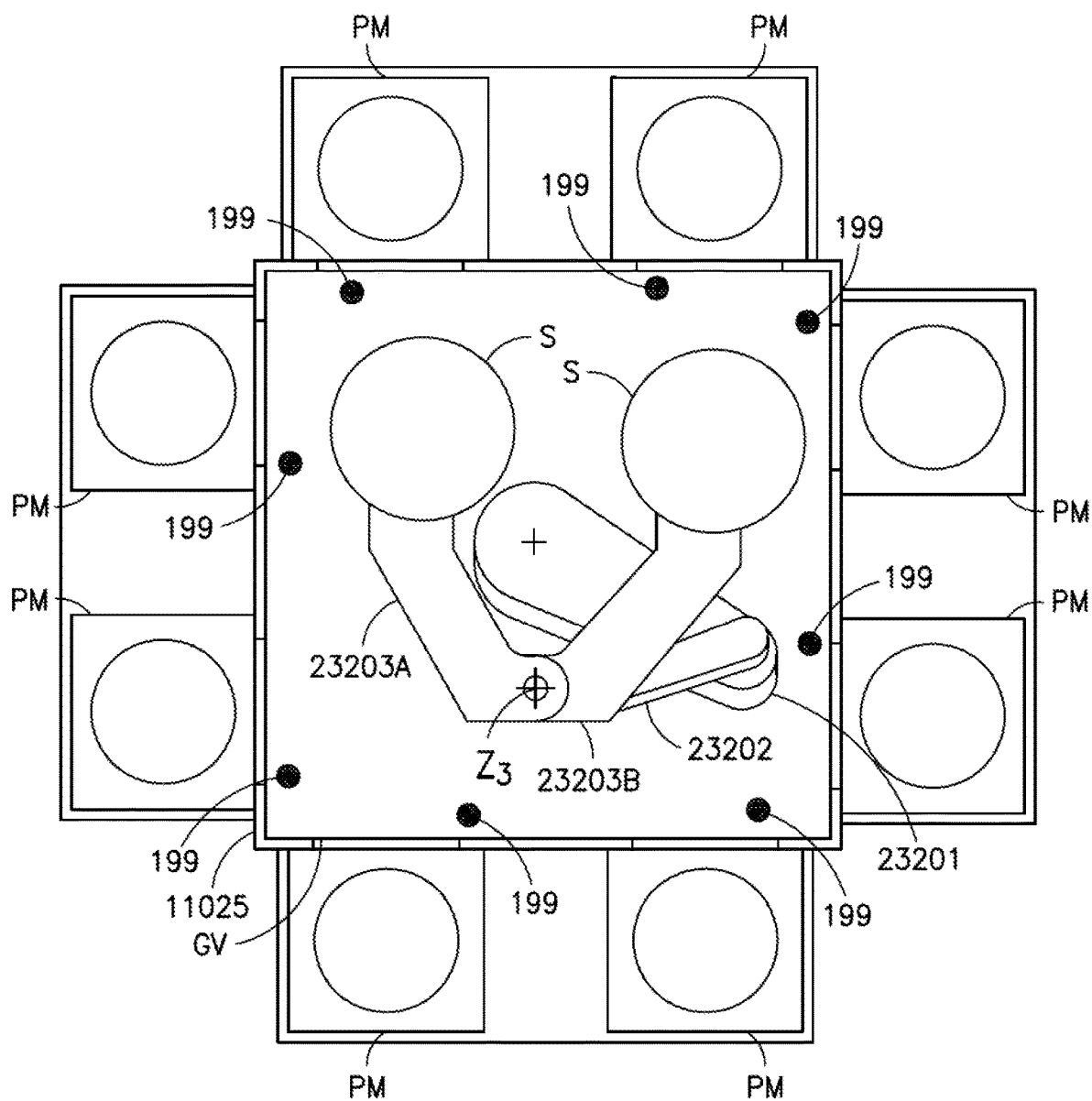
FIG. 24 is a schematic illustration of a portion of a substrate processing apparatus in accordance with aspects of the disclosed embodiment.

Referring also to FIG. 24, in one aspect, the transport apparatus 2300 may include two end effectors 23203A, 23203B that are located side by side so that substrates S are substantially simultaneously transported to and removed from process modules PM that are also located side by side. In one aspect, the two end effectors 23203A, 23203B may be independently movable relative to one another about the wrist axis Z3. For example, the drive 23204 may include an additional drive shaft and motor for effecting movement of one end effector 23203A, 23203B relative to the other end effector 23203A, 23203B.

Figure 25:
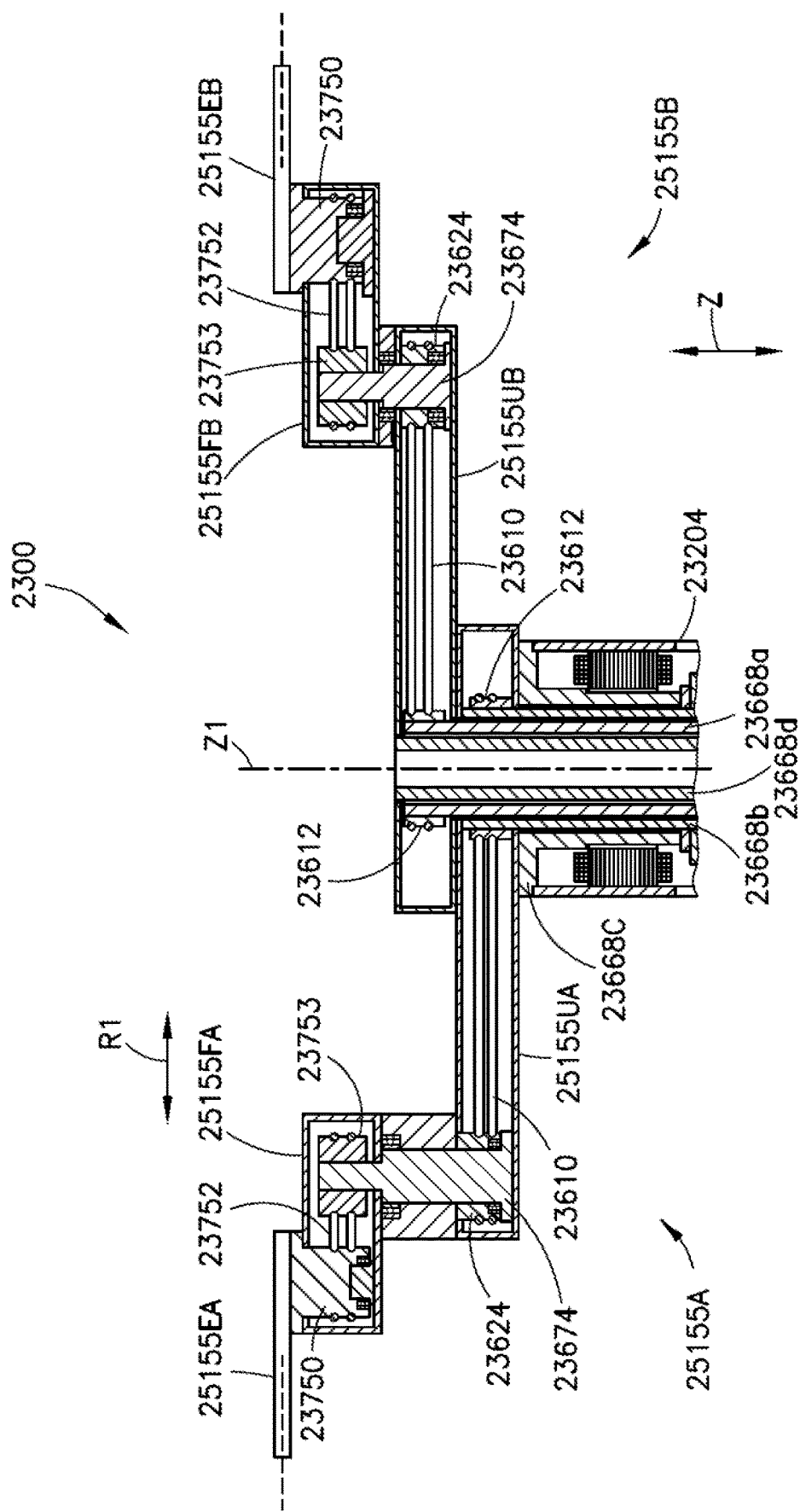
FIG. 25 is a schematic illustration of a portion of a substrate processing apparatus in accordance with aspects of the disclosed embodiment.

Referring to FIG. 25, in one aspect, the transport apparatus 2300 may include two SCARA arms 25155A, 25155B that are substantially similar to arm 2300A. For example, each SCARA arm 25155A, 25155B includes an upper arm link 25155UA, 25155UB, a forearm link 25155FA, 25155FB and an end effector 25155EA, 25155EB. In this aspect the end effectors 25155EA, 25155EB are slaved to the upper arm but in other aspects, the end effectors may be independently driven. The arms 25155A, 25155B, are shown as three link SCARA arms, and may be coupled co-axially to the drive section 23204, and may be vertically stacked on top of each other to allow for independent theta motion (using e.g. a four axis drive—see drive shaft 23668d) or coupled theta motion (using e.g. a three axis drive) where the coupled theta motion is rotation of the robot arms as a unit about the shoulder axis Z1 substantially without extension or retraction. Each arm 25155A, 25155B is driven by a pair of motors and may have any suitable drive pulley arrangement. In one aspect the diameter ratio between the shoulder pulley, elbow pulley and wrist pulley for each arm may be, for non-limiting exemplary purposes, a 1:1:2 ratio or a 2:1:2 ratio. To extend each arm using, e.g. the 1:1:2 ratio each motor in the pair of motors is rotated in substantially equal and opposite directions. To extend each arm using, e.g., the 2:1:2 ratio the shoulder pulley is held substantially fixed (e.g. substantially does not rotate) and the motor coupled to the upper arm is rotated to extend the arm. Theta motion is controlled by rotating the motors in the same direction substantially at the same speed. Where the end effectors are on the same plane the theta motion of each of the arms relative to each other is limited, however the arms can move infinitely in theta if the arms are moved together. As may be realized, where the end effectors are not on the same plane each arm can move infinitely in theta when each arm is driven independent of the other arm such as when using the four axis drive.

Figure 26:
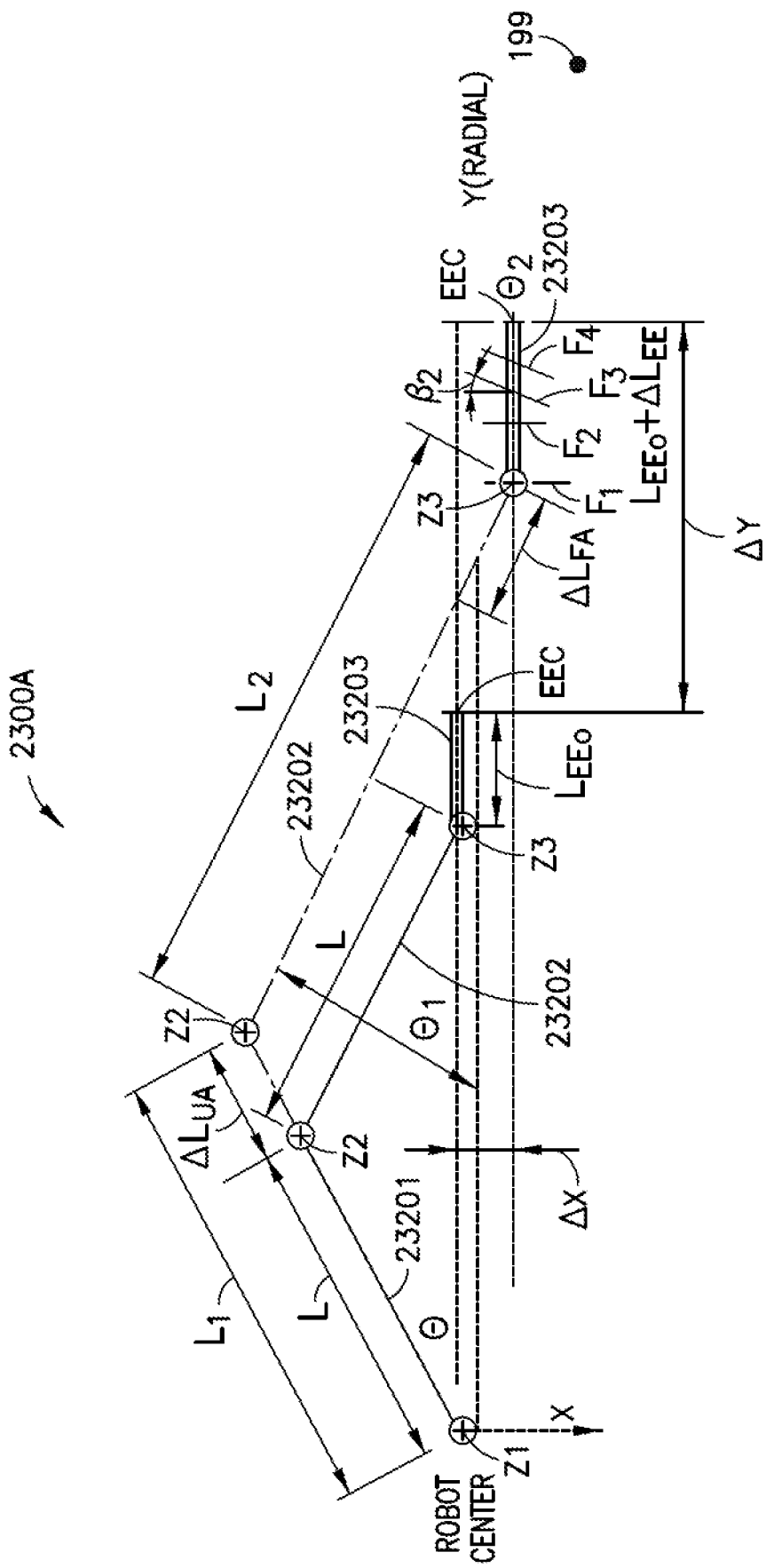
FIG. 26 is a schematic illustration of a portion of a substrate processing apparatus in accordance with aspects of the disclosed embodiment.
Figure 27:
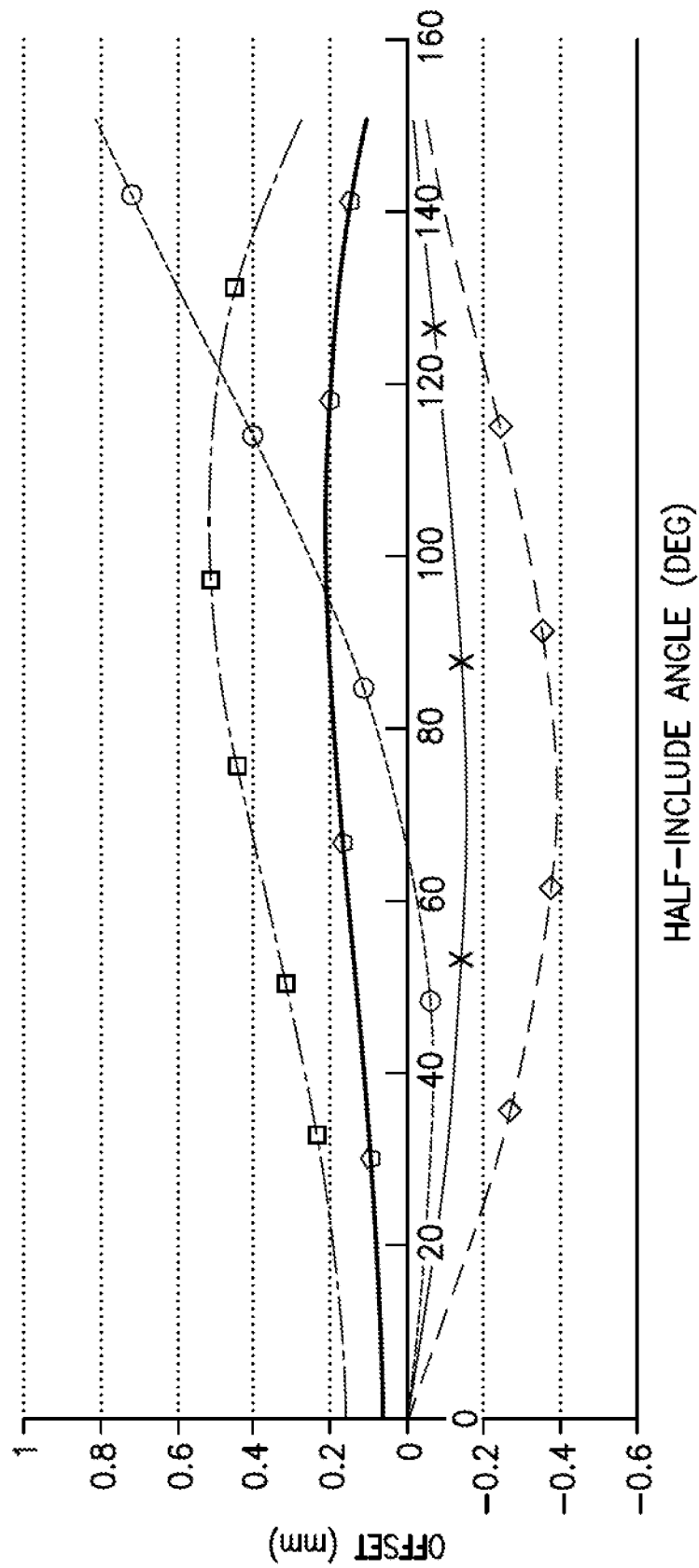
FIG. 27 is an exemplary graph illustrating end effector offsets at different temperatures in accordance with aspects of the disclosed embodiment.

As noted above, in this aspect, discrete effects of the change in length as a function of temperature (e.g. $L_i f(\Delta T_i)$) are resolved/determined for each arm link of SCARA arms illustrated in FIGS. 23-25 due to different temperatures of each arm link, both during transients as the arm comes up to temperature and once the arm reaches a steady state temperature condition. Here a temperature gradient may exist along each SCARA arm where the temperature of the end effector $T_{EE}$ (and wrist axis $T_W$) is greater than the temperature of the forearm link $T_F$ (and the temperature of the elbow axis $T_{EL}$) and the temperature of the forearm link $T_F$ (and temperature of the elbow axis $T_{EL}$) is greater than the temperature of the upper arm link $T_U$ (and the temperature of the shoulder axis $T_S$) (i.e. $T_{EE}/T_W > T_F/T_{EL} > T_U/T_S$). It should be understood that a temperature gradient may exist in each arm link where the distal end of the arm link (e.g. the end of the arm link furthest from the shoulder axis Z1) is of a higher temperature than a proximate end of the same arm link. Referring to FIGS. 26 and 27, a graph of a simulated offset at the end effector wafer center point EEC is illustrated in FIG. 27 against half angle values for a SCARA arm are illustrated. The graph in FIG. 27 illustrates the error along both the X and Y axes, especially around sensor triggering positions (e.g. about the included angle of 100 degrees).

In this aspect, the change in length of the end effector $\Delta L_{EE}$ and effects of temperature on the wrist axis Z3 are taken in account. Also in this aspect, pulley effects $\Delta V$ that generate non-linear effects in the location of the end effector center $\Delta X$, $\Delta Y$ due to, for example, the summation of the change in arm link lengths $\Delta L_i$ (where i=upper arm link, forearm link and end effector) and the pulley effects $\Delta V_i$ (where i=shoulder pulley, elbow pulley and wrist pulley) (i.e. $\Sigma \Delta L_i$, $\Delta V_i$) are accounted for. In this aspect, also referring to FIG. 26, SCARA arm variance due to, for example, thermal expansion of the SCARA arm components, between the shoulder axis Z1 (which is fixed in the X-Y plane) and the end effector wafer center point EEC is from thermal linear expansion of the SCARA arm links (e.g. the upper arm, forearm and end effector), and from an uneven temperature distribution of the different SCARA arm links. As an example, the uneven temperature distribution of the different SCARA arm links is due to one or more of the attenuated thermal condition path from the end effector to the shoulder axis Z1 and the uneven temperatures experienced by the SCARA arm links where, for example, the end effector is exposed to higher temperatures than the forearm and upper arm. In addition, the pulley drive ratio between the shoulder, elbow and wrist pulleys of the SCARA arm changes due to changes in diameter of each pulley due to thermal expansion of the pulleys from the uneven temperatures experienced by the respective SCARA arm links.

Still referring to FIG. 26, in this aspect, the at least one SCARA arm 2300A includes at least one pose deterministic feature or flag F1-F4 (which may also be referred to herein as a datum feature which in one aspect may be similar to the flags described above or in the aspects that follow an edge of portion of the end effector or other link of the SCARA arm) that is integral to the SCARA arm 2300A where each flag F1-F4 has a configuration that is determinative, e.g. on sensing of the at least one flag F1-F4 by one or more sensors 199 (see FIG. 24), of the discrete variance(s) in the SCARA arm link 23201, 23202, 23203 lengths $\Delta L_i$, and pulley effects $\Delta V_i$ due to changes in temperature of each respective SCARA arm link 23201, 23202, 23203. For example, the at least one flag F1-F4 is disposed on the SCARA arm so that a static detection sensor, such as sensor 199 (which is similar to sensors 199A, 199B) of the substrate processing apparatus detects at least one edge of the at least one flag F1-F4 on the fly with the radial motion of the SCARA arm 2300. Here the configuration of the flags F1-F4 determines discrimination between each of the different discrete variances (e.g. $\Delta L_i$) of each different SCARA arm link 23201, 23202, 23203 due to different changes in temperature $\Delta T_i$ at each SCARA arm link 23201, 23202, 23203 and thus, discriminately applies the respective different discrete variance to determine the respective pulley variance $\Delta V_i$ and corresponding non-linear effects (contribution) to the variance of the SCARA arm. The discrete variances can be expressed with corresponding proportion or expansion factors ($K_{S(i)}$), as described above, relating variances to predetermined datum references (e.g. reference temperature $T_{REF}$ and the initial link lengths $L_i$ at the reference temperature) noted above and described below.

The configuration of the flags F1-F4 is deterministic for discrimination (or as per above deterministic discrimination between each of the different discrete variances) of a 3 link SCARA arm 2300A having the upper arm link 23201, the forearm link 23202 and the end effector 23203, but in other aspects the flags F1-F4 can have any suitable configuration for deterministic discrimination of an n-link arm (e.g. an arm having any suitable number of arm links). The configuration of the flags F1-F4 is deterministic for discrimination of the different discrete variances ($\Delta L_i$, $\Delta V_i$), or the expansion factor(s) $K_{S(i)}$, from sensing at least one edge of one or more flags F1-F4, on the fly, in one pass with a single sensor 199 as described in greater below with respect to equations [1]-[4].

In one aspect, the controller 11091 (or the kinematic resolver 11091K of the controller) is configured to determine, from the detection of at least one edge of the flags F1-F4 by the sensor 199, on the fly, different discrete variances $\Delta L_i$ respective to each arm link 23201, 23202, 23203, and discriminate between the different discrete variances in determining the SCARA arm variance (e.g. $\Delta X$, $\Delta Y$ or R, θ depending on the coordinate system being used) from the shoulder axis Z1 to the reference location EEC (i.e. the wafer/end effector center location) of the end effector 23203. As noted before, with the variance expressed as an expansion factor $K_{S(i)}$ corresponding to each arm link 23201, 23202, 23203, the controller 11091 is configured to determine from detection of the flags F1-F4, on the fly, the discrete relation between the different expansion factors $K_{S(i)}$ of each corresponding arm link 23201, 23202, 23203, discriminating between the different expansion factors $K_{S(i)}$ of different corresponding arm links 23201, 23202, 23203 in determining the variance to the reference location EEC of the end effector 23203. In other words, the controller includes the kinematic effects resolver which is configured to determine, from the detection of at least one edge of the flags F1-F4, by the static detection sensor 199, on the fly with the radial motion of the SCARA arm 2300, a discrete relation between the determined proportion factor $K_{S(i)}$ and each different discrete variance $\Delta L_i$ respective to each different arm link 23201, 23202, 23203 of the SCARA arm 2300A determining the variance of the SCARA arm on the fly with the radial motion of the SCARA arm 2300A. From the detection of the at least one edge of one or more flags F1-F4 the controller 11091 is configured to determine the variance $\Delta X$, $\Delta Y$ of the SCARA arm 2300A in one pass of the SCARA arm 2300 by the sensor 199. Further, the controller 11091 (or the kinematic resolver 11091K) is configured to resolve non-linear kinematic effects $\Delta V_i$ of the respective pulleys (see e.g. pulleys 23750, 23753, 23264, 23612, 23622 in FIG. 23) due to the change in temperature $\Delta T_i$ discriminating between the different respective non-linear kinematic effects $\Delta V_i$ of the respective pulleys due to different temperatures at the arm joints or pulley axes Z1, Z2, Z3. The pulley variance corresponding to the non-linear kinematic effects $\Delta V_i$ may be expressed as a pulley drive ratio between pulleys at opposite ends of each respective arm link 23201, 23202, 23203.

Referring to FIG. 26, for exemplary purposes and convenience the transport apparatus is illustrated as having a single SCARA arm where the upper arm and forearm links 23201, 23202 of the SCARA arm 2300A are illustrated as having the same length L at the reference temperature $T_{REF}$ however in other aspects, the upper arm and forearm links may have unequal lengths. In other aspects the disclosed embodiment may be applied to each arm of a multi-arm transport robot as illustrated in e.g. FIG. 25 and/or to each end effector of a multi-end effector arm as illustrated in FIG. 24. Further, for exemplary purposes and convenience the SCARA arm links are constructed of similar materials so as to have similar coefficients of thermal expansion but in other aspects, the arm links may be constructed of different material so as to have different coefficients of thermal expansion. In one aspect, for exemplary purposes only the upper arm link 23201 and forearm link 23202 are driven by respective motor axes while the end effector 23203 is slaved to the upper arm link 23201. The SCARA arm 2300A, is illustrated in FIG. 26 under the same motor positions, before and after thermal expansion (the thermally expanded arm is illustrated in phantom lines). The general kinematics of the SCARA arm can be written as:

At the reference temperature:

$$Y(\theta) = 2L \cos(\theta) + L_{EE0}$$

$$X(\theta) = 0$$

After temperature heat up and thermal expansion:

$$Y(\theta) = L_1 \cos(\theta) + L_2 \cos(\theta_1) + (L_{EE0} + \Delta L_{EE}) \cos(\theta_2)$$

$$X(\theta) = L_2 \sin(\theta_1) - L_1 \sin(\theta) + (L_{EE0} + \Delta L_{EE}) \sin(\theta_2)$$

Where:

$$\theta_1 = (G_1 - 1)\theta$$

$$\theta_2 = \left(\frac{G_1}{G_2} - G_1 + 1\right)\theta$$

and $G_1$ and $G_2$ are pulley gear ratios for upper arm to elbow and wrist to elbow.

At the calibration temperature $T_{REF}$, the upper arm link 23201 and forearm link 23202 each have a length L. After temperature changes the length of the upper arm link 23201 is denoted as L1 and the length of the forearm link 23202 is denoted as length L2.

At the same motor positions, assuming the upper arm temperature changed by $\Delta T_1$, and forearm temperature changed by $\Delta T_2$, and the thermal expansion coefficient for upper arm link 23201 is $\alpha_1$ and the thermal expansion coefficient for the forearm link 23020 is $\alpha_2$, the upper arm length L1 and forearm length L2 after thermal expansion are:

$$L_1 = L + \alpha_1 * \Delta T_1 * L = (1 + \alpha_1 * \Delta T_1) * L = K_{s1} * L; \quad [1]$$

$$L_2 = L + \alpha_2 * \Delta T_2 * L = (1 + \alpha_2 * \Delta T_2) * L = K_{s2} * L; \quad [2]$$

Where the expansion factors are defined as:

$$K_{s1} = (1 + \alpha_1 * \Delta T_1); \quad [3]$$

$$K_{s2} = (1 + \alpha_2 * \Delta T_2); \quad [4]$$

Because the temperatures are distributed from the end effector 23203 to the shoulder axis Z1 of the SCARA arm 2300A, especially during the temperature increase to steady state, the distributed temperature changes the pulley ratios of the pulleys at the SCARA arm joints (e.g. axes Z1, Z2, Z3) due to thermal expansion of the pulleys at different rates. This thermal expansion of the pulleys will change the included angle and the end effector orientation. Referring again to FIG. 27, an example of simulation results to show the impact of pulley drive ratio changes on the end effector center EEC assuming the pulleys are at different temperatures but the link length is unchanged.

The following table illustrates exemplary pulley drive ratios for the pulleys of the SCARA arm 2300A, where the location of the pulley is identified and the diameter is represented in generic units of measure

| Location | Diameter |
|---|---|
| UA shoulder | 2 |
| UA Elbow | 1 |
| FA Elbow | 1 |
| FA Wrist | 2 |

For the SCARA arm 2300A, the shoulder axis Z1 is connected to the elbow axis Z2 with a transmission including pulleys having a 2:1 drive ratio, and the wrist axis Z3 is connected to the elbow axis Z2 with a transmission including pulleys having a 2:1 drive ratio.

Assuming the temperature change at the shoulder axis Z1 is $\Delta T1$ and the temperature change at the elbow axis is $\Delta T2$, and $\alpha$ is the thermal coefficient of the arm link material, the pulley ratio of the shoulder axis Z1 to the elbow axis Z2 may be expressed as:

$$G_1 = 2 * (1 + \alpha * \Delta T1)/(1 + \alpha * \Delta T2);$$

Using equations [3] and [4]:

$$G_1 = 2 * K_{s1}/K_{s2}; \quad [5]$$

Therefore the angle after the change in pulley ratio is:

$$\theta_1 = (2 * K_{s1}/K_{s2} - 1) * \theta; \quad [6]$$

Assuming the temperature change on the end effector is $\Delta T_3$, the pulley ratio between the wrist axis Z3 and the forearm axis Z2 may be expressed as:

$$G_2 = 2 * (1 + \alpha * \Delta T3)/(1 + \alpha * \Delta T2)$$

and the expansion factor can be defined as:

$$K_{s3} = (1 + \alpha * \Delta T3);$$

Then:

$$G_2 = 2 * K_{s3}/K_{s2}$$

where the angle change of the end effector 23203 can be expressed as:

$$\theta_2 = \theta * (G_1/G_2 - G_1 + 1) = \theta * (K_{s1}/K_{s3} - 2K_{s1}/K_{s2} + 1); \quad [7]$$

Figure 28:
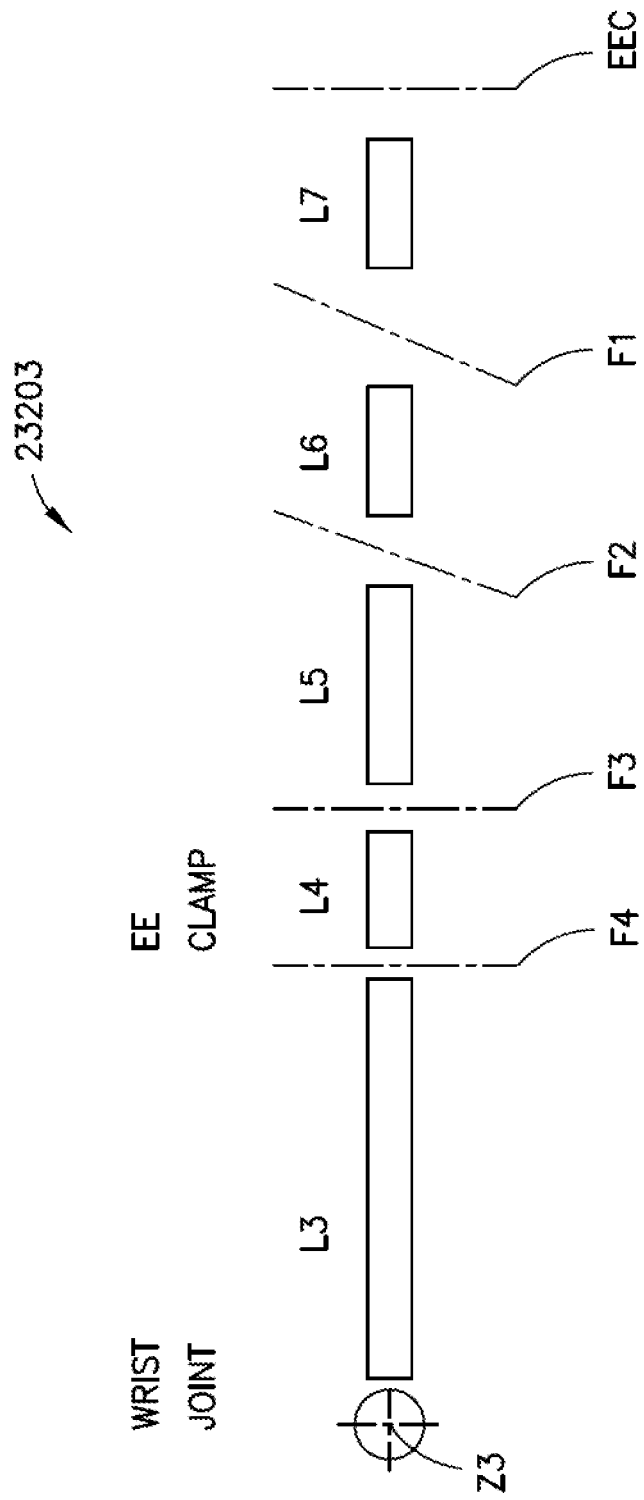
FIG. 28 is a schematic illustration of a portion of a substrate transport apparatus in accordance with aspects of the disclosed embodiment.

In one aspect, the arm pose deterministic features or flags F1-F4 are integral to the end effector 23203 and may be located at any suitable position of the end effector 23203 as noted above. As also noted above, the flags F1-F4 are deterministic so as to discriminate between each different discrete variance $\Delta L_i$ of the different arm links 23201, 23202, 23203, and the different pulleys of the SCARA arm 2300A, or determine and discriminate each different respective expansion factor $K_{S(i)}$ of the respective arm link and/or pulley for at least a 3 link SCARA arm 2300A. Referring to FIG. 28 an exemplary end effector 23203 is illustrated. In one aspect, to account for thermal expansion of the end effector 23203, the end effector is constructed of several segments L3-L7 where each segment L3-L7 may be constructed of the same or a different material than the other segments L3-L7 of the end effector 23203. In this aspect, the end effector 23203 includes four flags F1-F4 but in other aspects the end effector 23203 can have any suitable number of arm pose deterministic features. The following is an exemplary table illustrating the length and thermal expansion coefficient of each segment L3-L7 but in other aspects the segments may have any suitable length and thermal expansion coefficient and the flags F1-F4 may be placed at any suitable locations on the end effector 23203.

| Segment | Thermal Expansion Coefficient (μm/(m · K)) | Length (mm) | Comment |
|---|---|---|---|
| $L_3$ | α2 | about 220 | Wrist to the last ATEC flag on the clamp |
| $L_4$ | α1 | about 40 | ATEC flag on the Titanium clamp |
| $L_5$ | α3 | about 110 | Angled edge on EE |
| $L_6$ | α3 | about 50 | First flat edge on EE |
| $L_7$ | α3 | about 130 | EE center |

Assuming that the end effector is composed of different material segments each having a respective thermal expansion coefficient, the following is provided:

$$K_{s4}=(1+\alpha_1 * \Delta T_3); \quad [9]$$

$$K_{s5}=(1+\alpha_2 * \Delta T_3); \quad [10]$$

The thermal expansion for each segment of the end effector 23203 is:

Flag $F4$: [11]

$$\Delta L_4 = (K_{s3} - 1) * L_3$$

Flag $F3$: [12]

$$\Delta L_3 = \Delta L_4 + (K_{s4} - 1) * L_4 = (K_{s3} - 1) * (L_3 + L_4^* \alpha_1/\alpha)$$

Flag $F2$: [13]

$$\Delta L_2 = \Delta L_3 + (K_{s5} - 1) * L_5 = (K_{s3} - 1) * (L_3 + L_4^*\alpha_1/\alpha + L_5^*\alpha_2/\alpha)$$

Flag $F1$: [14]

$$\Delta L_1 = \Delta L_2 + (K_{s5} - 1) * L_6 = (K_{s3} - 1) * (L_3 + L_4^*\alpha_1/\alpha + (L_5 + L_6)^*\alpha_2/\alpha)$$

End effector center $EEC$: [15]

$$\Delta L_{EE} = \Delta L_1 + (K_{s5} - 1) * L_7 = (K_{s3} - 1) * (L_3 + L_4^*\alpha_1/\alpha + (L_5 + L_6 + L_7)^*\alpha_2/\alpha)$$

Figure 29:
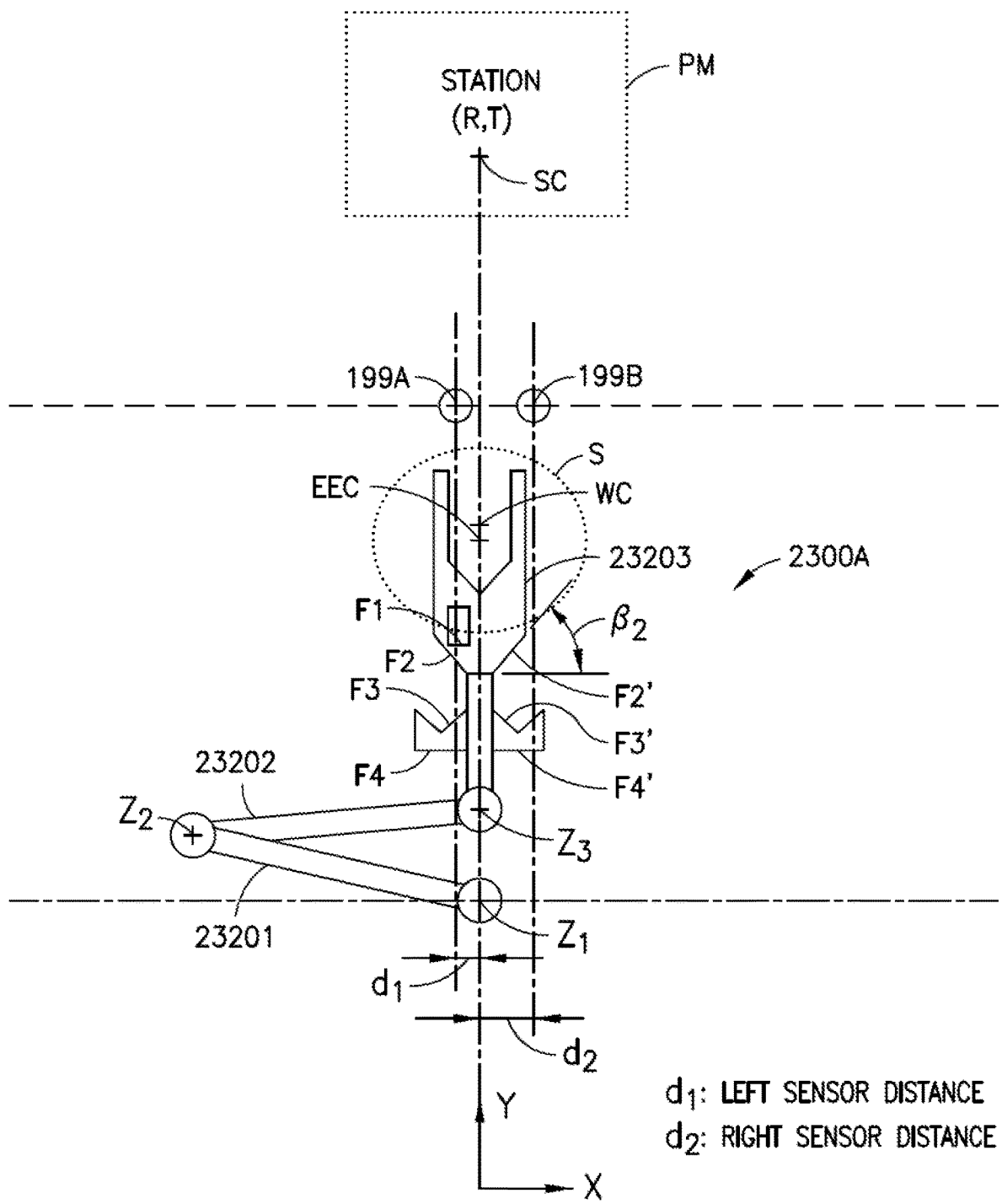
FIG. 29 is a schematic illustration of a portion of a substrate processing apparatus in accordance with aspects of the disclosed embodiment.
Figure 31:
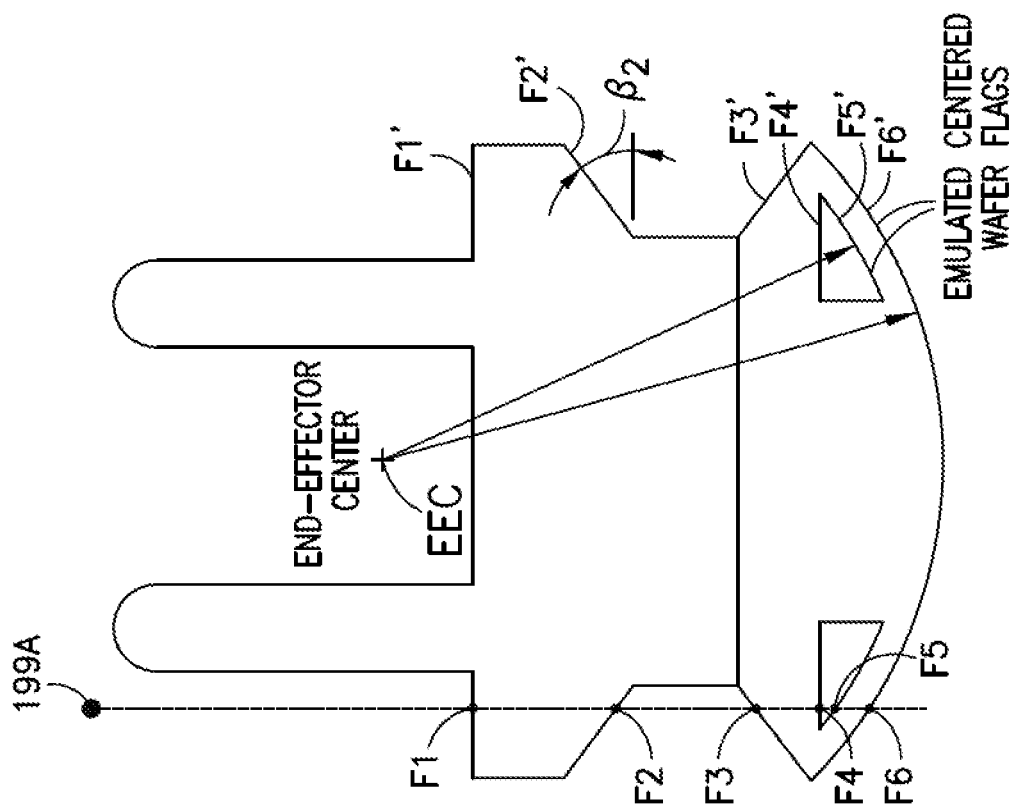
FIGS. 30 and 31 are schematic illustrations of exemplary end effectors of a substrate transport apparatus in accordance with aspects of the disclosed embodiment.
Figure 30:
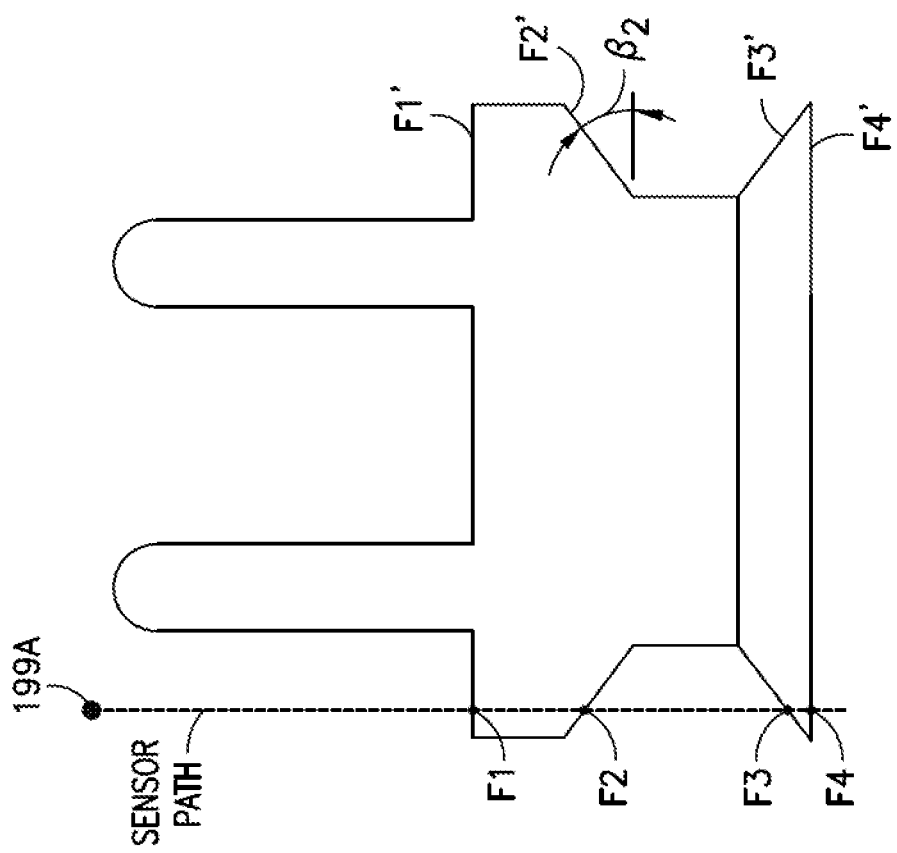

The combination of edges of the flags F1-F4, at least one of which is angled (e.g. at a non-zero angle, see edges of flags F2, F2', F3, F3', F4, F4' which have an such as angle $\beta_2$ in FIGS. 29-31, noting each angled edge of the flag(s) has a corresponding angle that may be the same as or different than angle with respect to the other edges of the same flag (noting that flag F3, F3' in FIG. 29 has two angled edges) or different flags F1-F4, define the deterministic configuration of the arm pose deterministic features or flags F1-F4, deterministic to effect determination of the different discrete variances $\Delta L_i$ of the respective SCARA arm links (and $\Delta V_i$ of the pulleys). It is noted that any of the flags described herein (including those illustrated and described above with respect to FIGS. 4A-5) may be combined in any order on a common robot arm, such as on end effector 23203 so that the end effector includes a combination of angled (e.g. at a non-zero angle) and straight (e.g. flags that are substantially perpendicular to the direction of extension/retraction of the arm, see e.g. flags F1, F1' F4, F4' in FIGS. 29-31) The discrimination of the different discrete variances $\Delta L_i$ of the respective SCARA arm links, and the corresponding determination and discrimination of each different respective expansion factor $K_{S(i)}$ of the respective SCARA arm link/pulley (e.g. due to the change in temperature of each SCARA arm link/pulley $\Delta T_i$) effects determining the variance of the SCARA arm including the non-linear effects from the pulley variance. Here, as noted above, the arm configuration shown in FIG. 26 includes three SCARA arm links (e.g. the upper arm 23201, the forearm 23202 and the end effector 23203) and flags F1-F4 each have at least one edge that is detectable by the static detection sensor 199. At least one edge of the flags F1-F4 (or at least one flag F1-F4) may be redundant and serve to filter or "smooth" the sensor signal noise provided by the static detection sensor 199 and resolve the path (e.g. the R or radial motion of the SCARA arm) "wobble" as described below.

Referring to FIGS. 1A, 26 and 27, as noted above, the controller 11091 may be configured to resolve the arm variance $\Delta L_i$ (and $\Delta V_i$) due to the change in temperature $\Delta T_i$ of the SCARA arm links and pulleys. For example, to determine the total offset or variance of the SCARA arm 2300A caused by thermal expansion, the local X-Y coordinate frame is defined as a rotation transformation of the robot frame (e.g. R-θ) so that the Y axis is along the radial direction of extension and retraction at room temperature $T_{REF}$. The equation for the end-effector 23203 position at room temperature $T_{REF}$ can be written as:

$$Y_0=2*L*\text{Cos}(\theta)+L_{EE0}; \quad [16]$$

$$X_0=0; \quad [17]$$

where $L_{EE0}$ is the pan (the term pan is used here for convenience only and is not intended to be descriptive or limiting as to the end effector structure configuration, that may have any suitable configuration) offset from wrist Z3 to the end effector center EEC, and θ is half the included angle determined by the motor T1 and T2 positions (e.g. the position of the drive shafts driving the upper arm 23201 and the forearm 23203 where the end effector 23203 is slaved to the upper arm 23201). The Y position is the same as the R position in radial coordinates (R-θ).

After the temperature is raised, the equation for the wrist joint Z3 position can be written as:

$$Y_1=L_1*\text{Cos}(\theta)+L_2*\text{Cos}((G_1-1)\theta) \quad [18]$$

$$X_1=L_2*\text{Sin}((G_1-1)\theta)-L_1*\text{Sin}(\theta) \quad [19]$$

In terms of expansion factor $K_{S(i)}$ values, the wrist joint Z3 position can be written as:

$$Y_1=K_{s1}*L*\text{Cos}(\theta)+K_{s2}*L*\text{Cos}((2K_{s1}/K_{s2}-1)\theta) \quad [20]$$

$$X_1=K_{s2}*L*\text{Sin}((2K_{s1}/K_{s2}-1)\theta)-K_{s1}*L*\text{Sin}(\theta) \quad [21]$$

The total expansion of the end effector 23203 due to thermal expansion can be written as (using equation [15]):

$$\text{panTotal}=L_{EE0}+\Delta L_{EE}$$

which when translated to the X-Y coordinate frame can be written as:

$$y\text{Pan}=\text{panTotal}*\text{Cos}(\theta_2); \quad [22]$$

$$x\text{Pan}=\text{panTotal}*\text{Sin}(\theta_2); \quad [23]$$

and expanding the above equations in terms of the expansion factor $K_{S(i)}$ values:

$$Y(\theta) = K_{s1}L\cos(\theta) + K_{s2}L\cos\left(\left(\frac{2K_{S1}}{K_{S2}} - 1\right)\theta\right) + \quad [24]$$

$$\left(L_{EE0} + (K_{s3} - 1)\left(L_3 + \frac{\alpha_1}{\alpha}L_4 + \frac{\alpha_2}{\alpha}(L_5 + L_6 + L_7)\right)\right)$$

$$\cos\left(\left(\frac{K_{S1}}{K_{S3}} - \frac{2K_{S1}}{K_{S2}} + 1\right)\theta\right)$$

$$X(\theta) = K_{s2}L\sin\left(\left(\frac{2K_{S1}}{K_{S2}} - 1\right)\theta\right) - K_{s1}L\sin(\theta) + \quad [25]$$

$$\left(L_{EE0} + (K_{s3} - 1)\left(L_3 + \frac{\alpha_1}{\alpha}L_4 + \frac{\alpha_2}{\alpha}(L_5 + L_6 + L_7)\right)\right)$$

$$\sin\left(\left(\frac{K_{S1}}{K_{S3}} - \frac{2K_{S1}}{K_{S2}} + 1\right)\theta\right)$$

Knowing the $K_S$ factors (or temperatures at all of the SCARA arm links), the wafer and end effector 23203 offsets due to thermal expansion can be calculated using above equations for any given half-included angle θ.

Referring now to FIGS. 29-31 (each figure showing different examples of suitable flag configurations in accordance with different aspects of the disclosed embodiment otherwise schematically illustrated in FIGS. 26 and 28), detecting edges of the flags F1-F4 and determining the different expansion factors $K_{S(i)}$ and discriminating between the different expansion factors $K_{S(i)}$ will be described. In one aspect, to calculate the thermal offsets, the expansion factors $K_{S(i)}$ in equations [24] and [25] are determined. This can be achieved using the static detection sensor 199 to detect trigger position changes of the end effector 23203 edges and wrist flags F1-F4 as previously described. This is equivalent to placing a known target in the system and measuring the signal changes to reverse calculate the expansion factor $K_{S(i)}$ values. In one aspect, the signal changes may be caused by thermal linear expansion of the links, pulley ratio changes in the SCARA arm pulleys due to, e.g., joint expansion in uneven temperature distribution and/or flag/end effector edge alignment changes due to pulley ratio changes.

Thermal expansion in SCARA arms, such as arm 2300A causes both linear expansion and pulley ratio changes, and creates complex non-linear equations between position captures (such as when a flag is sensed or an edge of the end effector is sensed) and thermal expansion. Therefore, the configuration of the flags F1-F4 is deterministic for determining the different expansion factors $K_{S(i)}$ respective to each SCARA arm link 23201, 23202, 23203, and resolving the total arm expansion with on the fly detection in no more than one (or but one) pass of the end effector 23203 by the static detection sensor 199.

A representative sensor 199 and wrist flag configuration is illustrated in FIG. 29 but it should be understood that the sensor 199 and flags F1-F4 may have any suitable configuration including those illustrated in FIGS. 30 and 31. In this aspect, as above, flags F1-F5 are located along the end effector 23203 so that the flags F1-F4 generate triggering points for capturing SCARA 2300A arm positions as the flags F1-F5 pass by sensor 199, such as one of the static wafer detection sensors 199A, 199B. The positions of the flags F1-F4 sensed by but one of the sensors 199A, 199B are used as inputs to analytical equations from the SCARA arm kinematics to determine the associated thermal expansion of the respective SCARA arm links 23201, 23202, 23203 as noted above. In one aspect, the flag F1-F4 shapes may be selected to generate a suitable number of sensor/flag transitions to provide a minimum set of equations required to solve for the unknown variables, namely the expansion factor $K_{S(i)}$ of or discrete to each respective SCARA arm link 23101, 23202, 23203 (e.g. the expansion factor $K_n$ for the upper arm link 23201, the expansion factor $K_n$ for the forearm and the expansion factor $K_n$ for the end effector 23203). One exemplary set of equations is shown in equations [34], [36] and [39] described below. In this aspect, flag transitions for flags F1-F3 in FIGS. 4, 5A and 5B were utilized to generate such equations.

In one aspect, as shown in FIG. 5B sensor transitions across rounded flags F5, F6 are illustrated where the center of the radii of the flags F5, F6 is coincident with the center of the end-effector EEC. In this aspect, the sensor transitions provided by at least flags F5, F6 can be used to emulate reference wafers (having a center that has a zero offset from end effector center EEC) that are centered at the end-effector center EEC in a manner similar to that described above with respect to, for example, FIGS. 4A-4C, 4F, 7. As noted above, co-locating the center of the flags F5, F6 with the end effector center EEC may eliminate the need for zero offset fixtures for Active Wafer Center (AWC) calibration. It is also noted that the shape of the flags F1-F5 illustrated in FIGS. 29-31 are exemplary and that other flag shapes such as those described above may be used. In addition, the flag shapes described herein may be combined on a single end effector, in a manner similar to that illustrated in FIGS. 30 and 31 to effect determination of the SCARA arm thermal expansion and/or automatic wafer centering with but one pass of the end effector 23203 past but one static detection sensor 199.

In one aspect, the flags F1-F6 (or other datum features described herein) may be integrally formed on, e.g. the end effector 23203 or any other suitable position on the SCARA arm such as on the upper arm 23201 or the forearm 23202. In other aspects, one or more of the flags F1-F6 may be mounted to the end effector 23203 (or other portion of the SCARA arm) in any suitable manner and in any suitable location so that the flags F1-F6 may be sensed by but one static detection sensor 199 (or as noted above by at least one static detection sensor).

As noted above, the aspects of the disclosed embodiment and flag F1-F6 concepts described herein can be used with but one static detection sensor 199. However, in other aspects, more than one sensor 199A, 199B may be used to generate redundant information and improve signal to noise ratio such as described above. In one aspect, the sensors 199A, 199B are mounted to the transfer chamber 11025 (see FIGS. 1A and 24) in which the SCARA arm 2300 is located, on the process chamber PM, on a gate valve GV between the transfer chamber 11025 and the process chamber PM or at any other suitable location of the processing system so that the sensor triggering positions can be considered as fixed positions within the SCARA arm reference frame (e.g. R-θ or X-Y). In one aspect, the triggering transitions from both sensors 199A, 199B are stored during sensor calibration as known position references.

In one aspect, using the detection of flag F1 (e.g. a flat edge on the wrist of the end effector 23203) by sensor 199A, the wrist joint Z3 position (using equations [20]-[21]) can be written as:

$$y1 = K_{s1}*L*\mathrm{Cos}(\theta) + K_{s2}*L*\mathrm{Cos}((2K_{s1}/K_{s2}-1)\theta); \quad [27]$$

$$x1 = K_{s2}*L*\mathrm{Sin}(((2K_{s1}/K_{s2}-1)\theta) - K_{s1}*L*\mathrm{Sin}(\theta); \quad [28]$$

where θ is the original kinematics' half included angle as noted above, which in one aspect, may be obtained from the position capture of, e.g. the flag F1, due to, e.g., the original kinematics for motion planning of the SCARA arm 2300A and corresponding reports.

Assuming R is the position capture's radial value (the point along the radial extension axis at which the flag F1 was sensed):

$$\theta = \cos^{-1}((R-L_{EE0})/(2*L)); \quad [29]$$

The shift due to triggering edge orientation changes in the Y direction can be written as:

$$\delta y = d_1 * \tan(\theta_2); \quad [30]$$

Assuming trigger position of the flat edge of flag F1 is $s_4$ during calibration, after thermal expansion, the trigger position of the flat edge of the flag F1 can be written as:

$$s_4 = y_1 + ((K_{s3}-1)*L_3)*\cos(\theta_2) + L_{EE0} - d_1 * \tan(\theta_2); \quad [32]$$

where (using equation [7]):

$$\theta_2 = \theta * (K_{s1}/K_{s3} - 2K_{s1}/K_{s2} + 1); \quad [33]$$

and assuming the radial position capture on the flag after thermal expansion is R4, then the half-included angle is:

$$q_4 = \cos^{-1}((R4 - L_{EE0})/(2*L)); $$

and expanding equation [32]:

$$K_{s1}*L*\cos(q_4) + K_{s2}*L*\cos((2K_{s1}/K_{s2}-1)q_4) + \\ ((K_{s3}-1)*L3)*\cos(q_4*(K_{s1}/K_{s3}-2K_{s1}/K_{s2}+1)) - \\ d_1*\tan(q_4*(K_{s1}/K_{s3}-2K_{s1}/K_{s2}+1)) - (s_4 - L_{EE0}) = 0; \quad [34]$$

Using the same method, the transition of the flat edge of the flag F1 past the sensor 199A can be written as:

$$s_1 = y_1 + ((K_{s3}-1)*(L_3 + L_4*\alpha_1\alpha + (L_5+L_6)*\alpha_2/\alpha))*\cos(\theta_2) + L_{EE0} - d_1*\tan(\theta_2); \quad [35]$$

where d1 is the Y distance from the end effector center EEC to the sensor 199A.

Assuming the radial position capture of the flag F1 is R1, then the half-included angle is:

$$q_1 = \cos^{-1}((R1 - L_{EE0})/(2*L));$$

and expanding equation [35]:

$$K_{s1}*L*\cos(q_1) + K_{s2}*L*\cos((2K_{s1}/K_{s2}-1)q_1) + \\ ((K_{s3}-1)*(L_3+L_4*\alpha_1/\alpha+(L_5+L_6)*\alpha_2/\alpha))*\cos(q_1* \\ (K_{s1}/K_{s3}-2K_{s1}/K_{s2}+1)) - d_1*\tan(q_1*(K_{s1}/K_{s3}- \\ 2K_{s1}/K_{s2}+1)) - (s_1 - L_{EE0}) = 0; \quad [36]$$

For the angled edge of Flag F2, there is an extra shift in the Y direction caused by thermal expansion in the X direction:

$$dy = (K_{s2}\sin(\theta_1) - K_{s1}*\sin(\theta))*L*\tan(\beta_2) \quad [37]$$

where $\beta_2$ is the edge angle as illustrated in FIG. 29. While $\beta_2$ is illustrated with respect to edge F2' it should be understood that the angle of any of the angled edges of, for example, flags F2, F2', F3, F3' illustrated in FIGS. 29-31 may be used. In a manner similar to that derived above, using the stored triggering value, $s_2$ can be written as:

$$s_2 = y_1 + ((K_{s3}-1)*(L_3+L_4*\alpha_1/\alpha+L_5*\alpha_2/\alpha))*\cos(\theta_2) + \\ L_{EE0} - d_1*\tan(\theta_2) + dy; \quad [38]$$

Assuming the radial position capture of the flag F2 is R2, then the half-included angle is:

$$q_2 = \cos^{-1}((R2 - L_{EE0})/(2*L));$$

and expanding equation [38]:

$$K_{s1}*L*\cos(q_2) + K_{s2}*L*\cos((2K_{s1}/K_{s2}-1)q_2) + \\ ((K_{s3}-1)*(L_3+L_4*\alpha_1/\alpha+L_5*\alpha_2/\alpha))*\cos(q_2*(K_{s1}/ \\ K_{s3}-2K_{s1}/K_{s2}+1)) - d_1*\tan(q_2*(K_{s1}/K_{s3}-2K_{s1}/ \\ K_{s2}+1)) - (s_2 - L_{EE0}) + (K_{s2}\sin((2K_{s1}/K_{s2}-1)q_2) - \\ K_{s1}*\sin(q_2))*L*\tan(\beta_2) = 0; \quad [39]$$

Equations [34], [36] and [39] are three non-linear equations with three variables $K_{s1}$, $K_{s2}$ and $K_{s3}$ that describe the variance due to thermal expansion of a 3 link SCARA arm.

In other aspects, additional flags/edges may be provided to discriminate/resolve the expansion factors ($K_{S(i)}$) of a 4 link SCARA arm or a SCARA arm having any suitable number of links (e.g. an n-link SCARA arm). In one aspect, the set of non-linear equations may be solved using, for example, the Newton-Raphson method however, in other aspects any suitable method may be used to solve the non-linear equations. In one aspect, any suitable Newton-Raphson algorithm may be used to find the half-included angle θ from forward kinematics. The Newton-Raphson method is fast converging when the initial value is close to the solution and in one aspect enables effecting solution determination coincident with the single pass of the end effector 23203 past the static detection sensor 199 in which the sensor 199 detects/senses at least one edge of at least one flag F1-F4. The original inverse kinematics provides a suitable starting point. The last solution if desired can be stored and used as the initial value for the next time for the same target location. In the exemplary Newton-Raphson method, e.g., the three variables are defined:

$$x = K_{s1}, y = K_{s2}, \text{ and } z = K_{s3};$$

the corresponding functions are defined:

f1(x, y, z) = equation [34]

f2(x, y, z) = equation [36]

f3(x, y, z) = equation [39]

the non-linear system is created:

$$F\begin{bmatrix} x \\ y \\ z \end{bmatrix} = \begin{bmatrix} f1(x,y,z) \\ f2(x,y,z) \\ f3(x,y,z) \end{bmatrix}$$

and Jacobian matrix of partial derivatives:

$$J = \begin{bmatrix} \frac{\partial f1}{\partial x} & \frac{\partial f2}{\partial y} & \frac{\partial f3}{\partial z} \\ \frac{\partial f1}{\partial x} & \frac{\partial f2}{\partial y} & \frac{\partial f3}{\partial z} \\ \frac{\partial f1}{\partial x} & \frac{\partial f2}{\partial y} & \frac{\partial f3}{\partial z} \end{bmatrix}$$

The solution of the set of non-linear equations can be found through iteration of following:

$$\begin{bmatrix} x_{n+1} \\ y_{n+1} \\ z_{n+1} \end{bmatrix} = \begin{bmatrix} x_n \\ y_n \\ z_n \end{bmatrix} - \begin{bmatrix} \frac{\partial f1}{\partial x} & \frac{\partial f2}{\partial y} & \frac{\partial f3}{\partial z} \\ \frac{\partial f1}{\partial x} & \frac{\partial f2}{\partial y} & \frac{\partial f3}{\partial z} \\ \frac{\partial f1}{\partial x} & \frac{\partial f2}{\partial y} & \frac{\partial f3}{\partial z} \end{bmatrix}^{-1}_{(x_n,y_n,z_n)} * F\begin{bmatrix} x_n \\ y_n \\ z_n \end{bmatrix} \quad [40]$$

In one aspect, at lower temperatures, the pulley ratio changes due to thermal expansion can be treated as small perturbations to the system due to, for example, the domination of the respective SCARA arm link's 23201, 23202, 23203 linear expansion in the above equations. At higher temperatures, the last solution values can be used as initial values for the same target location because of, for example, the slow thermal expansion process of the SCARA arm links 23201, 23202, 23203.

Without pulley ratio changes, the thermal expansion can be reduced to three linear equations. Assuming the pulley ratios are constant, equation [34] can be changed to:

$$K_{s1}*L*\text{Cos}(q_4)+K_{s2}*L*\text{Cos}(q_4)+((K_{s3}-1)*L3)-(s_4-L_{EE0})=0; \quad [41]$$

Equation [36] can also be changed to:

$$K_{s1}*L*\text{Cos}(q_1)+K_{s2}*L*\text{Cos}(q_1)+((K_{s3}-1)*(L_3+L_4*\alpha_1/\alpha+(L_5+L_6)*\alpha_2/\alpha))-(s_1-L_{EE0})=0; \quad [42]$$

and equation [39] will be:

$$K_{s1}*L*\text{Cos}(q_2)+K_{s2}*L*\text{Cos}(q_2)+((K_{s3}-1)*(L_3+L_4*\alpha_1/\alpha+L_5*\alpha_2/\alpha)-(s_2-L_{EE0})+(K_{s2}-K_{s1})*L*\text{Sin}(q_2)*\text{Tan}(\beta_2)=0; \quad [43]$$

Figure 32:
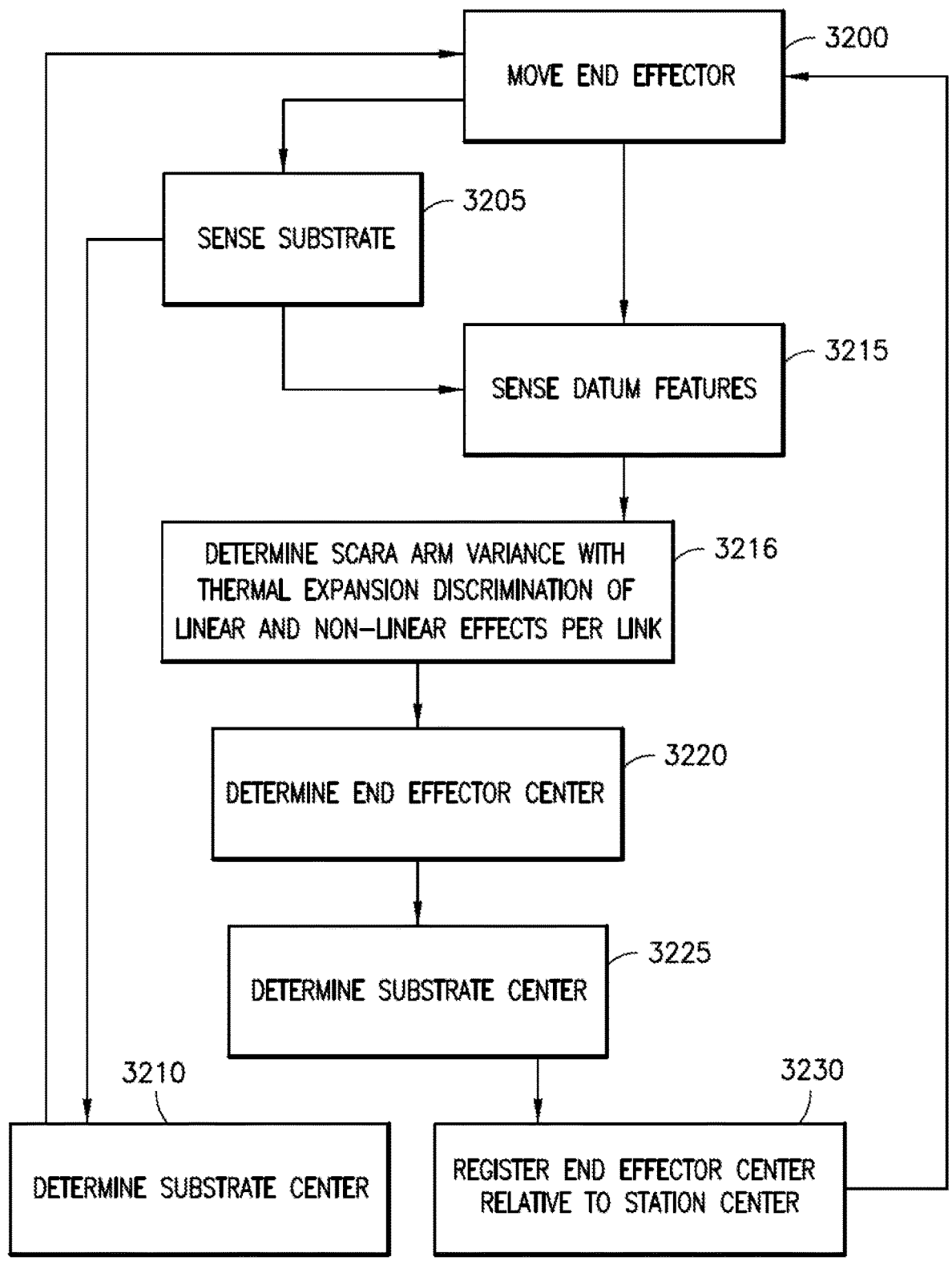
FIG. 32 is a flow diagram in accordance with aspects of the disclosed embodiment.

Because linear equations [41], [42] and [43] can have close form analytical solutions, they may provide initial values to feed non-linear equation [40] for fast iteration (e.g. so that the solution to the set of non-linear equations can be found in one pass of the sensor 199 with on the fly sensing of at least one flag F1-F6) of finding the acceptable solutions with non-linear effects in one pass with on the fly sensing/detection of at least one edge/flag F1-F6 to the set of non-linear equations. Once the $K_{S(i)}$ values are known for each respective SCARA arm link, the thermal expansion offsets can be calculated for any given location of the SCARA arm using, for example, equations [24] and [25]. The control kinematics, controlling arm motion throughout the arm full range of motion, are thus modified compensating for the determined thermal expansion offset through the whole range of motion of the arm, and more specifically the end effector center. As may be realized, determination of the offsets/variances, and hence compensation is effected with the arm on the fly, in substantially real time, of no more than one (or in other words, with but one pass) pass of the arm by the sensor 199.

Where only the substrate center EEC is to be determined the end effector is moved (FIG. 32, Block 3200) so that the substrate is moved towards at least one of the sensors 199A, 199B and the substrate is sensed (FIG. 32, Block 3205) as described above. The center of the substrate is determined (FIG. 32, Block 3210) so that the substrate may be placed at the station location SC. In one aspect, any suitable number of substrates may be transferred to and from the station location SC before the station location SC is taught again (with or without a substrate held on the end effector 23203). For example, the station location SC may be taught after the placement of 10 substrates, 20 substrates or any other suitable number of substrates. In other aspects, the station location SC may be taught after at any suitable predetermined time intervals (e.g. 30 minutes, 60 minutes or any other suitable time interval). The substrate station SC may be taught by moving the end effector 23203 towards at least one of the sensors 199A, 199B (FIG. 32, Block 3200) (again noting only a single sensor may be used) so that at least one of the flags F1-F4 are sensed (FIG. 32, Block 3215). The end effector center EEC is determined (FIG. 32, Block 3220) in the manner described above and the end effector center is registered with the station center SC (FIG. 32, Block 3230) in the manner described above. If the end effector is holding a substrate while the station center SC is taught the center of the substrate WC may be determined in the same pass of the end effector by the sensors 199A, 199B (e.g. in one pass) or in a second pass of the end effector past the sensors 199A, 199B such that the substrate center WC and the station location SC are taught on different passes.

In one aspect, referring again to FIG. 29, the registration of the end effector center EEC (which is substantially similar to end effector center 395C above) with the station center SC and the determination of the substrate center WC (shown offset from the end effector center EEC in FIG. 29) may be determined with but one pass of the end effector past but one of the sensors 199A, 199B however, in other aspects that include locating peripheral features not resident to the given arm, multiple passes of the end effector past at least one of the sensors 199A, 199B may be made in a manner similar to that described in U.S. patent application Ser. No. 14/937,676 entitled "Tool Auto-Teach Method and Apparatus" and filed on Nov. 10, 2015, the disclosure of which is incorporated herein by reference in its entirety. For example, where both the substrate center EEC and the station location SC is to be taught the end effector 23203 is moved (FIG. 32, Block 3200) to move the substrate S and/or the flags F1-F4 (e.g. datum features) towards at least one of the sensors 199A, 199B. The substrate S is sensed with at least one sensor 199A, 199B (FIG. 32, Block 3205) and the flags F1-F4 are sensed with at least one sensor 199A, 199B (FIG. 32, Block 3215), again noting that only a single sensor 199A, and a single or no more than one pass are sufficient to register the end effector center EEC relative to the station center SC. The SCARA arm variance $\Delta L_i$ (and $\Delta V_i$) is determined for each of the SCARA arm links 23201, 23202, 23203 (and the SCARA arm pulleys) with thermal expansion discrimination of linear and non-linear effects as described above with respect to, for example, FIGS. 23-31 (FIG. 32, Block 3216). The determination of the substrate center WC and the position of the substrate transport apparatus (i.e. reference position EEC) are determined (FIG. 32, Blocks 3220 and 32225) using the expansion factors $K_{S(i)}$ of each link in any suitable manner, such as that described above (e.g. by using a curved or other shaped feature (e.g. see flags F5, F5', F6, F6' in FIG. 31), having a known relationship to the end effector center as described above, similar to, e.g., circle VRW1 (see FIG. 10) defined by flags F5, F5', F6 and/or F6' (see FIG. 31) and/or e.g. using equations [24] and [25] above). The registration of the end effector center reference point EEC relative to the station center SC is effected in the manner described above (FIG. 32, Block 3230).

Referring again to FIGS. 29-31, in one aspect, the controller 11091 (or the kinematic resolver 11091K of the controller 11091) may be configured to resolve effects of perturbations and/or transients that induce variances in the radial axis R of the SCARA arm 2300A, that may otherwise be referred to as wobble or bias in the R axis (e.g. non-linear effects of joint, pulley, drive band friction forces, nutation motion of pivot axes of the SCARA arm links and pulleys due to uneven thermal distribution across the pivots and pivot bearings, etc.). As may be realized, such variance or wobble of the R axis may result in non-thermal variance components incurred in the radial position signals $s_i$ (effected by the sensor sensing the flags F1-F6 during arm motion) communicated to the controller 110910 and thermal variance determinations of the different links and pulleys of the SCARA arm 2300A. In one aspect, the aforementioned errant effects (e.g. bias or wobble) may be resolved (or their contribution minimized) by appropriate signal averaging (or other suitable weighted combination) such as from redundant flags F1-F6 and sensors 199A, 199B on an opposite or mirror image side of the SCARA arm 2300A as shown in FIG. 29 (FIG. 29 illustrates sensors 199A, 199B on opposite sides of the end effector 23203; see also FIGS. 30 and 31 which illustrate symmetrical end effectors). In the illustrated aspects, sensors 199A, 199B and flags F1-F6 may be provided symmetrically with respect to the SCARA arm 2300A axis of symmetry (which is substantially aligned with the R axis other than for the errant effects) and averaging the $s_i$ signals (as expressed kinematically) from the opposing sensors 199A, 199B sensing opposite corresponding flags (see flags F1-F6 and F1'-F6') resolves the errant component due to R axis bias or wobble. In other aspects, the controller 11091 may be configured to linearize the $s_i$ signals (that may be expressed kinematically) of succeeding passes (resulting for example in curves similar to those shown in FIG. 27, registered in suitable form in the controller 11091 processor and memory) as the SCARA arm 2300A transients thermally between the calibration temperature $T_{REF}$ and the steady state operating temperature. The curves (e.g. similar to those shown in FIG. 27) may then be applied to adjust the $s_i$ signals, for each pass of the end effector 23203 and flags F1-F6, F1'-F6' past the sensors 199A, 199B, so that each $s_i$ signal conforms to the corresponding curve of the given pass. Accordingly, errant components, such as previously described, contributing to the discrepancy between the $s_i$ signal from the sensor, and the curve plot, may be resolved from signals of no more than one sensor 199A, 199B for example. Further, the curve of each pass may be compared to successively preceding curves of preceding passes, identifying trends demonstrative of axis bias or wobble.

As can be seen above, the aspects of the disclosed embodiment compensate for the determined variance of the transport arm as illustrated in, e.g. FIGS. 23, 24 and 25, with the controller, to position the transport arm and the reference feature(s) or flags F1-F6, F1'-F6' of the end effector 23203, 23203A, 25155EA, 25155EB. Further, the aspects of the disclosed embodiment compensate for the determined variance, with the controller, of another independent end effector 23203B (see e.g. FIG. 24) sharing at least one or more arm links 23201, 23202, with the end effector 23203A, 23203B, 25155EA, the other independent end effector 23203B having at least one independent degree of freedom relative to the end effector 23203A.

In accordance with one or more aspects of the disclosed embodiment, a substrate processing apparatus comprising a substrate transport apparatus having a self-centering end effector with a wafer holding station having a predetermined center, the end effector being configured to hold a wafer at the wafer holding station and transport the wafer within the substrate processing apparatus; and at least one center deterministic feature integral to the substrate transport apparatus and disposed so that a static detection sensor of the substrate processing apparatus detects at least one edge of the at least one center deterministic feature on the fly with the substrate transport apparatus radial motion, the detection of the at least one edge effecting determination of the predetermined center of the wafer holding station on the end effector with but one pass of the at least one center deterministic feature by the static detection sensor.

In accordance with one or more aspects of the disclosed embodiment, wherein the wafer holding station is unobstructed by the at least one center deterministic feature.

In accordance with one or more aspects of the disclosed embodiment, wherein the at least one center deterministic feature is unobstructed by a wafer held by the wafer holding station.

In accordance with one or more aspects of the disclosed embodiment, wherein the at least one deterministic feature is disposed on the substrate transport apparatus separate and distinct from the wafer holding station.

In accordance with one or more aspects of the disclosed embodiment, wherein the end effector includes a longitudinal centerline and the at least one center deterministic feature comprises at least two center deterministic features that are disposed on opposite sides of the longitudinal centerline.

In accordance with one or more aspects of the disclosed embodiment, wherein the end effector includes a longitudinal centerline and the at least one center deterministic feature is disposed on a common side of the longitudinal centerline.

In accordance with one or more aspects of the disclosed embodiment, wherein the at least one center deterministic feature comprises at least two opposingly arranged center deterministic features.

In accordance with one or more aspects of the disclosed embodiment, wherein the at least one center deterministic feature includes at least two center deterministic features where at least one of the at least two center deterministic features is supplemental relative to another of the at least two center deterministic features.

In accordance with one or more aspects of the disclosed embodiment, wherein each of the at least one center deterministic feature is configured to independently resolve the predetermined center of the wafer holding station on the end effector.

In accordance with one or more aspects of the disclosed embodiment, wherein each of the center deterministic features has a corresponding shape with a predetermined relationship with the predetermined center of the wafer holding station on the end effector so that each corresponding shape independently determines the predetermined center of the wafer holding station on the end effector.

In accordance with one or more aspects of the disclosed embodiment, wherein the at least one center deterministic feature is integral to the end effector.

In accordance with one or more aspects of the disclosed embodiment, wherein the at least one center deterministic feature extends from a side of the end effector.

In accordance with one or more aspects of the disclosed embodiment, wherein the at least one center deterministic feature depends from a side of the end effector.

In accordance with one or more aspects of the disclosed embodiment, wherein the at least one center deterministic feature is disposed so that detection of the at least one center deterministic feature defines a variance in dimension of the substrate transport apparatus independent of the end effector.

In accordance with one or more aspects of the disclosed embodiment, wherein the variance in dimension is due to thermal effect.

In accordance with one or more aspects of the disclosed embodiment, further comprising a controller configured to receive sensor data from the static detection sensor corresponding to the detection of the at least one edge, and control the substrate transport apparatus to adjust a position of the predetermined center based on a thermal dimensional change of the substrate transport apparatus as determined from the sensor data.

In accordance with one or more aspects of the disclosed embodiment, further comprising a controller configured to learn a center location of a substrate processing station of the substrate processing apparatus from the detection of the at least one center deterministic feature.

In accordance with one or more aspects of the disclosed embodiment, wherein the static detection sensor comprises an automatic wafer centering sensor.

In accordance with one or more aspects of the disclosed embodiment, further comprising a controller configured to identify and learn a center location of a substrate processing station of the substrate processing apparatus from sensor data corresponding to the detection of the at least one edge of the at least one center deterministic feature.

In accordance with one or more aspects of the disclosed embodiment, a method comprising providing a substrate transport apparatus having a self-centering end effector with a wafer holding station having a predetermined center, where the end effector holds a wafer at the wafer holding station and transports the wafer within a substrate processing apparatus, and at least one center deterministic feature integral to the substrate transport apparatus; and detecting at least one edge of the at least one center deterministic feature on the fly, with the substrate transport apparatus in motion, with a static detection sensor of the substrate processing apparatus, where the detection of the at least one edge effects a determination of the predetermined center of the wafer holding station on the end effector with but one pass of the at least one center deterministic feature by the static detection sensor.

In accordance with one or more aspects of the disclosed embodiment, wherein the wafer holding station is unobstructed by the at least one center deterministic feature.

In accordance with one or more aspects of the disclosed embodiment, wherein the at least one center deterministic feature is unobstructed by a wafer held by the end effector.

In accordance with one or more aspects of the disclosed embodiment, further comprising determining with the static detection sensor an eccentricity of a wafer held by the end effector relative to the predetermined center of the wafer holding station on the end effector.

In accordance with one or more aspects of the disclosed embodiment, wherein the predetermined center of the wafer holding station on the end effector and the eccentricity are determined on the fly with the but one pass of the at least one center deterministic feature by the static detection sensor.

In accordance with one or more aspects of the disclosed embodiment, wherein the static detection sensors detects edges of the wafer.

In accordance with one or more aspects of the disclosed embodiment, further comprising receiving sensor data, with a controller, from the static detection sensor corresponding to the detection of the at least one edge; and controlling the substrate transport apparatus, with the controller, to adjust a position of the predetermined center based on a thermal dimensional change of the substrate transport apparatus as determined from the sensor data.

In accordance with one or more aspects of the disclosed embodiment, further comprising identifying and learning, with a controller, a center location of a wafer processing station of the substrate processing apparatus from the detection of the at least one edge of the at least one center deterministic feature.

In accordance with one or more aspects of the disclosed embodiment, further comprising defining, with a controller, a variance in a dimension of the substrate transport apparatus, independent of the end effector, from the detection of the at least one edge of the at least one center deterministic feature.

In accordance with one or more aspects of the disclosed embodiment, wherein the variance in the dimension is due to thermal effect.

In accordance with one or more aspects of the disclosed embodiment, a substrate processing apparatus comprising a frame; a substrate transport apparatus connected to the frame and having an end effector with a wafer holding station having a predetermined center, the end effector being configured to hold a wafer at the wafer holding station and transport the wafer within the substrate processing apparatus; an automatic wafer centering sensor connected to the frame and being configured to effect on the fly, with the substrate transport apparatus in motion, sensing of edges of the wafer held on the end effector; and at least one center deterministic feature integral to the substrate transport apparatus and disposed so that the automatic wafer centering sensor detects at least one edge of the at least one center deterministic feature on the fly, the detection of the at least one edge effecting determination of the predetermined center of the wafer holding station on the end effector.

In accordance with one or more aspects of the disclosed embodiment, wherein the wafer holding station is unobstructed by the at least one center deterministic feature.

In accordance with one or more aspects of the disclosed embodiment, wherein the at least one center deterministic feature is unobstructed by a wafer held by the end effector.

In accordance with one or more aspects of the disclosed embodiment, wherein the at least one deterministic feature is disposed on the substrate transport apparatus separate and distinct from the wafer holding station.

In accordance with one or more aspects of the disclosed embodiment, wherein the end effector includes a longitudinal centerline and the at least one center deterministic feature comprises at least two center deterministic features that are disposed on opposite sides of the longitudinal centerline.

In accordance with one or more aspects of the disclosed embodiment, wherein the end effector includes a longitudinal centerline and the at least one center deterministic feature is disposed on a common side of the longitudinal centerline.

In accordance with one or more aspects of the disclosed embodiment, wherein the at least one center deterministic feature comprises at least two opposingly arranged center deterministic features.

In accordance with one or more aspects of the disclosed embodiment, wherein the at least one center deterministic feature includes at least two center deterministic features where at least one of the at least two center deterministic features is supplemental relative to another of the at least two center deterministic features.

In accordance with one or more aspects of the disclosed embodiment, wherein each of the at least one center deterministic feature is configured to independently resolve the predetermined center of the wafer holding station on the end effector.

In accordance with one or more aspects of the disclosed embodiment, wherein each of the center deterministic features has a corresponding shape with a predetermined relationship with the predetermined center of the wafer holding station on the end effector so that each corresponding shape independently determines the predetermined center of the wafer holding station on the end effector.

In accordance with one or more aspects of the disclosed embodiment, wherein the at least one center deterministic feature is integral to the end effector.

In accordance with one or more aspects of the disclosed embodiment, wherein the substrate transport apparatus includes an arm connected to the end effector and the at least one center deterministic feature is integral to the arm of the substrate transport apparatus.

In accordance with one or more aspects of the disclosed embodiment, wherein the substrate transport apparatus includes an arm coupled to the end effector at a mechanical interface and the at least one center deterministic feature is integral to a mechanical interface.

In accordance with one or more aspects of the disclosed embodiment, wherein the at least one center deterministic feature extends from a side of the end effector.

In accordance with one or more aspects of the disclosed embodiment, wherein the at least one center deterministic feature depends from a side of the end effector.

In accordance with one or more aspects of the disclosed embodiment, wherein the at least one center deterministic feature is disposed so that detection of the at least one center deterministic feature defines a variance in dimension of the substrate transport apparatus independent of the end effector.

In accordance with one or more aspects of the disclosed embodiment, wherein the variance in dimension is due to thermal effect.

In accordance with one or more aspects of the disclosed embodiment, further comprising a controller configured to receive sensor data from the automatic wafer centering sensor corresponding to the detection of the at least one edge, and control the substrate transport apparatus to adjust a position of the predetermined center based on a thermal dimensional change of the substrate transport apparatus as determined from the sensor data.

In accordance with one or more aspects of the disclosed embodiment, further comprising a controller configured to learn a center location of a substrate processing station of the substrate processing apparatus from the detection of the at least one center deterministic feature.

In accordance with one or more aspects of the disclosed embodiment, a substrate processing apparatus comprising a frame; a substrate transport apparatus connected to the frame and having an end effector with a wafer holding station having a predetermined center, the end effector being configured to hold a wafer at the wafer holding station and transport the wafer within the substrate processing apparatus; an automatic wafer centering sensor connected to the frame; and at least one center deterministic feature integral to the substrate transport apparatus and disposed so that the automatic wafer centering sensor detects the at least one center deterministic feature on the fly with the substrate transport apparatus in motion, the detection of the at least one center deterministic feature effecting determination of the predetermined center of the wafer holding station on the end effector with but one pass of the at least one center deterministic feature by the automatic wafer centering sensor.

In accordance with one or more aspects of the disclosed embodiment, wherein the wafer holding station is unobstructed by the at least one center deterministic feature.

In accordance with one or more aspects of the disclosed embodiment, wherein the at least one center deterministic feature is unobstructed by a wafer held by the end effector.

In accordance with one or more aspects of the disclosed embodiment, wherein the at least one deterministic feature is disposed on the substrate transport apparatus separate and distinct from the wafer holding station.

In accordance with one or more aspects of the disclosed embodiment, wherein the end effector includes a longitudinal centerline and the at least one center deterministic feature comprises at least two center deterministic features that are disposed on opposite sides of the longitudinal centerline.

In accordance with one or more aspects of the disclosed embodiment, wherein the end effector includes a longitudinal centerline and the at least one center deterministic features is disposed on a common side of the longitudinal centerline.

In accordance with one or more aspects of the disclosed embodiment, wherein the at least one center deterministic feature comprises at least two opposingly arranged center deterministic features.

In accordance with one or more aspects of the disclosed embodiment, wherein the at least one center deterministic feature includes at least two center deterministic features where at least one of the at least two center deterministic features is supplemental relative to another of the at least two center deterministic features.

In accordance with one or more aspects of the disclosed embodiment, wherein each of the at least one center deterministic feature is configured to independently resolve the predetermined center of the wafer holding station on the end effector.

In accordance with one or more aspects of the disclosed embodiment, wherein each of the center deterministic features has a corresponding shape with a predetermined relationship with the predetermined centered of the wafer holding station on the end effector so that each corresponding shape independently determines the predetermined center of the wafer holding station on the end effector.

In accordance with one or more aspects of the disclosed embodiment, wherein the at least one center deterministic feature is integral to the end effector.

In accordance with one or more aspects of the disclosed embodiment, wherein the at least one center deterministic feature extends from a side of the end effector.

In accordance with one or more aspects of the disclosed embodiment, wherein the at least one center deterministic feature depends from a side of the end effector.

In accordance with one or more aspects of the disclosed embodiment, wherein the at least one center deterministic feature is disposed so that detection of the at least one center deterministic feature defines a variance in dimension of the substrate transport apparatus independent of the end effector.

In accordance with one or more aspects of the disclosed embodiment, wherein the variance in dimension is due to thermal effect.

In accordance with one or more aspects of the disclosed embodiment, further comprising a controller configured to receive sensor data from the automatic wafer centering sensor corresponding to the detection of the at least one edge, and control the substrate transport apparatus to adjust a position of the predetermined center based on a thermal dimensional change of the substrate transport apparatus as determined from the sensor data.

In accordance with one or more aspects of the disclosed embodiment, further comprising a controller configured to learn a center location of a substrate processing station of the substrate processing apparatus from the detection of the at least one center deterministic feature.

In accordance with one or more aspects of the disclosed embodiment, a substrate processing apparatus comprises:

a substrate transport apparatus having a self-centering end effector with a wafer holding station having a predetermined center, the end effector being configured to hold a wafer at the wafer holding station and transport the wafer within the substrate processing apparatus;

at least one center deterministic feature integral to the substrate transport apparatus and disposed so that a static detection sensor of the substrate processing apparatus detects at least one edge of the at least one center deterministic feature on the fly with the substrate transport apparatus radial motion; and a controller communicably coupled to the substrate transport apparatus, the controller being configured so that detection of the at least one edge effects a determination of a proportion factor identifying a variance of an arm of the substrate transport apparatus on the fly with the substrate transport apparatus radial motion;

wherein the controller includes a kinematic effects resolver configured to determine, from the detection of the at least one edge, a relation between a proportion factor variance and the detection of the at least one edge by the static detection sensor of the substrate transport apparatus on the fly with the substrate transport apparatus radial motion and further resolve effects of the determined proportion factor variance on the proportion factor determining the variance of the arm.

In accordance with one or more aspects of the disclosed embodiment, the detection of the at least one edge effecting determination of the predetermined center of the wafer holding station on the end effector occurs with but one pass of the at least one center deterministic feature by the static detection sensor.

In accordance with one or more aspects of the disclosed embodiment, wafer holding station is unobstructed by the at least one center deterministic feature.

In accordance with one or more aspects of the disclosed embodiment, the at least one center deterministic feature is unobstructed by a wafer held by the wafer holding station.

In accordance with one or more aspects of the disclosed embodiment, the at least one center deterministic feature is disposed on the substrate transport apparatus separate and distinct from the wafer holding station.

In accordance with one or more aspects of the disclosed embodiment, the end effector includes a longitudinal centerline and the at least one center deterministic feature comprises at least two center deterministic features that are disposed on opposite sides of the longitudinal centerline.

In accordance with one or more aspects of the disclosed embodiment, the end effector includes a longitudinal centerline and the at least one center deterministic feature is disposed on a common side of the longitudinal centerline.

In accordance with one or more aspects of the disclosed embodiment, the at least one center deterministic feature comprises at least two opposingly arranged center deterministic features.

In accordance with one or more aspects of the disclosed embodiment, the at least one center deterministic feature includes at least two center deterministic features where at least one of the at least two center deterministic features is supplemental relative to another of the at least two center deterministic features.

In accordance with one or more aspects of the disclosed embodiment, each of the at least one center deterministic feature is configured to independently resolve the predetermined center of the wafer holding station on the end effector.

In accordance with one or more aspects of the disclosed embodiment, each of the center deterministic features has a corresponding shape with a predetermined relationship with the predetermined center of the wafer holding station on the end effector so that each corresponding shape independently determines the predetermined center of the wafer holding station on the end effector.

In accordance with one or more aspects of the disclosed embodiment, the at least one center deterministic feature is integral to the end effector.

In accordance with one or more aspects of the disclosed embodiment, the at least one center deterministic feature extends from a side of the end effector.

In accordance with one or more aspects of the disclosed embodiment, the at least one center deterministic feature depends from a side of the end effector.

In accordance with one or more aspects of the disclosed embodiment, the at least one center deterministic feature is disposed so that detection of the at least one center deterministic feature defines a variance in dimension of the substrate transport apparatus independent of the end effector.

In accordance with one or more aspects of the disclosed embodiment, the variance in dimension is due to thermal effect.

In accordance with one or more aspects of the disclosed embodiment, the controller is further configured to:

receive sensor data from the static detection sensor corresponding to the detection of the at least one edge, and control the substrate transport apparatus to adjust a position of the predetermined center based on a thermal dimensional change of the substrate transport apparatus as determined from the sensor data.

In accordance with one or more aspects of the disclosed embodiment, the controller is further configured to learn a center location of a substrate processing station of the substrate processing apparatus from the detection of the at least one center deterministic feature.

In accordance with one or more aspects of the disclosed embodiment, the static detection sensor comprises an automatic wafer centering sensor.

In accordance with one or more aspects of the disclosed embodiment, the controller is configured to identify and learn a center location of a substrate processing station of the substrate processing apparatus from sensor data corresponding to the detection of the at least one edge of the at least one center deterministic feature.

In accordance with one or more aspects of the disclosed embodiment, the controller is further configured to:

receive sensor data from the static detection sensor, the sensor data corresponding to detection of the at least one center deterministic feature, identify a variance in dimension of the substrate transport apparatus based on the sensor data and determine the proportion factor relating the variance to the dimension of the substrate transport apparatus.

In accordance with one or more aspects of the disclosed embodiment, the kinematic effects resolver is configured to resolve a relationship between a kinematically defined dimension of the arm of the substrate transport apparatus, the proportion factor and the variance.

In accordance with one or more aspects of the disclosed embodiment, the kinematic effects resolver includes a filter of the proportion factor.

In accordance with one or more aspects of the disclosed embodiment, a method comprises:

providing a substrate transport apparatus having a self-centering end effector with a wafer holding station having a predetermined center, where the end effector holds a wafer at the wafer holding station and transports the wafer within a substrate processing apparatus, and at least one center deterministic feature integral to the substrate transport apparatus;

detecting at least one edge of the at least one center deterministic feature on the fly, with the substrate transport apparatus in motion, with a static detection sensor of the substrate processing apparatus, the detection of the at least one edge effecting a determination of a portion factor identifying a variance of an arm of the substrate transport apparatus on the fly with, with the substrate transport apparatus in motion; and determining, with a kinematic effects resolver, from the detection of the at least one edge, a relation between a proportion factor variance and the detection of the at least one edge by the static detection sensor and further resolving effects of the determined proportion factor variance on the proportion factor determining the variance of the arm.

In accordance with one or more aspects of the disclosed embodiment, the detection of the at least one edge effects a determination of the predetermined center of the wafer holding station on the end effector with but one pass of the at least one center deterministic feature by the static detection sensor.

In accordance with one or more aspects of the disclosed embodiment, the wafer holding station is unobstructed by the at least one center deterministic feature.

In accordance with one or more aspects of the disclosed embodiment, the at least one center deterministic feature is unobstructed by a wafer held by the end effector.

In accordance with one or more aspects of the disclosed embodiment, the method further comprising determining with the static detection sensor an eccentricity of a wafer held by the end effector relative to the predetermined center of the wafer holding station on the end effector.

In accordance with one or more aspects of the disclosed embodiment, the predetermined center of the wafer holding station on the end effector and the eccentricity are determined on the fly with the but one pass of the at least one center deterministic feature by the static detection sensor.

In accordance with one or more aspects of the disclosed embodiment, the static detection sensors detects edges of the wafer.

In accordance with one or more aspects of the disclosed embodiment, the method further comprises:

receiving sensor data, with a controller, from the static detection sensor corresponding to the detection of the at least one edge; and controlling the substrate transport apparatus, with the controller, to adjust a position of the predetermined center based on a thermal dimensional change of the substrate transport apparatus as determined from the sensor data.

In accordance with one or more aspects of the disclosed embodiment, the method further comprises identifying and learning, with a controller, a center location of a wafer processing station of the substrate processing apparatus from the detection of the at least one edge of the at least one center deterministic feature.

In accordance with one or more aspects of the disclosed embodiment, the method further comprises defining, with a controller, a variance in a dimension of the substrate transport apparatus, independent of the end effector, from the detection of the at least one edge of the at least one center deterministic feature.

In accordance with one or more aspects of the disclosed embodiment, the variance in the dimension is due to thermal effect.

In accordance with one or more aspects of the disclosed embodiment, a substrate processing apparatus comprises:

a substrate transport apparatus having an end effector with a wafer holding station having a predetermined center, the end effector being configured to hold a wafer at the wafer holding station and transport the wafer within the substrate processing apparatus;

more than one feature disposed on the substrate transport apparatus so that a static detection sensor of the substrate processing apparatus detects at least one edge of each respective more than one feature on the fly with the substrate transport apparatus radial motion; and a controller communicably coupled to the substrate transport apparatus, the controller being configured so that detection of each of the at least one edge respectively effects a determination of different proportion factors identifying different variances of a common arm, of the substrate transport apparatus, on the fly with the substrate transport apparatus in but one common radial motion;

wherein the controller includes a kinematic effects resolver configured to resolve, from the different determined proportion factors, respective variances of different corresponding links of the common arm on the fly with the substrate transport apparatus in but one common motion and determine an effective variance of the common arm for wafer position.

In accordance with one or more aspects of the disclosed embodiment, the controller is configured to further resolve effects of variances in the different portion factors on the effective variance of the arm.

In accordance with one or more aspects of the disclosed embodiment, the detection of the at least one edge effecting determination of the predetermined center of the wafer holding station on the end effector occurs with but one pass of the more than one feature by the static detection sensor.

In accordance with one or more aspects of the disclosed embodiment, the wafer holding station is unobstructed by the more than one feature.

In accordance with one or more aspects of the disclosed embodiment, the more than one feature is unobstructed by a wafer held by the wafer holding station.

In accordance with one or more aspects of the disclosed embodiment, the more than one feature is disposed on the substrate transport apparatus separate and distinct from the wafer holding station.

In accordance with one or more aspects of the disclosed embodiment, a substrate processing apparatus comprises:

a substrate transport apparatus with a transport arm including an end effector having a reference feature with a predetermined center, the end effector being configured to hold a wafer and transport the wafer within the substrate processing apparatus based on the predetermined center;

at least one arm pose deterministic feature integral to the substrate transport apparatus and disposed so that a static detection sensor of the substrate processing apparatus detects at least one edge of the at least one arm pose deterministic feature on the fly with a radial motion of the transport arm; and a controller communicably coupled to the substrate transport apparatus, the controller being configured so that detection of the at least one edge effects a determination of a proportion factor identifying a variance of the transport arm on the fly with the radial motion of the transport arm;

wherein the controller includes a kinematic effects resolver configured to determine, from the detection of the at least one edge, by the static detection sensor, on the fly with the radial motion of the transport arm, a discrete relation between the determined proportion factor and each different discrete variance respective to each different link of the transport arm determining the variance of the transport arm on the fly with the radial motion of the transport arm.

In accordance with one or more aspects of the disclosed embodiment, the kinematic effects resolver is configured so as to effect discrimination between each different discrete variance, respective to each different link, in the determined relation with determined proportion factor.

In accordance with one or more aspects of the disclosed embodiment, the kinematic effects resolver is configured so as to effect discrimination between each different discrete variance based on the detection of the at least one edge.

In accordance with one or more aspects of the disclosed embodiment, the kinematic effects resolver is configured to determine, from the detection of the at least one edge, by the static detection sensor, on the fly with the radial motion of the transport arm, a contribution of non-linear kinematic effect, of the different discrete variance respective to each different link of the transport arm, determining the variance of the arm on the fly with the radial motion of the transport arm.

In accordance with one or more aspects of the disclosed embodiment, the kinematic effects resolver is configured so as to effect discrimination between different contributing non-linear kinematic effects, respective to each different link or different pulley of the transport arm, in the determined contribution of non-linear kinematic effect determining the variance of the arm.

In accordance with one or more aspects of the disclosed embodiment, the kinematic effects resolver is configured so as to effect discrimination between different contributing non-linear kinematic effects, of at least one different link or different pulley of the transport arm, in the determined contribution of non-linear kinematic effect determining the variance of the arm.

In accordance with one or more aspects of the disclosed embodiment, the kinematic effects resolver is configured so as to effect discrimination between different contributing non-linear kinematic effects based on the detection of the at least one edge.

In accordance with one or more aspects of the disclosed embodiment, the at least one arm pose deterministic feature has a configuration deterministic so as to effect discrimination between each different discrete variance respective to each different link, in the determined relation with the determined proportion factor.

In accordance with one or more aspects of the disclosed embodiment, the at least one pose deterministic feature is configured so as to effect discrimination between each different discrete variance respective to each different link of the transport arm with but one on the fly transport arm radial motion pass of the at least one edge by the static detection sensor so that the static detection sensor detects the at least one edge on the fly.

In accordance with one or more aspects of the disclosed embodiment, the transport arm is a 3 link SCARA arm and the at least one pose deterministic feature is configured so as to effect discrimination between each different discrete variance, respective to each different link of the 3 link SCARA arm.

In accordance with one or more aspects of the disclosed embodiment, the end effector is a self-centering end effector with a wafer holding station having a predetermined center, the end effector being configured to hold the wafer at the wafer holding station and transport the wafer within the substrate processing apparatus.

In accordance with one or more aspects of the disclosed embodiment, the least one arm pose deterministic feature comprises at least one center deterministic feature effecting determination of the predetermined center of the wafer holding station on the end effector with but one pass of the at least one center deterministic feature by the static detection sensor.

In accordance with one or more aspects of the disclosed embodiment, the at least one center deterministic feature is unobstructed by the wafer held by the end effector and is disposed so that the static detection sensor detects the at least one center deterministic feature on the fly with the substrate transport apparatus in motion, the detection of the at least one center deterministic feature effecting determination of the predetermined center of the wafer holding station on the end effector with but one pass of the at least one center deterministic feature by the static detection sensor.

In accordance with one or more aspects of the disclosed embodiment, the controller is configured to effect determination of, based on the detection of the at least one edge, the predetermined center of the wafer holding station substantially simultaneously with the determination of the variance of the transport arm on the fly with the radial motion of the transport arm.

In accordance with one or more aspects of the disclosed embodiment, the transport arm includes an upper arm link, a forearm link and more than one end effector commonly dependent from the upper arm link and forearm link so that the upper arm link and the forearm link are common to each of the more than one end effector.

In accordance with one or more aspects of the disclosed embodiment, at least one of the more than one commonly dependent end effector, has an independent degree of freedom so that the at least one of the commonly dependent end effector is independently movable, with respect to the common upper arm link and forearm link, and has a corresponding arm pose deterministic feature, different from another arm pose deterministic feature corresponding to another of the more than one commonly dependent end effector, so that variance of the transport arm respective to the at least one independently movable end effector is determined separately, from the variance of the transport arm respective to the other of the more than one commonly dependent end effector, based on sensing of the at least one edge of the corresponding arm pose deterministic feature of the at least one independently movable end effector by the static detection sensor.

In accordance with one or more aspects of the disclosed embodiment, the transport arm is a SCARA arm.

In accordance with one or more aspects of the disclosed embodiment, the controller is configured to position the transport arm and the reference feature of the end effector compensating for the determined variance of the transport arm.

In accordance with one or more aspects of the disclosed embodiment, a substrate processing method comprises:

transporting a wafer within a substrate processing apparatus with a substrate transport apparatus with a transport arm including an end effector having a reference feature with a predetermined center, where the wafer is held on the end effector at a wafer holding station of the end effector;

detecting, with a static detection sensor, at least one edge of at least one arm pose deterministic feature integral to the substrate transport apparatus on the fly with a radial motion of the transport arm;

determining, based on the detection of the at least one edge, a proportion factor identifying a variance of the transport arm on the fly with the radial motion of the transport arm with a controller communicably coupled to the substrate transport apparatus; and determining, with a kinematic effects resolver of the controller, from the detection of the at least one edge, by the static detection sensor, on the fly with the radial motion of the transport arm, a discrete relation between the determined proportion factor and each different discrete variance respective to each different link of the transport arm determining the variance of the transport arm on the fly with the radial motion of the transport arm.

In accordance with one or more aspects of the disclosed embodiment, the method further comprises effecting, with the kinematic effects resolver, discrimination between each different discrete variance, respective to each different link, in the determined relation with determined proportion factor.

In accordance with one or more aspects of the disclosed embodiment, the method further comprises effecting, with the kinematic effects resolver, discrimination between each different discrete variance based on the detection of the at least one edge.

In accordance with one or more aspects of the disclosed embodiment, the method further comprises determining, with the kinematic effects resolver, from the detection of the at least one edge, by the static detection sensor, on the fly with the radial motion of the transport arm, a contribution of non-linear kinematic effect, of the different discrete variance respective to each different link of the transport arm, determining the variance of the arm on the fly with the radial motion of the transport arm.

In accordance with one or more aspects of the disclosed embodiment, the transport arm is a SCARA arm.

In accordance with one or more aspects of the disclosed embodiment, the method further comprises, with the controller, compensating for the determined variance of the transport arm to position the transport arm and the reference feature of the end effector.

In accordance with one or more aspects of the disclosed embodiment, the method further comprises, with the controller, compensating for the determined variance with the controller of another independent end effector sharing at least one or more arm links with the end effector, the other independent end effector having at least one independent degree of freedom relative to the end effector.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A method comprising:
    providing a substrate transport apparatus having:
        a self-centering end effector, the end effector has wafer holding station with a predetermined center, where the end effector holds a wafer at the wafer holding station and transports the wafer within a substrate processing apparatus, and
        at least one center deterministic feature integral to the substrate transport apparatus;
    receiving, with a controller, sensor data embodying detection at a predetermined location of at least one edge of the at least one center deterministic feature on the fly, with the substrate transport apparatus in motion within the substrate processing apparatus; and
    effecting, with the controller, determination of the predetermined center of the wafer holding station on the end effector from but one pass motion of the at least one center deterministic feature in the substrate processing apparatus past the predetermined location.

2. The method of claim 1, wherein the wafer holding station is unobstructed by the at least one center deterministic feature.

3. The method of claim 2, wherein the at least one center deterministic feature is unobstructed by a wafer held by the end effector.

4. The method of claim 1, further comprising determining with a static detection sensor an eccentricity of a wafer held by the end effector relative to the predetermined center of the wafer holding station on the end effector.

5. The method of claim 4, wherein the predetermined center of the wafer holding station on the end effector and the eccentricity are determined on the fly with the but one pass of the at least one center deterministic feature by the static detection sensor.

6. The method of claim 4, wherein the static detection sensors detects edges of the wafer.

7. The method of claim 4, further comprising:
    receiving sensor data, with a controller, from the static detection sensor corresponding to the detection of the at least one edge; and
    controlling the substrate transport apparatus, with the controller, to adjust a position of the predetermined center based on a thermal dimensional change of the substrate transport apparatus as determined from the sensor data.

8. The method of claim 1, further comprising identifying and learning, with a controller, a center location of a wafer processing station of the substrate processing apparatus from the detection of the at least one edge of the at least one center deterministic feature.

9. The method of claim 1, further comprising defining, with a controller, a variance in a dimension of the substrate transport apparatus, independent of the end effector, from the detection of the at least one edge of the at least one center deterministic feature.

10. The method of claim 9, wherein the variance in the dimension is due to thermal effect.

11. A substrate processing apparatus comprising:
    a frame;
    a substrate transport apparatus connected to the frame and having an end effector, the end effector has a wafer holding station with a predetermined center, the end effector being configured to hold a wafer at the wafer holding station and transport the wafer within the substrate processing apparatus; and
    a controller configured to:
        receive data from an automatic wafer centering sensor connected to the frame, the data embodying detection of a predetermined location of at least one center deterministic feature integral to the substrate transport apparatus, and
        effect determination, on the fly with the substrate transport apparatus in motion within the substrate processing apparatus, of the predetermined center of the wafer holding station on the end effector from but one pass motion of the at least one center deterministic feature in the substrate processing apparatus past the predetermined location.

12. The substrate transport apparatus of claim 11, wherein the at least one deterministic feature is disposed on the substrate transport apparatus separate and distinct from the wafer holding station.

13. The substrate transport apparatus of claim 11, wherein the at least one center deterministic feature includes at least two center deterministic features where at least one of the at least two center deterministic features is supplemental relative to another of the at least two center deterministic features.

14. The substrate transport apparatus of claim 11, wherein each of the at least one center deterministic feature is configured to independently resolve the predetermined center of the wafer holding station on the end effector.

15. The substrate transport apparatus of claim 14, wherein each of the center deterministic features has a corresponding shape with a predetermined relationship with the predetermined centered of the wafer holding station on the end effector so that each corresponding shape independently determines the predetermined center of the wafer holding station on the end effector.

16. The substrate transport apparatus of claim 11, wherein the controller receives the sensor data from the automatic wafer centering sensor corresponding to the detection of the at least one center deterministic feature, and controls the substrate transport apparatus to adjust a position of the predetermined center based on a thermal dimensional change of the substrate transport apparatus as determined from the sensor data.

17. The substrate transport apparatus of claim 11, wherein the controller is configured to learn a center location of a substrate processing station of the substrate processing apparatus from the detection of the at least one center deterministic feature.

* * * * *